(12) United States Patent
Wang et al.

(10) Patent No.: US 11,764,812 B2
(45) Date of Patent: Sep. 19, 2023

(54) ENCODING METHOD AND COMMUNICATIONS DEVICE

(71) Applicant: HUAWEI TECHNOLOGIES CO., LTD., Shenzhen (CN)

(72) Inventors: Xianbin Wang, Hangzhou (CN); Huazi Zhang, Hangzhou (CN); Rong Li, Hangzhou (CN); Lingchen Huang, Hangzhou (CN); Shengchen Dai, Hangzhou (CN); Jiajie Tong, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/511,905

(22) Filed: Oct. 27, 2021

(65) Prior Publication Data

US 2022/0052711 A1 Feb. 17, 2022

Related U.S. Application Data

(63) Continuation of application No. PCT/CN2020/082846, filed on Apr. 1, 2020.

(30) Foreign Application Priority Data

Apr. 29, 2019 (CN) .......................... 201910357715.5
Jan. 22, 2020 (CN) .......................... 202010075805.8

(51) Int. Cl.
*H03M 13/00* (2006.01)
*H03M 13/29* (2006.01)

(52) U.S. Cl.
CPC .............................. *H03M 13/2906* (2013.01)

(58) Field of Classification Search
CPC ................................................. H03M 13/2906
See application file for complete search history.

(56) References Cited

U.S. PATENT DOCUMENTS

2015/0077277 A1* 3/2015 Alhussien ............. H04L 1/0057
  341/67
2017/0047947 A1* 2/2017 Hong ................ H03M 13/2906
(Continued)

FOREIGN PATENT DOCUMENTS

CN 104124979 A 10/2014
CN 107800510 A 3/2018
(Continued)

*Primary Examiner* — Samir W Rizk
(74) *Attorney, Agent, or Firm* — HUAWEI TECHNOLOGIES CO., LTD.

(57) ABSTRACT

Embodiments disclose an encoding method and a communications device. The method includes: obtaining and encoding a to-be-encoded information bit sequence based on a binary vector $P_1$ of a first code, to obtain and output an encoded bit sequence, where $P_1$ is determined based on a binary vector $P_2$ of a second code and a binary vector $P_3$ of a third code, $P_1$, $P_2$, and $P_3$ indicate an information bit and a frozen bit of the first code, the second code and the third code respectively, a code length of the first code, the second code and the third code is $n_1$, $n_2$ and $n_3$ respectively, a quantity of information bits of the first code, the second code and the third code is $k_1$, $k_2$ and $k_3$ respectively, $n_1=n_2*n_3$, and $k_1=k_2*k_3$. Therefore, parallel decoding can be performed, helping reduce a decoding delay.

18 Claims, 10 Drawing Sheets

(56) References Cited

U.S. PATENT DOCUMENTS

| | | | |
|---|---|---|---|
| 2018/0278369 A1* | 9/2018 | Ge | H04L 1/0058 |
| 2018/0351699 A1 | 12/2018 | Huang et al. | |
| 2019/0044540 A1* | 2/2019 | Jiang | H04W 72/0466 |
| 2019/0260392 A1 | 8/2019 | Zhang et al. | |

FOREIGN PATENT DOCUMENTS

| | | |
|---|---|---|
| CN | 108347301 A | 7/2018 |
| CN | 108365850 A | 8/2018 |
| CN | 108365921 A | 8/2018 |
| CN | 108574494 A | 9/2018 |
| CN | 108631916 A | 10/2018 |
| CN | 108631930 A | 10/2018 |
| CN | 108933643 A | 12/2018 |
| CN | 109155634 A | 1/2019 |
| EP | 2 899 911 B1 | 2/2018 |
| RU | 2679784 C2 | 2/2019 |
| WO | 2018232562 A1 | 12/2018 |
| WO | 2019001447 A1 | 1/2019 |
| WO | 2019056941 A1 | 3/2019 |

\* cited by examiner

ENCODING METHOD AND COMMUNICATIONS DEVICE

CROSS-REFERENCE TO RELATED APPLICATIONS

This application is a continuation of International Application No. PCT/CN2020/082846, filed on Apr. 1, 2020, which claims priority to Chinese Patent Application No. 202010075805.8, filed on Jan. 22, 2020 and Chinese Patent Application No. 201910357715.5, filed on Apr. 29, 2019. All of the aforementioned patent applications are hereby incorporated by reference in their entireties.

TECHNICAL FIELD

The embodiments relate to the field of communications technologies, and in particular to an encoding method and a communications device.

BACKGROUND

Rapid evolution of wireless communication indicates that a 5G communications system will present some new features in the future. Three most typical communication scenarios include an enhanced mobile broadband (eMBB) scenario, a massive machine-type communication (mMTC) scenario, and an ultra-reliable low-latency communication (URLLC) scenario. Demands of these communication scenarios pose new challenges to an existing LTE technology.

In a communications system, channel encoding is usually used to improve data transmission reliability. As a most basic radio access technology, channel encoding is one of important research objects that meet 5G communication requirements. Since the Shannon theory was put forward, scholars in various countries have being devoted to finding an encoding and decoding method that can reach a Shannon limit and that has relatively low complexity. A polar code is an encoding scheme that is proposed based on channel polarization. A polar code is the first and the only channel encoding method that is currently known and can strictly provably "reach" a channel capacity.

During actual application, it is found that, when decoding is performed on a bit sequence encoded by using a polar code, serial decoding needs to be performed on all information bits. This causes a relatively long decoding delay. Therefore, currently, a new encoding method needs to be urgently provided, so that parallel decoding can be performed on all the information bits during decoding, to reduce the decoding delay.

SUMMARY

Embodiments provide an encoding method and a communications device, to help reduce a decoding delay.

According to a first aspect, an embodiment provides an encoding method. The method includes: obtaining a to-be-encoded information bit sequence; encoding the to-be-encoded information bit sequence based on a binary vector $P_1$ of a first code, to obtain an encoded bit sequence, where $P_1$ is determined based on a binary vector $P_2$ of a second code and a binary vector $P_3$ of a third code, $P_1$ indicates an information bit and a frozen bit of the first code, $P_2$ indicates an information bit and a frozen bit of the second code, $P_3$ indicates an information bit and a frozen bit of the third code, a code length of the first code is $n_1$, a quantity of information bits of the first code is $k_1$, a code length of the second code is $n_2$, a quantity of information bits of the second code is $k_2$, a code length of the third code is $n_3$, a quantity of information bits of the third code is $k_3$, $n_1=n_2*n_3$, and $k_1=k_2*k_3$; and outputting the encoded bit sequence. When encoding is performed in the encoding manner described in the first aspect, parallel decoding can be performed in a decoding process. This helps reduce a decoding delay.

In an optional implementation, $P_1=P_2\otimes P_3$. Based on this optional implementation, a Kronecker product operation can be performed on $P_2$ and $P_3$, to obtain $P_1$.

In an optional implementation, $n_2=n_3$ and $k_2=k_3$. Based on this optional implementation, the first code can be constructed based on two codes that have a same code length and a same quantity of information bits. This facilitates implementation.

In an optional implementation, $n_2=n_3$, $k_2=k_3$, and $P_2$ is equal to $P_3$. Based on this optional implementation, the second code and the third code may actually be understood as a same code. Therefore, the first code can be constructed based on one code. This facilitates implementation.

In an optional implementation, $k_1=k_4$, and $k_4$ is a length of the to-be-encoded information bit sequence. Based on this optional implementation, the first code whose quantity of information bits is equal to the length of the to-be-encoded information bit sequence can be constructed. After the first code is constructed, the information bit of the first code can be directly filled with information in the to-be-encoded information bit sequence, the frozen bit of the first code can be directly filled with a fixed value, and then a bit vector obtained after filling of bit values is encoded.

In an optional implementation, $k_4<k_1$, $k_1=\lceil\sqrt{k_4}\rceil^2$, and k4 is a length of the to-be-encoded information bit sequence. Based on this optional implementation, the first code whose quantity of information bits is greater than the length of the to-be-encoded information bit sequence can be constructed, and then the to-be-encoded information bit sequence is encoded based on $P_1$ of the first code.

In an optional implementation, the encoding the to-be-encoded information bit sequence based on a binary vector $P_1$ of a first code is implemented in the following manner: determining, based on $P_1$, a binary vector $P_4$ corresponding to a fourth code, where $P_4$ indicates an information bit and a frozen bit of the fourth code, a code length of the fourth code is $n_4$, a quantity of information bits of the fourth code is $k_4$, and $n_4=n_1$; and encoding the to-be-encoded information bit sequence based on $P_4$. Based on this optional implementation, the fourth code can be constructed based on the first code, and then the to-be-encoded information bit sequence is encoded based on $P_4$ of the fourth code.

In an optional implementation, a set $S_2$ is a subset of a set $S_1$, the set $S_1$ is an information bit set including the information bit indicated by $P_1$, and $S_2$ is an information bit set including the information bit indicated by $P_4$. Based on this optional implementation, a part of the information bit indicated by $P_1$ is changed to a frozen bit. In this way, $P_4$ can be obtained.

In an optional implementation, the determining, based on $P_1$, a binary vector $P_4$ corresponding to a fourth code is implemented in the following manner: determining a set $S_3$ from the set $S_1$, where when an information bit included in the set $S_3$ is changed to a frozen bit, at least one information bit of a first inner code can be changed to a frozen bit in a first encoding process; determining a first information bit from the set $S_3$; changing the first information bit in $P_1$ to a frozen bit, to obtain a binary vector $P_5$; and obtaining the binary vector $P_4$ corresponding to the fourth code based on the binary vector $P_5$. Based on this optional implementation, the fourth code is constructed. This helps reduce a code rate of an inner code.

In an optional implementation, the set $S_3$ includes a plurality of information bits; and compared with another information bit in the set $S_3$, when the first information bit in the set $S_3$ is changed to a frozen bit, an information bit that is of the first inner code and that is changed to a frozen bit has a lowest reliability rank. Based on this optional implementation, the fourth code is constructed. This helps reduce a code rate of an inner code and improve transmission reliability.

In an optional implementation, the obtaining the binary vector $P_4$ corresponding to the fourth code based on the binary vector $P_5$ is implemented in the following manner: determining a set $S_4$ from an information bit indicated by $P_5$, where when an information bit included in the set $S_4$ is changed to a frozen bit, at least one information bit of a second inner code can be changed to a frozen bit in a second encoding process, the first inner code is an outer code for the second encoding process, and the second inner code is an outer code for the first encoding process; determining a second information bit from the set $S_4$; changing the second information bit in $P_5$ to a frozen bit, to obtain a binary vector $P_6$; and obtaining the binary vector corresponding to the fourth code based on the binary vector $P_6$. Based on this optional implementation, the fourth code is constructed. This helps reduce a code rate of an inner code.

In an optional implementation, the set $S_4$ includes a plurality of information bits; and compared with another information bit in the set $S_4$, when the second information bit in the set $S_4$ is changed to a frozen bit, an information bit that is of the second inner code and that is changed to a frozen bit has a lowest reliability rank. Based on this optional implementation, the fourth code is constructed. This helps reduce a code rate of an inner code and improve transmission reliability.

In an optional implementation, n1, n2, and n3 each are an integral power of 2.

In an optional implementation, the encoding the to-be-encoded information bit sequence based on a binary vector $P_1$ of a first code, to obtain an encoded bit sequence is implemented in the following manner: determining a binary vector $P_7$ of a seventh code based on the binary vector $P_1$ of the first code, where the binary vector $P_7$ indicates an information bit, a frozen bit, and a non-transmitted bit of the seventh code, a code length of the seventh code is $n_7$, a quantity of information bits of the seventh code is $k_7$, and a quantity of non-transmitted bits of the seventh code is $n_1-n_7$, $k_7$ is equal to the length of the to-be-encoded information bit sequence, $n_7$ is an integer greater than $k_7$, $$n_1 = 4^{\left\lceil \frac{\log_2(n_7)}{2} \right\rceil},$$

and $k_1$ is greater than or equal to $k_7$; encoding the to-be-encoded information bit sequence based on the binary vector $P_7$ of the seventh code, to obtain an encoded first bit sequence with a length of $n_1$; and removing the non-transmitted bit from the first bit sequence, to obtain a second bit sequence with a length of $n_7$; and the outputting the encoded bit sequence is implemented as: outputting the second bit sequence. Based on this optional implementation, a code with any code length can be constructed.

In an optional implementation, $k_7=k_1+n_1-n_7$, and the determining a binary vector $P_7$ of a seventh code based on the binary vector $P_1$ of the first code is implemented in the following manner: sequentially changing, according to a first preset rule, elements indicating information bits in $P_1$ to elements indicating non-transmitted bits, until a quantity of the elements indicating the non-transmitted bits in $P_1$ is equal to $n_1-n_7$, to obtain the binary vector $P_7$, where a value of the non-transmitted bit is independent of a value of the information bit of the seventh code. Based on this optional implementation, $P_7$ is determined, so that content corresponding to the information bit is not missed in the second bit sequence obtained after encoding. This helps ensure information integrity.

Optionally, the elements indicating the information bits in $P_1$ are sequentially changed, according to the first preset rule and based on a first binary sequence and a second binary sequence, to the elements indicating the non-transmitted bits, until the quantity of the elements indicating the non-transmitted bits in $P_1$ is equal to $n_1-n_7$, to obtain the binary vector $P_7$. The first binary sequence includes binary sequence numbers that are of elements in $P_1$ and that are arranged in descending order or in ascending order. The second binary sequence also includes binary sequence numbers of elements in $P_1$. The first binary sequence and the second binary sequence are permuted. Based on this optional implementation, $P_7$ can be accurately determined.

According to a second aspect, an embodiment provides an encoding method. The method includes: obtaining a to-be-encoded information bit sequence; encoding the to-be-coded information bit sequence based on a binary vector $P_1$ of a first code, to obtain an encoded bit sequence, where $P_1$ indicates an information bit and a frozen bit of the first code, $P_1$ is determined based on a target sequence and a quantity $k_1$ of information bits of the first code, the quantity $k_1$ of information bits of the first code is equal to a length of the to-be-encoded information bit sequence, a code length of the first code is $n_1$, the target sequence is a sequence that is extracted from a stored sequence with a length of M and that includes a sequence number less than or equal to $n_1$, the sequence with the length of M includes a sequence number corresponding to each of M bits, and M is greater than or equal to $n_1$; and outputting the encoded bit sequence. When encoding is performed in the encoding manner described in the second aspect, parallel decoding can be performed in a decoding process. This helps reduce a decoding delay.

In an optional implementation, the method further includes: determining a set $S_1$ from an information bit indicated by a binary vector $P_2$ of a second code, where when an information bit included in the set $S_1$ is changed to a frozen bit, at least one information bit of a first inner code can be changed to a frozen bit in a first encoding process; determining a first information bit from the set $S_1$; changing the first information bit in $P_2$ to a frozen bit, to obtain a binary vector $P_3$ of a third code, where a code length of the second code is M, a quantity of information bits of the second code is K, a code length of the third code is M, and a quantity of information bits of the third code is K-1; determining that a sequence number corresponding to the first information bit is K; and traversing K from M to 1, to determine a sequence number corresponding to each bit in the sequence with the length of M. Based on this optional implementation, the sequence with the length of M is generated, and encoding is performed based on the sequence with the length of M. This helps reduce a code rate of an inner code.

In an optional implementation, the set $S_1$ includes a plurality of information bits; and compared with another information bit in the set $S_1$, when the first information bit in the set $S_1$ is changed to a frozen bit, an information bit that is of the first inner code and that is changed to a frozen bit has a lowest reliability rank. Based on this optional implementation, the sequence with the length of M is generated, and encoding is performed based on the sequence with the length of M. This helps reduce a code rate of an inner code and improve transmission reliability.

According to a third aspect, a communications device is provided. The communications device may perform the method according to any one of the first aspect, the second aspect, the optional implementations of the first aspect, or the optional implementations of the second aspect. The function may be implemented by hardware or may be implemented by hardware executing corresponding software. The hardware or the software includes one or more units corresponding to the foregoing function. The unit may be software and/or hardware. Based on a same inventive concept, for a problem-resolving principle and beneficial effects of the communications device, refer to the problem-resolving principle and the beneficial effects of the method according to any one of the first aspect, the second aspect, the optional implementations of the first aspect, or the optional implementations of the second aspect. Repeated parts are not described in detail again.

According to a fourth aspect, a communications device is provided. The communications device includes a processor, a memory, and a communications interface. The processor, the communications interface, and the memory are connected. The communications interface may be a transceiver. The communications interface is configured to implement communication between the communications device and another network element. One or more programs are stored in the memory. The processor invokes the program stored in the memory, to implement the method according to any one of the first aspect, the second aspect, the optional implementations of the first aspect, or the optional implementations of the second aspect. For a problem-resolving implementation and beneficial effects of the communications device, refer to the problem-resolving implementation and the beneficial effects of the method according to any one of the first aspect, the second aspect, the optional implementations of the first aspect, or the optional implementations of the second aspect. Repeated parts are not described in detail again.

According to a fifth aspect, a computer program product is provided. When the computer program product runs on a computer, the computer is enabled to perform the method according to any one of the first aspect, the second aspect, the optional implementations of the first aspect, or the optional implementations of the second aspect.

According to a sixth aspect, a chip product is provided, to perform the method according to any one of the first aspect, the second aspect, the optional implementations of the first aspect, or the optional implementations of the second aspect.

According to a seventh aspect, a computer-readable storage medium is provided. The computer-readable storage medium stores instructions. When the instructions are run on a computer, the computer is enabled to perform the method according to any one of the first aspect, the second aspect, the optional implementations of the first aspect, or the optional implementations of the second aspect.

DETAILED DESCRIPTION OF THE EMBODIMENTS

The following further describes the specific embodiments in detail with reference to the accompanying drawings.

The embodiments provide an encoding method and a communications device, to help reduce a decoding delay.

The solutions in the embodiments are applicable to various communications systems, for example, a 5G communications system, a global system for mobile communications (GSM) system, a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, and a universal mobile telecommunications system (UMTS).

Figure 1:
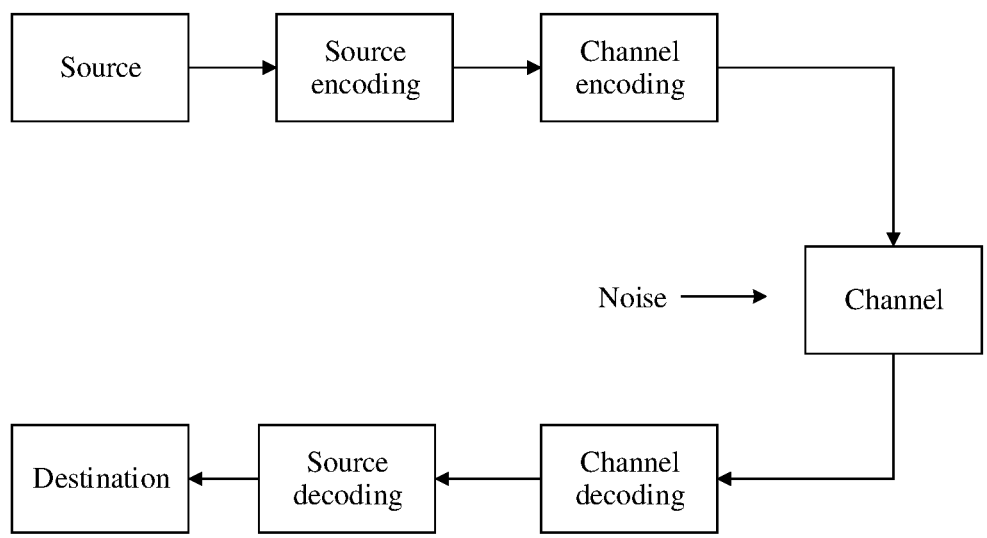
FIG. 1 is a schematic diagram of an existing communication procedure.

FIG. 1 shows a basic communication procedure performed by using a wireless technology. As shown in FIG. 1, before sending information, a communications device needs to perform source encoding on to-be-sent information, performs channel encoding on information obtained after source encoding, and then sends information obtained after channel encoding. After receiving the information obtained after channel encoding, a receiver end first performs channel decoding on the information obtained after channel encoding, then performs source decoding on information obtained after channel decoding, and finally obtains the information sent by the transmitter end. Channel encoding is critical to reliability of information transmission in an entire communications system.

A channel encoding process is $c^N = u^N F_N$, where $u^N = (u_1, u_2, K, u_N)$ is a binary row vector, $u^N$ is a to-be-encoded bit vector with a length of N (namely a code length), $F_N$ is an N×N matrix, and $F_N = F_2^{\otimes(log_2(N))}$. Herein, $$F_2 = \begin{bmatrix} 1 & 0 \\ 1 & 1 \end{bmatrix},$$

where $F_2^{\otimes(log_2(N))}$ is defined as a Kronecker product of $log_2 N$ matrices $F_2$, and $\otimes$ represents an operator of the Kronecker product. The foregoing related addition and multiplication operations are all addition and multiplication operations in a binary Galois field.

Some bits in $u^N$ are used to carry information and are referred to as information bits. Some other bits are used to carry fixed values pre-agreed upon by the transmitter end and the receiver end and are referred to as fixed bits or frozen bits. The frozen bit is used for description in the following parts. For example, a value carried in a frozen bit is usually 0. Before encoding is performed, the information bits used to carry information in $u^N$ need to be determined, that is, locations at which bits are used to carry information in $u^N$ need to be determined. A process of determining the information bits used to carry information in $u^N$ is referred to as construction of a code.

Figure 2:
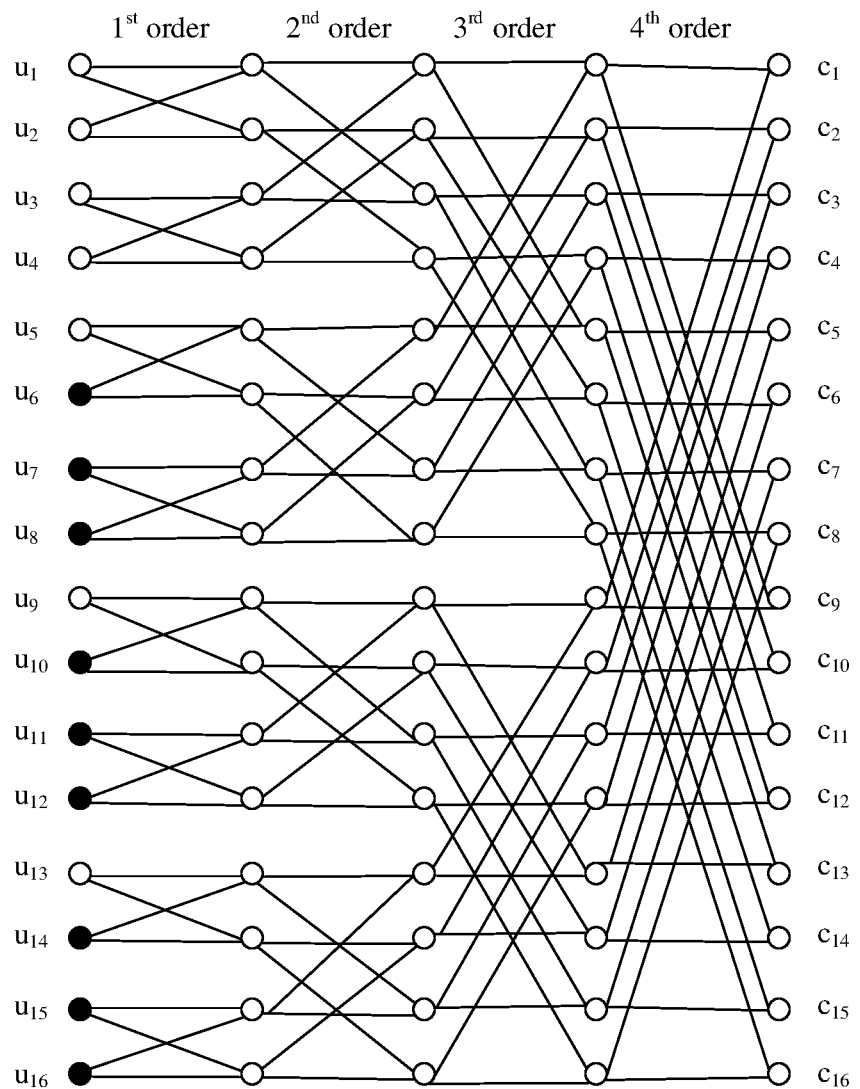
FIG. 2 is a schematic diagram of a trellis graph according to an embodiment.

For example, a trellis graph is used to describe the channel encoding process. FIG. 2 shows a trellis graph indicating a channel encoding process. As shown in FIG. 2, in the trellis graph, $u^{16}=(u_1, u_2, K, u_{16})$, and $c^{16}=(c_1, c_2, K, c_{16})$. In to-be-encoded bit vectors $(u_1, u_2, K, u_{16})$, $u_6, u_7, u_8, u_{10}, u_{11}, u_{12}, u_{14}, u_{15},$ and $u_{16}$ are information bits in which information is filled, and $u_1$ to $u_5$, $u_9$, and $u_{13}$ are frozen bits in which fixed values, for example, 0, pre-agreed upon by the transmitter end and the receiver end are filled. For example, in FIG. 2, solid nodes corresponding to $u_1$ to $u_{16}$ represent the information bits, and hollow nodes represent the frozen bits. Before performing encoding, a communications device first needs to determine an information bit and a frozen bit in $u^{16}$, that is, determine the information bit and the frozen bit in $u^{16}$. Then, the information bit in $u^{16}$ is filled with information in a received to-be-encoded information bit sequence, and the frozen bit in $u^{16}$ is filled with a fixed value, for example, 0, pre-agreed upon by the transmitter end and the receiver end. Then, the communications device encodes $u^{16}$ in which the information and the fixed values are filled, and finally obtains an encoded bit sequence $c^{16}$.

The communications device may be an access network device or a terminal device. Alternatively, the communications device may be another device that needs to perform channel encoding. This is not limited in this embodiment.

The access network device may provide communication coverage for a specific geographical area and may communicate with a terminal device located in the coverage area. The access network device may support communication protocols of different standards or may support different communication modes. For example, the access network device may be an evolved NodeB (eNB, or eNodeB) in an LTE system or a radio network controller in a cloud radio access network (CRAN), may be an access network device in a 5G network, such as a gNB, may be a small cell, a micro cell, or a transmission reception point (TRP), or may be a relay station, an access point, an access network device in a future evolved public land mobile network (PLMN), or various forms of devices that perform a function of a base station in the future.

The terminal device may be an access terminal, user equipment (UE), a subscriber unit, a subscriber station, a mobile station, a mobile platform, a remote station, a remote terminal, a mobile terminal, a user terminal, a terminal, a wireless communications device, a user agent, a user apparatus, or the like. The access terminal may be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, a wearable device, a terminal device in the internet of things, a virtual reality device, a terminal device in a 5G network or a future communications network, a terminal device in a future evolved public land mobile network (PLMN), or the like.

The following further describes an encoding method and a communications device that are provided in the embodiments.

Figure 3:
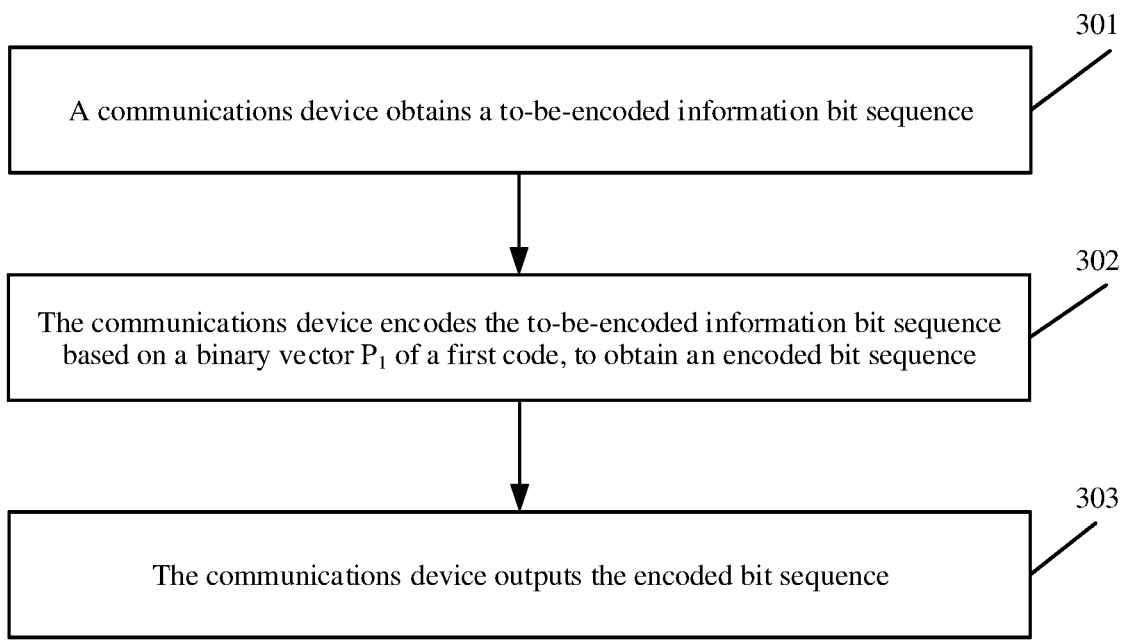
FIG. 3 is a schematic flowchart of an encoding method according to an embodiment.

FIG. 3 is a schematic flowchart of an encoding method according to an embodiment. As shown in FIG. 3, the encoding method includes the following steps 301 to 303.

301: A communications device obtains a to-be-encoded information bit sequence.

302: The communications device encodes the to-be-encoded information bit sequence based on a binary vector $P_1$ of a first code, to obtain an encoded bit sequence.

$P_1$ is determined based on a binary vector $P_2$ of a second code and a binary vector $P_3$ of a third code. $P_1$ indicates an information bit and a frozen bit of the first code, $P_2$ indicates an information bit and a frozen bit of the second code, and $P_3$ indicates an information bit and a frozen bit of the third code. A code length of the first code is $n_3$, and a quantity of information bits of the first code is $k_1$. A code length of the second code is $n_2$, and a quantity of information bits of the second code is $k_2$. A code length of the third code is $n_3$, and a quantity of information bits of the third code is $k_3$. $n_1=n_2*n_3$, and $k_1=k_2*k_3$.

$P_1$ may be represented as $P_1=[p_{1,1}, p_{1,2}, \ldots, p_{1,n_1}]$, $P_2$ may be represented as $P_2=[p_{2,1}, p_{2,2}, \ldots, p_{2,n_2}]$, and $P_3$ may be represented as $P_3=[p_{3,1}, p_{3,2}, \ldots, p_{3,n_3}]$. Optionally, when $p_{1,z}=0$, it indicates that a $z^{th}$ bit of the first code is a frozen bit. When $p_{1,z}=1$, it indicates that a $z^{th}$ bit of the first code is an information bit. When $p_{2,z}=0$, it indicates that a $z^{th}$ bit of the second code is a frozen bit. When $p_{2,z}=1$, it indicates that a $z^{th}$ bit of the second code is an information bit. When $p_{3,z}=0$, it indicates that a $z^{th}$ bit of the third code is a frozen bit. When $P_{3,z}=1$, it indicates that a $z^{th}$ bit of the third code is an information bit.

For example, the first code is a (32, 4) code of. For example, the code length $n_1$ of the first code is 32, the quantity $k_1$ of information bits is 4, and $P_1=$[00000000000000000000000000110011]. $P_1$ indicates that the $1^{st}$ bit to the $26^{th}$ bit, the $29^{th}$ bit, and the $30^{th}$ bit of the first code are frozen bits, and the $27^{th}$ bit, the $28^{th}$ bit, the $31^{st}$ bit, and the $32^{nd}$ bit of the first code are information bits. The second code is an (8, 2) code of. For example, the code length $n_2$ of the second code is 8, the quantity $k_2$ of information bits is 2, and $P_2$=[00000011]. P2 indicates that the $1^{st}$ bit to the $6^{th}$ bit of the second code are frozen bits, and the $7^{th}$ bit and the $8^{th}$ bit of the second code are information bits. The third code is a (4, 2) code. For example, the code length $n_3$ of the third code is 4, the quantity $k_3$ of information bits is 2, and $P_3$=[0011]. P3 indicates that the $1^{st}$ bit and the $2^{nd}$ bit of the third code are frozen bits, and the $3^{rd}$ bit and the $4^{th}$ bit of the third code are information bits.

Alternatively, when $p_{1,z}=1$, it indicates that a $z^{th}$ bit of the first code is a frozen bit. When $P_{1,z}=0$, it indicates that a $z^{th}$ bit of the first code is an information bit. When $p_{1,z}=1$, it indicates that a $z^{th}$ bit of the second code is a frozen bit. When $p_{2,z}=0$, it indicates that a $z^{th}$ bit of the second code is an information bit. When $p_{3,z}=1$, it indicates that a $z^{th}$ bit of the third code is a frozen bit. When $p_{3,z}=0$, it indicates that a $z^{th}$ bit of the third code is an information bit.

For example, the first code is a (32, 4) code, and $P_1=$[11111111111111111111111111001100]. $P_1$ indicates that the $1^{st}$ bit to the $26^{th}$ bit, the $29^{th}$ bit, and the $30^{th}$ bit of the first code are frozen bits, and the $27^{th}$ bit, the $28^{th}$ bit, the $31^{st}$ bit, and the $32^{nd}$ bit of the first code are information bits. The second code is an (8, 2) code, and $P_2$=[11111100]. P2 indicates that the $1^{st}$ bit to the $6^{th}$ bit of the second code are frozen bits, and the $7^{th}$ bit and the $8^{th}$ bit of the second code are information bits. The third code is a (4, 2) code, and $P_3$=[1100]. P3 indicates that the $1^{st}$ bit and the $2^{nd}$ bit of the third code are frozen bits, and the $3^{rd}$ bit and the $4^{th}$ bit of the third code are information bits.

For ease of description, in the following embodiments, that $P_1$, $P_2$, $P_3$, $P_4$, $P_5$, $P_6$, and $P_7$ each indicate an information bit and a frozen bit in a first manner is used as an example for description. For example, 0 indicates that a corresponding bit is a frozen bit, and 1 indicates that a corresponding bit is an information bit.

Optionally, $n_1$, $n_2$, and $n_3$ each are an integral power of 2. For example, $n_1$ is 16, $n_2$ is 8, and $n_3$ is 2. Alternatively, $n_1$ is 32, $n_2$ is 8, and $n_3$ is 4. Alternatively, m is 64, $n_2$ is 16, and $n_3$ is 4.

Optionally, $n_1$, $n_2$, and $n_3$ each may not be an integral power of 2. For example, m is 72, $n_2$ is 12, and $n_3$ is 6. Alternatively, $n_1$ is 60, $n_2$ is 10, and $n_3$ is 6.

Optionally, $n_2$ is different from $n_3$, and $k_2$ is different from $k_3$. For example, the first code may be a (32, 8) code. For example, the code length m of the first code is 32, and the quantity $k_1$ of information bits is 8. The second code may be an (8, 4) code. For example, the code length $n_2$ of the second code is 8, and the quantity $k_2$ of information bits is 4. The third code may be a (4, 2) code. For example, the code length $n_3$ of the third code is 4, and the quantity $k_3$ of information bits is 2.

Optionally, $n_2$ is the same as $n_3$, and $k_2$ is different from $k_3$. For example, the first code may be a (64, 8) code. For example, the code length m of the first code is 64, and the quantity $k_1$ of information bits is 8. The second code may be an (8, 4) code. For example, the code length $n_2$ of the second code is 8, and the quantity $k_2$ of information bits is 4. The third code may be an (8, 2) code. For example, the code length $n_3$ of the third code is 8, and the quantity $k_3$ of information bits is 2.

Optionally, $n_2$ is different from $n_3$, and $k_2$ is the same as $k_3$. For example, the first code may be a (128, 16) code. For example, the code length m of the first code is 128, and the quantity $k_1$ of information bits is 16. The second code may be an (8, 4) code. For example, the code length $n_2$ of the second code is 8, and the quantity $k_2$ of information bits is 4. The third code may be a (16, 4) code. For example, the code length $n_3$ of the third code is 16, and the quantity $k_3$ of information bits is 4.

Optionally, $n_2$ is the same as $n_3$, and $k_2$ is the same as $k_3$. For example, the first code may be a (64, 16) code. For example, the code length m of the first code is 64, and the quantity $k_1$ of information bits is 16. The second code may be an (8, 4) code. For example, the code length $n_2$ of the second code is 8, and the quantity $k_2$ of information bits is 4. The third code may be an (8, 4) code. For example, the code length $n_3$ of the third code is 8, and the quantity $k_3$ of information bits is 4.

In an optional implementation, after the communications device receives the to-be-encoded information bit sequence, the communications device determines the code length $n_2$ and the quantity $k_2$ of information bits of the second code, and the code length $n_3$ and the quantity $k_3$ of information bits of the third code based on the code length $n_1$ and the quantity $k_1$ of information bits of the first code. After determining the code length $n_2$ and the quantity $k_2$ of information bits of the second code and the code length $n_3$ and the quantity $k_3$ of information bits of the third code, the communications device determines the binary vector $P_2$ of the second code and the binary vector $P_3$ of the third code. Then, the communications device determines $P_1$ based on $P_2$ and $P_3$.

After determining $P_1$, the communications device may encode the to-be-encoded information bit sequence based on $P_1$, to obtain the encoded bit sequence.

Alternatively, the code length and the quantity of information bits of the second code and the code length and the quantity of information bits of the third code may be preset. After receiving the to-be-encoded information bit sequence, the communications device does not need to determine the code length $n_2$ and the quantity $k_2$ of information bits of the second code and the code length $n_3$ and the quantity $k_3$ of information bits of the third code based on the code length m and the quantity $k_1$ of information bits of the first code. After receiving the to-be-encoded information bit sequence, the communications device may directly determine $P_2$ of the second code and $P_3$ of the third code, then determine $P_1$ based on $P_2$ and $P_3$, and encode the to-be-encoded information bit sequence based on $P_1$, to obtain the encoded bit sequence.

Optionally, the second code and the third code may be polar codes. $P_2$ of the second code and $P_3$ of the third code may be determined by using an existing polar code construction method. For example, $P_2$ of the second code and $P_3$ of the third code may be determined by using a method such as Gaussian approximation (GA), density evolution (DE), PW, or NR.

For example, $P_2$ is determined by using the GA method or the DE method. When determining $P_2$ of the (8, 2) second code, the communications device determines a subchannel capacity corresponding to each bit of the second code and selects a bit corresponding to a relatively large subchannel capacity as an information bit. For example, if subchannel capacities corresponding to the $7^{th}$ bit and the $8^{th}$ bit of the second code are relatively large, the communications device determines the $7^{th}$ bit and the $8^{th}$ bit as information bits. For example, when $p_{2,z}$=0, it indicates that a $z^{th}$ bit of the second code is a frozen bit; or when $p_{2,z}$=1, it indicates that a $z^{th}$ bit of the second code is an information bit; and $P_2$= [00000011]. The same principle is used to determine $P_3$ of the third code. Details are not described herein again.

For another example, $P_2$ is determined by using the PW method or the NR method. When determining $P_2$ of the (8, 2) second code, the communications device samples, from a PW sequence, an NR sequence, or another pre-stored sequence, a location at which a sequence element is less than or equal to 8, to obtain a sequence [8, 7, 6, 4, 5, 3, 2, 1] with a length of 8. The sequence represents a subchannel reliability rank corresponding to each bit of the second code. For example, a subchannel reliability rank corresponding to the $1^{st}$ bit of the second code is 8, a subchannel reliability rank corresponding to the $2^{nd}$ bit of the second code is 7, a subchannel reliability rank corresponding to the $3^{rd}$ bit of the second code is 6, a subchannel reliability rank corresponding to the $4^{th}$ bit of the second code is 4, a subchannel reliability rank corresponding to the $5^{th}$ bit of the second code is 5, a subchannel reliability rank corresponding to the $6^{th}$ bit of the second code is 3, a subchannel reliability rank corresponding to the $7^{th}$ bit of the second code is 2, and a subchannel reliability rank corresponding to the $8^{th}$ bit of the second code is 1. Based on the sequence, the communications device may determine a bit that is of the second code and that corresponds to relatively high subchannel reliability as an information bit. For example, if channel reliability of subchannels corresponding to the $7^{th}$ bit and the $8^{th}$ bit of the second code is highest, the communications device determines the $7^{th}$ bit and the $8^{th}$ bit of the second code as information bits. For example, when $p_{2,z}$=0, it indicates that a $z^{th}$ bit of the second code is a frozen bit; or when $P_{2,z}$=1, it indicates that a $z^{th}$ bit of the second code is an information bit; and $P_2$=[00000011] is obtained. The same principle is used to determine $P_3$ of the third code. Details are not described herein again.

In an optional implementation, $P_1=P_2 \otimes P_3$. After determining $P_2$ and $P_3$, the communications device may perform a Kronecker product operation on $P_2$ and $P_3$, to obtain the binary vector $P_1$ of the first code.

For example, $P_2$=[00000011], $P_3$=[0011], and $P_1=P_2 \otimes P_3$=[00000000000000000000000000110011].

In an optional implementation, when $n_2=n_3$ and $k_2=k_3$, $P_2$ is equal to $P_3$.

For example, the first code is a (16, 9) code, the second code is a (4, 3) code, and the third code is a (4, 3) code. $P_2=P_3$=[0111], and $P_1=P_2 \otimes P_3$=[0000011101110111].

In an optional implementation, when $n_2=n_3$ and $k_2=k_3$, $P_2$ may alternatively not be equal to $P_3$. For example, although $P_2$ and $P_3$ have the same length, values in $P_2$ and $P_3$ are different.

In this embodiment, $k_1=k_4$, or $k_4<k_1$, where $k_4$ is a length of the to-be-encoded information bit sequence. A specific implementation in which the communications device encodes the to-be-encoded information bit sequence based on the binary vector $P_1$ of the first code when $k_1=k_4$ is different from a specific implementation in which the communications device encodes the to-be-encoded information bit sequence based on the binary vector $P_1$ of the first code when $k_4<k_1$. The following separately describes scenarios $k_1=k_4$ and $k_4<k_1$ in detail.

1. Scenario $k_1=k_4$: In this scenario, the quantity of information bits of the first code is equal to the length of the to-be-encoded information bit sequence. After determining $P_1$ of the first code, the communications device can directly fill the information bit of the first code with information in the to-be-encoded information bit sequence, and fill the frozen bit of the first code with a fixed value, for example, 0. After filling the first code with the information and the fixed value, the communications device obtains $u^{n_i}$, and then encodes $u^{n_i}$, to obtain $c^{n_i}$, where $c^{n_i}=u^{n_i}F_{n_i}$.

For example, the communications device receives the to-be-encoded information bit sequence. The length $k_4$ of the to-be-encoded information bit sequence is 4. After receiving the to-be-encoded information bit sequence, the communications device determines, based on the to-be-encoded information bit sequence, that the quantity $k_1$ of information bits of the first code is 4. The code length m of the first code may be preset, for example, may be 32. Alternatively, both the quantity $k_1$ of information bits and the code length m of the first code are preset, the quantity $k_1$ of information bits of the first code is 4, and the code length $n_1$ of the first code is 32.

The communications device factorizes the code length $n_3$ and the quantity $k_1$ of information bits of the (32, 4) first code, to obtain the code length $n_2$ and the quantity $k_2$ of information bits of the second code and the code length $n_3$ and the quantity $k_3$ of information bits of the third code, $n_1=*n_3$, and $k_1=k_2*k_3$. For example, the following is obtained: $n_2$ is 8, $k_2$ is 2, $n_3$ is 4, and $k_3$ is 2. For example, the second code is an (8, 2) code, and the third code is a (4, 2) code.

The communications device determines the binary vector $P_2$=[00000011] of the second code and the binary vector $P_3$=[0011] of the third code by using the GA, DE, PW, or NR method. After determining $P_2$ and $P_3$, the communications device performs a Kronecker product operation on $P_2$ and $P_3$, to obtain the binary vector $P_1$ of the first code, that is, $P_1=P_2 \otimes P_3$=[00000000000000000000000000110011]. For example, $P_1$ indicates that the $1^{st}$ bit to the $26^{th}$ bit, the $29^{th}$ bit, and the $30^{th}$ bit of the first code are frozen bits, and the $27^{th}$ bit, the $28^{th}$ bit, the $31^{st}$ bit, and the $32^{nd}$ bit of the first code are information bits. The communications device fills the $1^{st}$ bit to the $26^{th}$ bit, the $29^{th}$ bit, and the $30^{th}$ bit of the first code with fixed values, for example, 0. The communications device fills the $27^{th}$ bit, the $28^{th}$ bit, the $31^{st}$ bit, and the $32^{nd}$ bit of the first code with bit values in the to-be-encoded information bit sequence. After filling all the bits of the first code with values, the communications device obtains $u^{32}$. Then, the communications device encodes $u^{32}$, to obtain $c^{32}$, where $c^{32}=u^{32}F_{32}$.

For another example, the communications device receives the to-be-encoded information bit sequence. The length $k_4$ of the to-be-encoded information bit sequence is 9. After receiving the to-be-encoded information bit sequence, the communications device determines, based on the to-be-encoded information bit sequence, that the quantity $k_1$ of information bits of the first code is 9. The code length m of the first code may be preset, for example, may be 16. Alternatively, both the quantity $k_1$ of information bits and the code length m of the first code are preset, the quantity $k_1$ of information bits of the first code is 9, and the code length m of the first code is 16.

The communications device factorizes the code length m and the quantity $k_1$ of information bits of the (16, 9) first code, to obtain the code length $n_2$ and the quantity $k_2$ of information bits of the second code and the code length $n_3$ and the quantity $k_3$ of information bits of the third code, $n_1=n_2*n_3$, and $k_1=k_2*k_3$. For example, the following is obtained: $n_2$ is 4, $k_2$ is 3, $n_3$ is 4, and $k_3$ is 3. For example, the second code is a (4, 3) code, and the third code is a (4, 3) code.

The communications device determines the binary vector $P_2$=[0111] of the second code and the binary vector $P_3$=[0111] of the third code by using the GA, DE, PW, or NR method. After determining $P_2$ and $P_3$, the communications device performs a Kronecker product operation on $P_2$ and $P_3$, to obtain the binary vector $P_1$ of the first code, that is, $P_1=P_2 \otimes P_3$=[0000011101110111]. For example, $P_1$ indicates that the $1^{st}$ bit to the $5^{th}$ bit, the $9^{th}$ bit, and the $13^{th}$ bit of the first code are frozen bits, and the $6^{th}$ bit to the $8^{th}$ bit, the $10^{th}$ bit to the $12^{th}$ bit, and the $14^{th}$ bit to the $16^{th}$ bit of the first code are information bits. The communications device fills the $1^{st}$ bit to the $5^{th}$ bit, the $9^{th}$ bit, and the $13^{th}$ bit of the first code with fixed values, for example, 0. The communications device fills the $6^{th}$ bit to the $8^{th}$ bit, the $10^{th}$ bit to the $12^{th}$ bit, and the $14^{th}$ bit to the $16^{th}$ bit of the first code with bit values in the to-be-encoded information bit sequence. After filling all the bits of the first code with values, the communications device obtains $u^{16}$. Then, the communications device encodes $u^{16}$, to obtain $c^{16}$, where $c^{16}=u^{16}F_{16}$.

2. Scenario $k_4<k_1$: In this scenario, $k_1=[\sqrt{k_4}]^2$, where $k_4$ is the length of the to-be-encoded information bit sequence. For example, $k_4$ is equal to 3, and $k_1$ is equal to 4; or $k_4$ is equal to 5, and $k_1$ is equal to 9.

In an optional implementation, that the communications device encodes the to-be-encoded information bit sequence based on a binary vector $P_1$ of a first code is implemented in the following manner: The communications device determines, based on $P_1$, a binary vector $P_4$ corresponding to a fourth code, where $P_4$ indicates an information bit and a frozen bit of the fourth code, a code length of the fourth code is $n_4$, a quantity of information bits of the fourth code is $k_4$, and $n_4=n_1$; and the communications device encodes the to-be-encoded information bit sequence based on $P_4$.

Optionally, after receiving the to-be-encoded information bit sequence, the communications device may first determine the quantity of information bits of the fourth code, where the quantity of information bits of the fourth code is equal to the length of the to-be-encoded information bit sequence. After determining the quantity of information bits of the fourth code, the communications device determines the code length and the quantity of information bits of the first code based on the code length and the quantity of information bits of the fourth code, where the code length of the fourth code may be preset. After determining the code length and the quantity of information bits of the first code, the communications device determines the code length and the quantity of information bits of the second code and the code length and the quantity of information bits of the third code based on the code length and the quantity of information bits of the first code. After determining the code length and the quantity of information bits of the second code and the code length and the quantity of information bits of the third code, the communications device determines $P_2$ of the second code and $P_3$ of the third code, and then determines $P_1$ based on $P_2$ and $P_3$. After determining $P_1$, the communications device determines $P_4$ based on $P_1$, and then encodes the to-be-encoded information bit sequence based on $P_4$.

For example, the communications device receives the to-be-encoded information bit sequence. The length $k_4$ of the to-be-encoded information bit sequence is 6. The communications device determines, based on the length of the to-be-encoded information bit sequence, that the quantity of information bits of the fourth code is $k_4$, that is, 6. The communications device determines the code length $n_3$ and the quantity $k_1$ of information bits of the first code based on the code length $n_4$ and the quantity $k_4$ of information bits of the fourth code. The code length of the fourth code may be preset. For example, $n_4$ may be 16. Therefore, the fourth code is a (16, 6) code. Because $n_4$ is equal to $n_3$, and $k_1 = \sqrt{k_4}^2$, the code length $n_1$ of the first code is equal to 16, and the quantity $k_1$ of information bits of the first code is equal to 9. For example, the first code is a (16, 9) code.

The communications device factorizes the code length $n_3$ and the quantity $k_1$ of information bits of the (16, 9) first code, to obtain the code length $n_2$ and the quantity $k_2$ of information bits of the second code and the code length $n_3$ and the quantity $k_3$ of information bits of the third code, $n_1=n_2*n_3$, and $k_1=k_2*k_3$. Therefore, $n_2$ may be 4, $k_2$ may be 3, $n_3$ may be 4, and $k_3$ may be 3. For example, the second code is a (4, 3) code, and the third code is a (4, 3) code. The communications device determines the binary vector $P_2$=[0111] of the second code and the binary vector $P_3$=[0111] of the third code by using the GA, DE, PW, or NR method. After determining $P_2$ and $P_3$, the communications device performs a Kronecker product operation on $P_2$ and $P_3$, to obtain the binary vector $P_1$ of the first code, that is, $P_1=P_2 \otimes P_3$=[0000011101110111]. After determining $P_1$, the communications device determines $P_4$ of the (16, 6) fourth code based on $P_1$, and then encodes the to-be-encoded information bit sequence based on $P_4$. For example, $P_4$=[0000001001110011]. $P_4$ indicates that the $1^{st}$ bit to the $6^{th}$ bit, the $8^{th}$ bit, the $9^{th}$ bit, the $13^{th}$ bit, and the $14^{th}$ bit of the fourth code are frozen bits, and the $7^{th}$ bit, the $10^{th}$ bit to the $12^{th}$ bit, the $15^{th}$ bit, and the $16^{th}$ bit of the fourth code are information bits. The communications device fills the $1^{st}$ bit to the $6^{th}$ bit, the $8^{th}$ bit, the $9^{th}$ bit, the $13^{th}$ bit, and the $14^{th}$ bit of the fourth code with fixed values, for example, 0. The communications device fills the $7^{th}$ bit, the $10^{th}$ bit to the $12^{th}$ bit, the $15^{th}$ bit, and the $16^{th}$ bit of the fourth code with bit values in the to-be-encoded information bit sequence. After filling all the bits of the fourth code with values, the communications device obtains $u^{16}$. Then, the communications device encodes $u^{16}$, to obtain $c^{16}$, where $c^{16}=u^{16}F_{16}$.

In an optional implementation, a set $S_2$ is a subset of a set $S_1$, the set $S_1$ is an information bit set including the information bit indicated by $P_1$, and $S_2$ is an information bit set including the information bit indicated by $P_4$.

For example, $P_1$=[0000011101110111], and $P_4$=[0000001001110011]. $P_1$ indicates that the $1^{st}$ bit to the $5^{th}$ bit, the $9^{th}$ bit, and the $13^{th}$ bit of the first code are frozen bits, and the $6^{th}$ bit to the $8^{th}$ bit, the $10^{th}$ bit to the $12^{th}$ bit, and the $14^{th}$ bit to the $16^{th}$ bit of the first code are information bits. Therefore, the set $S_1$ includes the information bits: the $6^{th}$ bit to the $8^{th}$ bit, the $10^{th}$ bit to the $12^{th}$ bit, and the $14^{th}$ bit to the $16^{th}$ bit, that is, $S_1=[u_6,u_7,u_8,u_9,u_{10},u_{11},u_{12},u_{14},u_{15},u_{16}]$.

$P_4$ indicates that the $1^{st}$ bit to the $6^{th}$ bit, the $8^{th}$ bit, the $9^{th}$ bit, the $13^{th}$ bit, and the $14^{th}$ bit of the fourth code are frozen bits, and the $7^{th}$ bit, the $10^{th}$ bit to the $12^{th}$ bit, the $15^{th}$ bit, and the $16^{th}$ bit of the fourth code are information bits. Therefore, the set $S_2$ includes the information bits: the $7^{th}$ bit, the $10^{th}$ bit to the $12^{th}$ bit, the $15^{th}$ bit, and the $16^{th}$ bit, that is, $S_2=[u_7,u_{10},u_{11},u_{12},u_{15},u_{16}]$. It can be understood that the information bits in the set $S_1$ include the information bits in the set $S_2$.

In an optional implementation, that the communications device determines, based on $P_1$, a binary vector $P_4$ corresponding to a fourth code is implemented in the following manner: determining a set $S_3$ from the set $S_1$, where when an information bit included in the set $S_3$ is changed to a frozen bit, at least one information bit of a first inner code can be changed to a frozen bit in a first encoding process; determining a first information bit from the set $S_3$; changing the first information bit in $P_1$ to a frozen bit, to obtain a binary vector $P_5$; and obtaining the binary vector $P_4$ corresponding to the fourth code based on the binary vector $P_5$.

For example, the communications device receives the to-be-encoded information bit sequence. The length $k_4$ of the to-be-encoded information bit sequence is 6. The fourth code is a (16, 6) code, and the first code is a (16, 9) code. $P_1$ of the first code is $P_1$=[0000011101110111], and $S_1$=[$u_6$, $u_7$, $u_8$, $u_{10}$, $u_{11}$, $u_{12}$, $u_{14}$, $u_{15}$, $u_{16}$].

For ease of description, a specific manner of determining the set $S_3$ from the set $S_1$ is described below with reference to a corresponding trellis graph. For encoding with a code length of $n_1$, a trellis graph corresponding to the encoding has a total of $\log_2(n_1)$ layers. For a trellis graph shown in FIG. 4, an operation on the first $\frac{1}{2}*\log_2 n_1$ orders of the trellis graph is used as a first outer code, and an operation on the last $\frac{1}{2}*\log_2 n_1$ orders is used as a first inner code. Because $n_1$ is equal to 16, for the trellis graph shown in FIG. 4, an operation on the first 2 orders is used as the first outer code, and an operation on the last 2 orders is used as the first inner code. An encoding process indicated by the trellis graph shown in FIG. 4 is a first encoding process.

Figure 4:
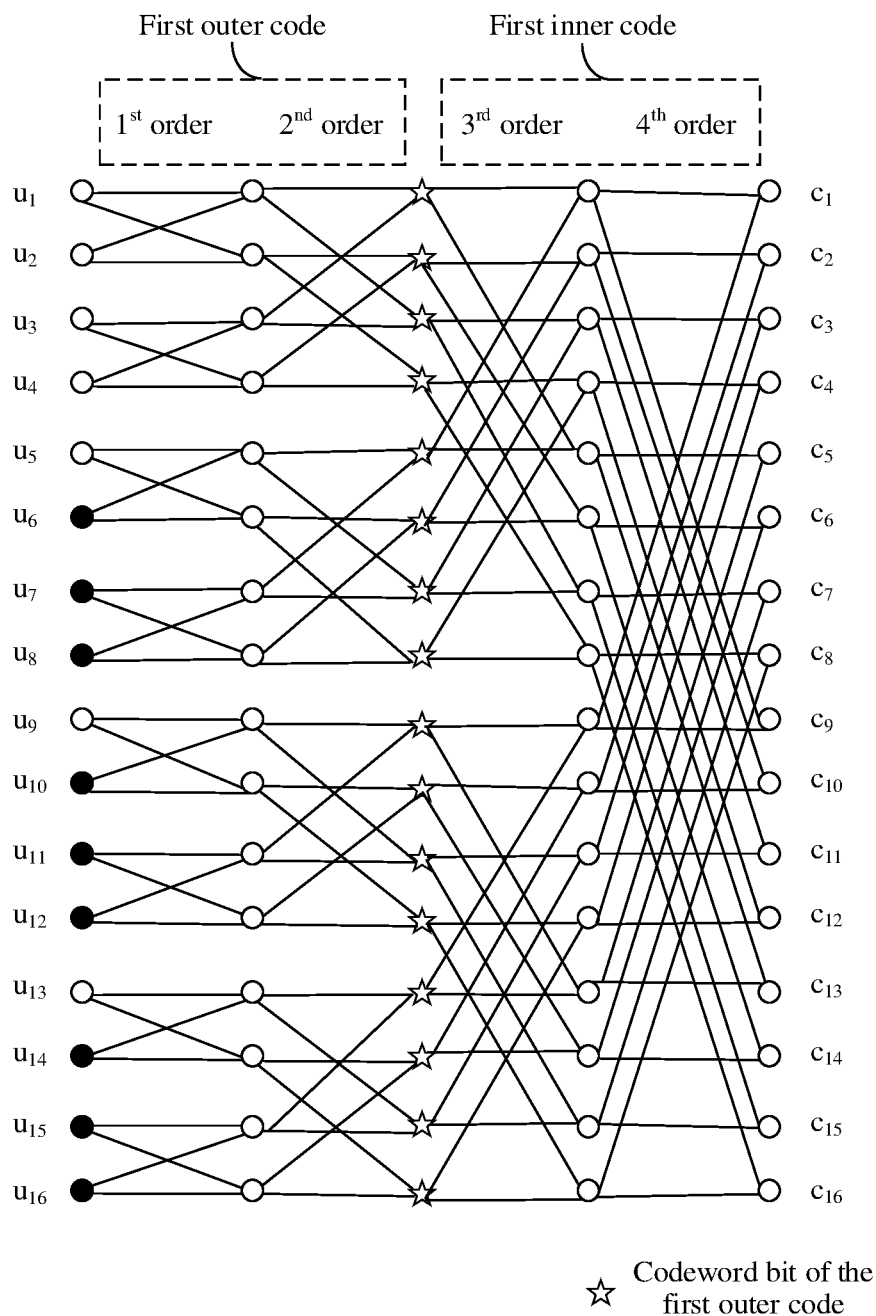
FIG. 4 is a schematic diagram of another trellis graph according to an embodiment.

As shown in FIG. 4, bits [$u_5$, $u_6$, $u_7$, $u_8$, $u_9$, $u_{10}$, $u_{11}$, $u_{12}$, $u_{13}$, $u_{14}$, $u_{15}$, $u_{16}$] of the first code respectively correspond to codeword bits [$x_5$, $x_6$, $x_7$, $x_8$, $x_9$, $x_{10}$, $x_{11}$, $x_{12}$, $x_{13}$, $x_{14}$, $x_{15}$, $x_{16}$] of the first outer code. The codeword bits [$x_5$, $x_6$, $x_7$, $x_8$] of the first outer code meet the following relationship:

$$\begin{cases} x_5 = u_5 \oplus u_6 \oplus u_7 \oplus u_8 \\ x_6 = u_6 \oplus u_8 \\ x_7 = u_7 \oplus u_8 \\ x_8 = u_8 \end{cases}$$

It can be understood that if the information bit $u_8$ is changed to a frozen bit, the information bit $x_8$ of the first inner code is also changed to a frozen bit. When the information bit $x_8$ of the first inner code is changed to the frozen bit, a code rate of the inner code is reduced. Likewise, $x_9$, $x_{10}$, $x_{11}$, $x_{12}$, $x_{13}$, $x_{14}$, $x_{15}$, and $x_{16}$ also meet a relationship. Details are not described herein again. In the embodiments, only codeword bits $[x_5, x_6, x_7, x_8]$ of the first outer code are used as an example for description.

Therefore, an information bit that is in the $S_1$ and that enables an information bit of the first inner code to be changed to a frozen bit when the information bit is changed to a frozen bit can be determined by sequentially traversing the information bits in the set $S_1$. According to the foregoing method, after the information bits in the set $S_1$ are traversed, the following can be determined: when $u_8$ is changed to a frozen bit, the information bit $x_8$ of the first inner code can be changed to a frozen bit. When $u_{12}$ is changed to a frozen bit, the information bit $x_{12}$ of the first inner code can be changed to a frozen bit. When $u_{16}$ is changed to a frozen bit, the information bit $x_{16}$ of the first inner code can be changed to a frozen bit. Therefore, the communications device determines that $S_3=[u_8, u_{12}, u_{16}]$.

After determining the set $S_3$, the communications device may select a first information bit from the set $S_3$, change the first information bit in $P_1$ to a frozen bit, to obtain $P_5$, and then determine $P_4$ based on $P_5$. For example, if the first information bit is $u_8$, $P_5$=[0000011001110111], and the communications device determines $P_4$ based on $P_5$=[0000011001110111].

If the set $S_3$ includes a plurality of information bits, the first information bit may be any information bit in the set $S_3$. For example, if $S_3=[u_8, u_{12}, u_{16}]$, the first information bit may be $u_8$, $u_{12}$, or $u_{16}$.

Alternatively, the set $S_3$ includes a plurality of information bits; and compared with another information bit in the set $S_3$, when the first information bit in the set $S_3$ is changed to a frozen bit, an information bit that is of the first inner code and that is changed to a frozen bit has a lowest reliability rank. For example, when $S_3=[u_8, u_{12}, u_{16}]$, and $u_8$ is changed to a frozen bit, the information bit $x_8$ of the first inner code is changed to a frozen bit; when $u_{12}$ is changed to a frozen bit, the information bit $x_{12}$ of the first inner code is changed to a frozen bit; and when $u_{16}$ is changed to a frozen bit, the information bit $x_{16}$ of the first inner code is changed to a frozen bit. Reliability of $x_8$ is lower than reliability of $x_{12}$, and the reliability of $x_{12}$ is less than reliability of $x_{16}$. Therefore, the communications device determines that $u_8$ is the first information bit.

If the set $S_3$ includes only one information bit, the information bit is the first information bit.

It should be noted that if the fourth code is a (16, 8) code, and the first code is a (16, 9) code, $P_5$=[0000011001110111]. A quantity of information bits in $P_5$ is equal to the quantity $k_4$ of information bits of the fourth code. In this case, the communications device may directly determine $P_5$ as $P_4$, and then encode the to-be-encoded information bit sequence based on $P_4$.

In an optional implementation, if the quantity of information bits in $P_5$ is greater than the quantity $k_4$ of information bits of the fourth code, that the communications device obtains the binary vector $P_4$ corresponding to the fourth code based on the binary vector $P_5$ is implemented in the following manner: determining a set $S_4$ from an information bit indicated by $P_5$, where when an information bit included in the set $S_4$ is changed to a frozen bit, at least one information bit of a second inner code can be changed to a frozen bit in a second encoding process, the first inner code is an outer code for the second encoding process, and the second inner code is an outer code for the first encoding process; determining a second information bit from the set $S_4$; changing the second information bit in $P_5$ to a frozen bit, to obtain a binary vector $P_6$; and obtaining the binary vector $P_4$ corresponding to the fourth code based on the binary vector $P_6$.

Figure 5:
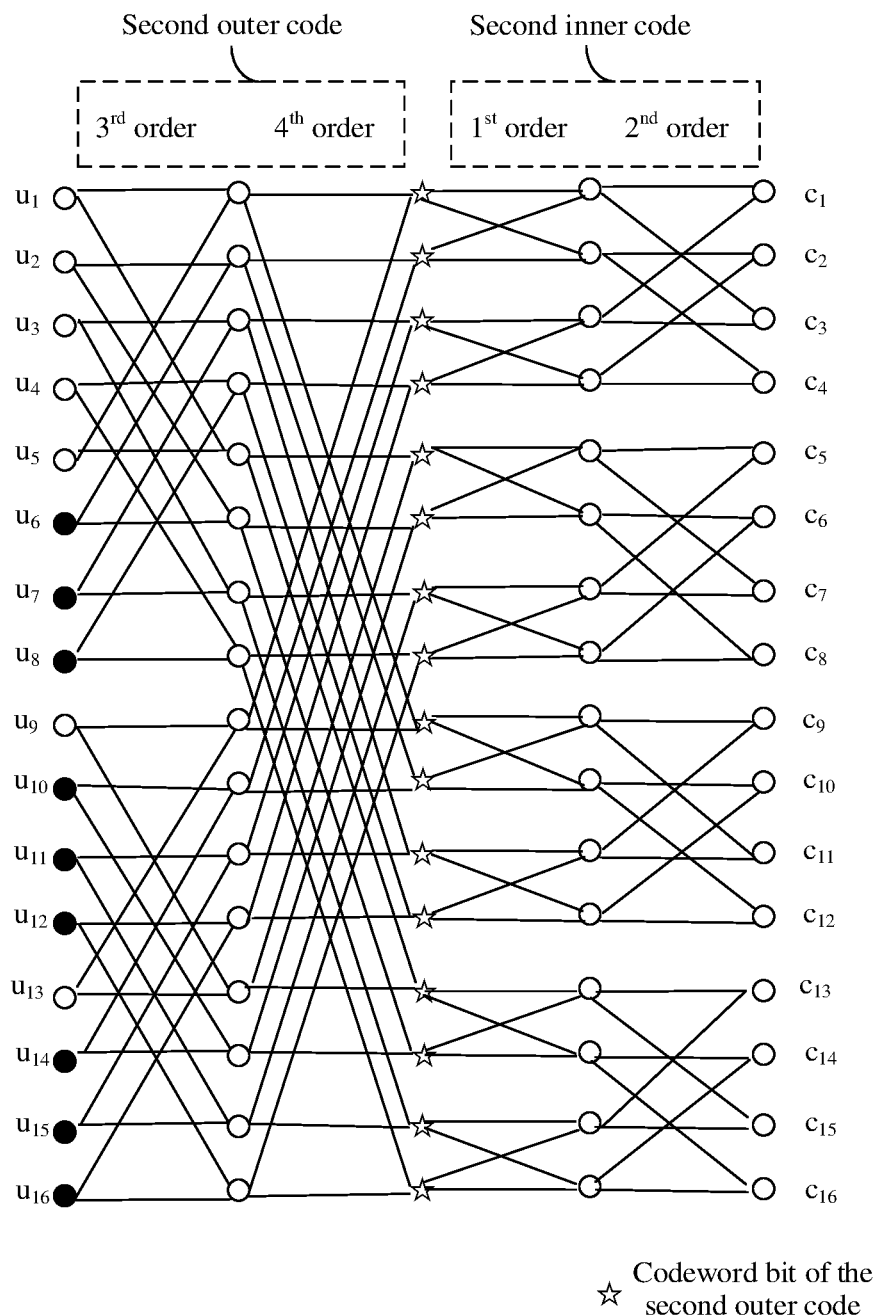
FIG. 5 is a schematic diagram of still another trellis graph according to an embodiment.

For example, the fourth code is a (16, 6) code, and $P_5$=[0000011001110111]. For example, the quantity of information bits in $P_5$ is 8, the quantity $k_4$ of information bits of the fourth code is 6, and the quantity of information bits in $P_5$ is greater than $k_4$. The communications device determines the set $S_4$ from the information bits indicated by $P_5$=[0000011001110111]. The information bits indicated by $P_5$ include $[u_6, u_7, u_{10}, u_{11}, u_{12}, u_{14}, u_{15}, u_{16}]$. For ease of description, a specific manner of determining the set $S_4$ is described below with reference to a corresponding trellis graph. An encoding process indicated by a trellis graph shown in FIG. 5 is a second encoding process. The first outer code in the trellis graph shown in FIG. 4 is a second inner code in the trellis graph shown in FIG. 5, and the first inner code in the trellis graph shown in FIG. 4 is a second outer code in the trellis graph shown in FIG. 5.

A principle for determining the set $S_4$ from the information bit indicated by $P_5$ is similar to a principle for determining the set $S_3$ from the information bit indicated by $P_1$. As shown in FIG. 5, if $u_{14}$ is changed to a frozen bit, an information bit $x_{14}$ of the second inner code can be changed to a frozen bit in the second encoding process; if $u_{15}$ is changed to a frozen bit, the information bit $x_{15}$ of the second inner code can be changed to a frozen bit in the second encoding process; and if $u_{16}$ is changed to a frozen bit, the information bit $x_{16}$ of the second inner code can be changed to a frozen bit in the second encoding process. Therefore, the communications device may determine that $S_4=[u_{14}, u_{15}, u_{16}]$.

After determining the set $S_4$, the communications device may select a second information bit from the set $S_4$, change the second information bit in $P_5$ to a frozen bit, to obtain $P_6$, and then determine $P_4$ based on $P_6$. For example, if the second information bit is $u_{14}$, $P_6$=[0000011001110011], and the communications device determines $P_4$ based on $P_6$.

If the set $S_4$ includes a plurality of information bits, the second information bit may be any information bit in the set $S_4$. For example, if $S_4=[u_{14}, u_{15}, u_{16}]$, the second information bit may be $u_{14}$, $u_{15}$, or $u_{16}$.

Alternatively, the set $S_4$ includes a plurality of information bits; and compared with another information bit in the set $S_4$, when the second information bit in the set $S_4$ is changed to a frozen bit, an information bit that is of the second inner code and that is changed to a frozen bit has a lowest reliability rank. For example, when $S_4=[u_{14}, u_{15}, u_{16}]$, and $u_{14}$ is changed to a frozen bit, the information bit $x_{14}$ of the second inner code is changed to a frozen bit; when $u_{15}$ is changed to a frozen bit, the information bit $x_{15}$ of the second inner code is changed to a frozen bit; and when $u_{16}$ is changed to a frozen bit, the information bit $x_{16}$ of the second inner code is changed to a frozen bit. Reliability of $x_{14}$ is lower than reliability of $x_{15}$, and the reliability of $x_{15}$ is less than reliability of $x_{16}$. Therefore, the communications device determines that $u_{14}$ is the second information bit. If the set $S_4$ includes only one information bit, the information bit is the second information bit.

Because the quantity of information bits of the fourth code is 6, one information bit further needs to be selected from $P_6$=[0000011001110011] and changed to a frozen bit. The communications device may determine, according to a principle the same as the principle for determining the set $S_3$, a set $S_5$ from an information bit indicated by $P_6$. For example, $S_5=[u_6, u_7, u_{12}, u_{16}]$. The communications device obtains a third information bit from $S_5$. For example, the third information bit is $u_6$, and the communications device changes $u_6$ in $P_6$ to a frozen bit, to obtain the binary vector $P_4$, where $P_4=[0000001001110011]$. After filling all the bits of the fourth code with values, the communications device obtains $u^{16}$. Then, the communications device encodes $u^{16}$, to obtain $c^{16}$, where $c^{16}=u^{16}F_{16}$.

303: The communications device outputs the encoded bit sequence.

In this embodiment, the communications device encodes the to-be-encoded information bit sequence based on the binary vector $P_1$ of the first code, and outputs the encoded bit sequence after obtaining the encoded bit sequence. After outputting the encoded bit sequence, the communications device may send the encoded bit sequence.

According to the method described in FIG. 3, after receiving the to-be-encoded information bit sequence, the communications device may encode the to-be-encoded information bit sequence based on the binary vector $P_1$ of the first code, to obtain the encoded bit sequence, and output the encoded bit sequence. It can be understood that the method described in FIG. 3 provides a new encoding manner; and when encoding is performed in this encoding manner, parallel decoding can be performed in a decoding process. This helps reduce a decoding delay.

Figure 8:
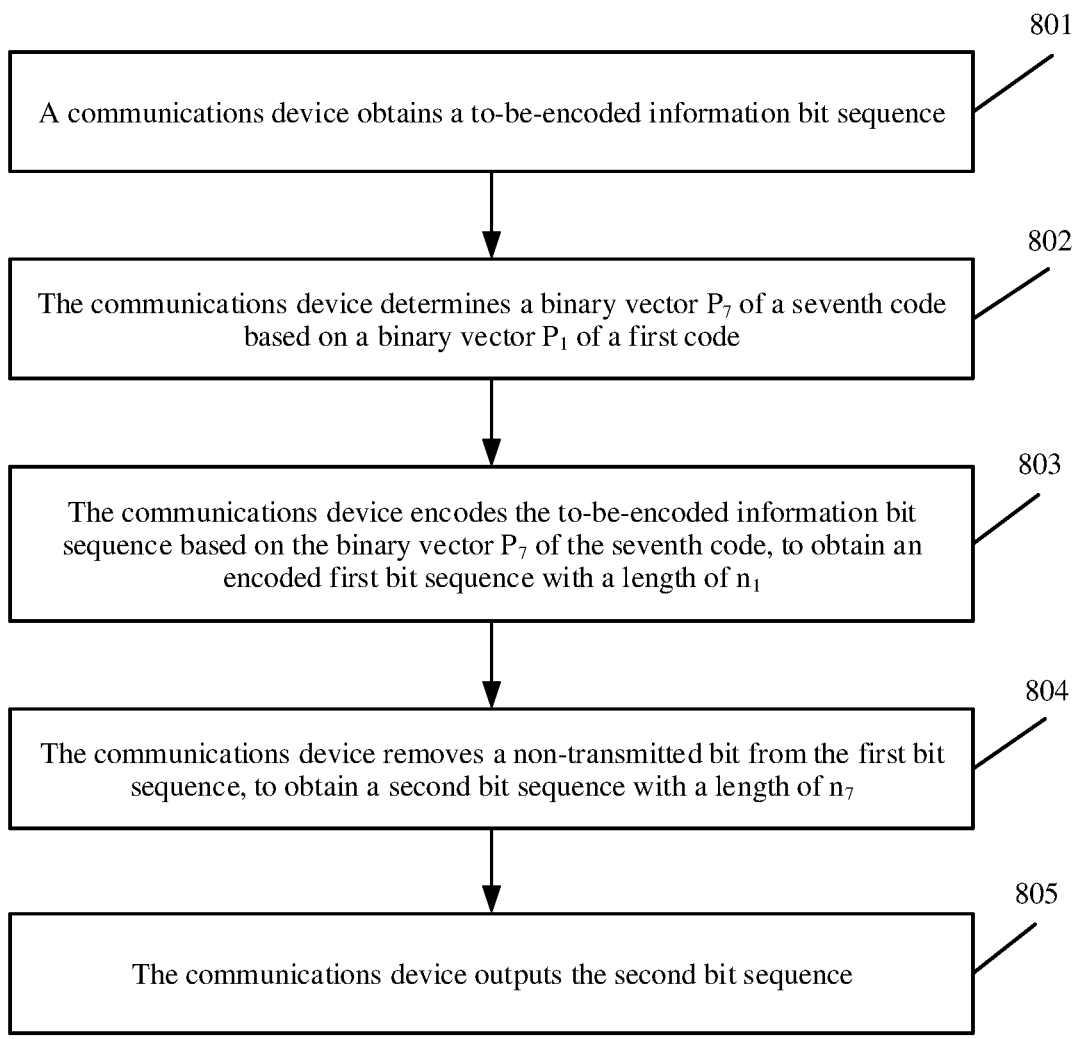
FIG. 8 is a schematic flowchart of another encoding method according to an embodiment.

FIG. 8 is a schematic flowchart of another encoding method according to an embodiment. As shown in FIG. 8, the encoding method includes the following steps 801 to 805. For step 801, refer to the descriptions in step 301. Details are not described again herein. Step 802 to step 804 are a specific implementation in which a communications device encodes a to-be-encoded information bit sequence based on a binary vector $P_1$ of a first code to obtain an encoded bit sequence. Step 805 is a specific implementation of step 303.

801: A communications device obtains a to-be-encoded information bit sequence.

802: The communications device determines a binary vector $P_7$ of a seventh code based on a binary vector $P_1$ of a first code.

For descriptions of the binary vector $P_1$ of the first code and a manner of determining the binary vector $P_1$ of the first code, refer to the corresponding descriptions in the embodiment corresponding to FIG. 3. Details are not described herein again.

The binary vector $P_7$ indicates an information bit, a frozen bit, and a non-transmitted bit of the seventh code. A code length of the seventh code is $n_7$, a quantity of information bits of the seventh code is $k_7$, a quantity of non-transmitted bits of the seventh code is $n_1-n_7$, $k_7$ is equal to a length of the to-be-encoded information bit sequence, $n_7$ is an integer greater than $k_7$, $$n_1 = 4^{\left\lceil \frac{\log_2(n_7)}{2} \right\rceil},$$

and $k_1$ is greater than or equal to $k_7$. Optionally, $k_1=k_7+n_1-n_7$.

For example, the seventh code is a (13, 6) code, and the first code may be a (16, 9) code or a (16, 6) code. The seventh code is a (50, 2) code, and the first code may be a (64, 16) code or a (64, 2) code.

In the binary vector $P_7$, a non-transmitted bit may be indicated by using a preset value. For example, the preset value is 2. When $p_{7,z}=1$, it indicates that a $z^{th}$ bit in to-be-encoded bits of the seventh code is an information bit. When $p_{7,z}=0$, it indicates that a $z^{th}$ bit in to-be-encoded bits of the seventh code is a frozen bit. When $p_{7,z}=2$, it indicates that a $z^{th}$ bit in encoded bits of the seventh code is a non-transmitted bit. Alternatively, the preset value may be another value such as 3, 4, or 5.

The following describes a specific implementation in which the communications device determines the binary vector $P_7$ of the seventh code based on the binary vector $P_1$ of the first code when $k_1=k_7+n_1-n_7$.

The communications device sequentially changes, according to a first preset rule, elements indicating information bits in $P_1$ to elements indicating non-transmitted bits, until a quantity of the elements indicating the non-transmitted bits in $P_1$ is equal to $n_1-n_7$, to obtain the binary vector $P_7$, where a value of the non-transmitted bit is independent of a value of the information bit of the seventh code. Based on this implementation, $P_7$ is determined, so that content corresponding to the information bit is not missed in a second bit sequence obtained after encoding. This helps ensure information integrity. Optionally, in this implementation, the non-transmitted bit may also be referred to as a shortened bit.

Optionally, the communications device sequentially changes, according to the first preset rule and based on a first binary sequence and a second binary sequence, the elements indicating the information bits in $P_1$ to the elements indicating the non-transmitted bits, until the quantity of the elements indicating the non-transmitted bits in $P_1$ is equal to $n_1-n_7$, to obtain the binary vector $P_7$. The first binary sequence includes binary sequence numbers that are of elements in $P_1$ and that are arranged in descending order or in ascending order. The second binary sequence also includes binary sequence numbers of elements in $P_1$. The first binary sequence and the second binary sequence are permuted.

For example, after receiving the to-be-encoded information bit sequence, the communications device may first determine the quantity of information bits of the seventh code, where the quantity of information bits of the seventh code is equal to the length of the to-be-encoded information bit sequence. After determining the quantity of information bits of the seventh code, the communications device determines the code length $n_1$ and the quantity $k_1$ of information bits of the first code based on the code length and the quantity of information bits of the seventh code. The code length of the seventh code may be preset. For example, the code length $n_7$ of the seventh code is 13, and the quantity $k_7$ of information bits of the seventh code is equal to 6.

$$n_1 = 4^{\left\lceil \frac{\log_2(n_7)}{2} \right\rceil},$$

and $k_1=k_7+n_1-n_7$. Therefore, the communications device determines that the code length $n_1$ of the first code is 16 and the quantity $k_1$ of information bits of the first code is 9. Then, the communications device determines a code length and a quantity of information bits of a second code and a code length and a quantity of information bits of a third code based on the code length $n_1$ and the quantity $k_1$ of information bits of the first code. After determining the code length and the quantity of information bits of the second code and the code length and the quantity of information bits of the third code, the communications device determines $P_2$ of the second code and $P_3$ of the third code, and then determines $P_1$ based on $P_2$ and $P_3$.

Figure 9:
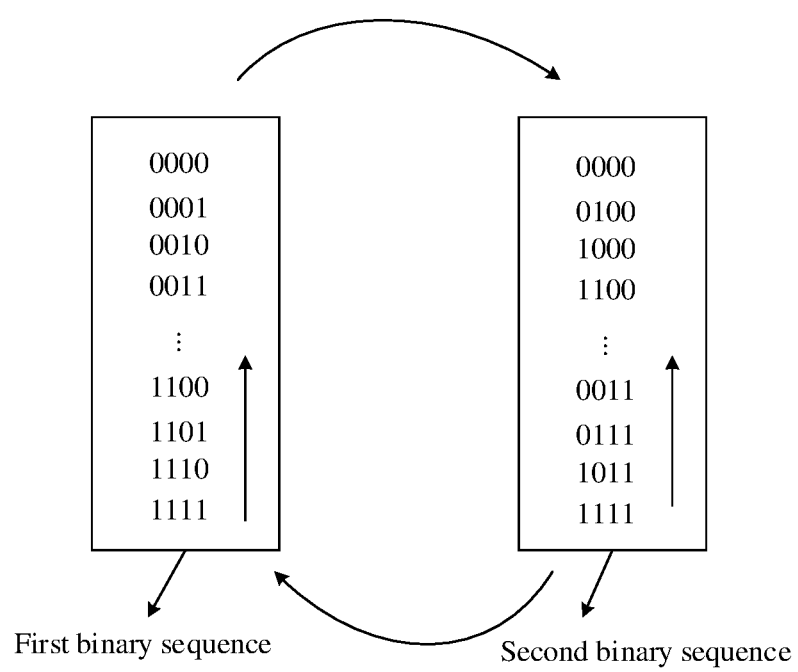
FIG. 9 is a schematic diagram of a first binary sequence and a second binary sequence according to an embodiment.

For example, $P_2=P_3=[0111]$, and $P_1=P_2 \otimes P_3=[0000011101110111]$. As shown in FIG. 9, the left box in FIG. 9 represents a first binary sequence. The first binary sequence includes binary sequence numbers of elements in $P_1$, and the binary sequence numbers in the left box are arranged in ascending order from top to bottom. 0000 indicates a sequence number 0 of the $1^{st}$ element in $P_1$, 0001 indicates a sequence number 1 of the $2^{nd}$ element in $P_1$, . . . , and 1111 indicates a sequence number 15 of the $16^{th}$ element in $P_1$. The right box in FIG. 9 represents a second binary sequence. In FIG. 9, binary sequence numbers in the right box and the binary sequence numbers in the left box are permuted.

As shown in FIG. 9, the communications device may determine, from the first binary sequence and the second binary sequence in a bottom-to-top order, the elements used to indicate the non-transmitted bits, until the quantity of the elements used to indicate the non-transmitted bits in $P_1$ is equal to 3. For example, an element value 2 is used to indicate a non-transmitted bit. The communications device determines, from the first binary sequence for the first time, that an element corresponding to 1111 is used to indicate a non-transmitted bit. Therefore, the communications device changes a value of the $16^{th}$ element in $P_1$ to 2. The communications device determines, from the second binary sequence for the second time, that an element corresponding to 1011 is used to indicate a non-transmitted bit. Therefore, the communications device changes a value of the $12^{th}$ element in $P_1$ to 2. The communications device determines, from the first binary sequence for the third time, that an element corresponding to 1110 is used to indicate a non-transmitted bit. Therefore, the communications device changes a value of the $15^{th}$ element in $P_1$ to 2. Finally, $P_7=[0000011101120122]$.

Figure 10:
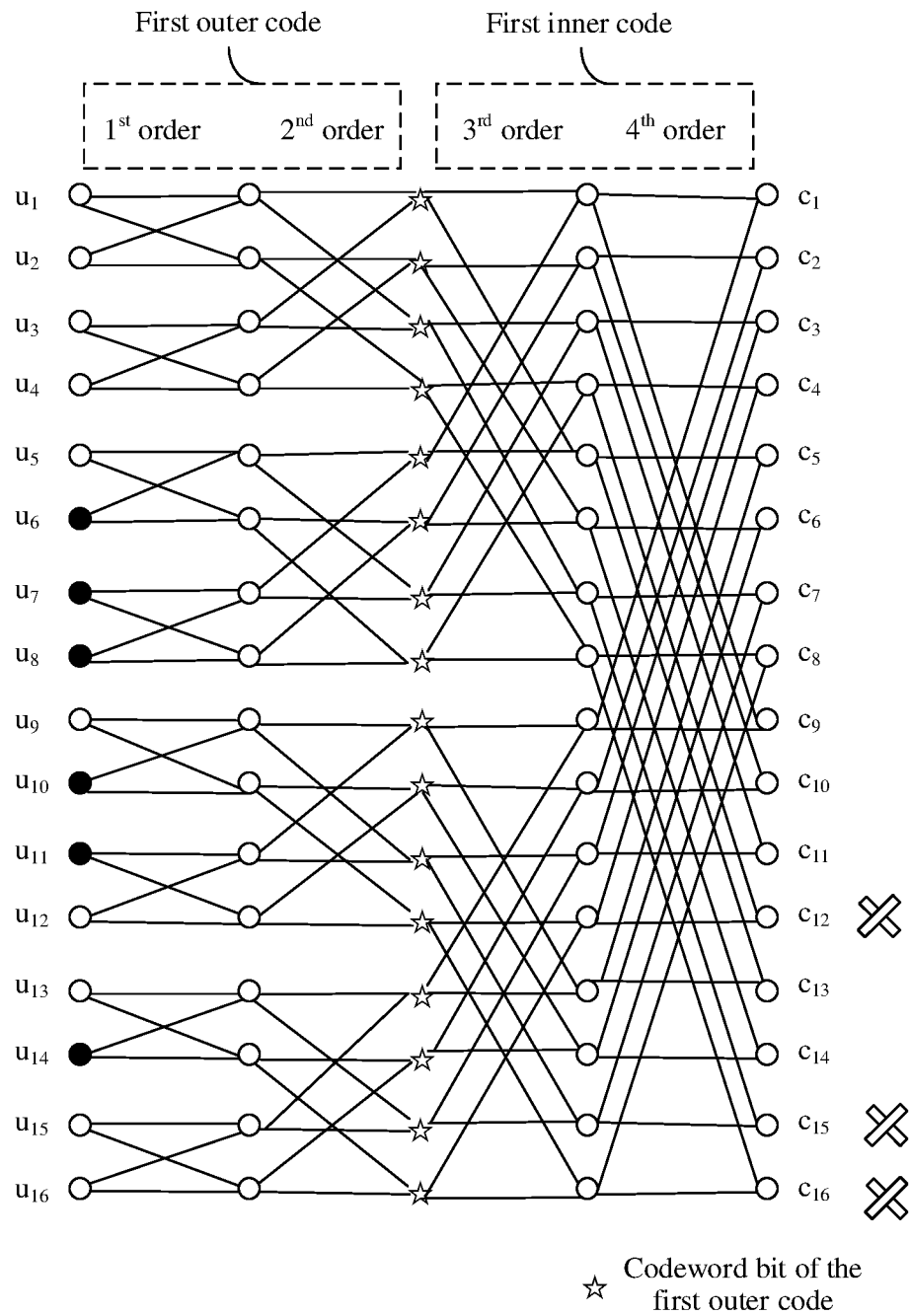
FIG. 10 is a schematic diagram of still another trellis graph according to an embodiment.
Figure 11:
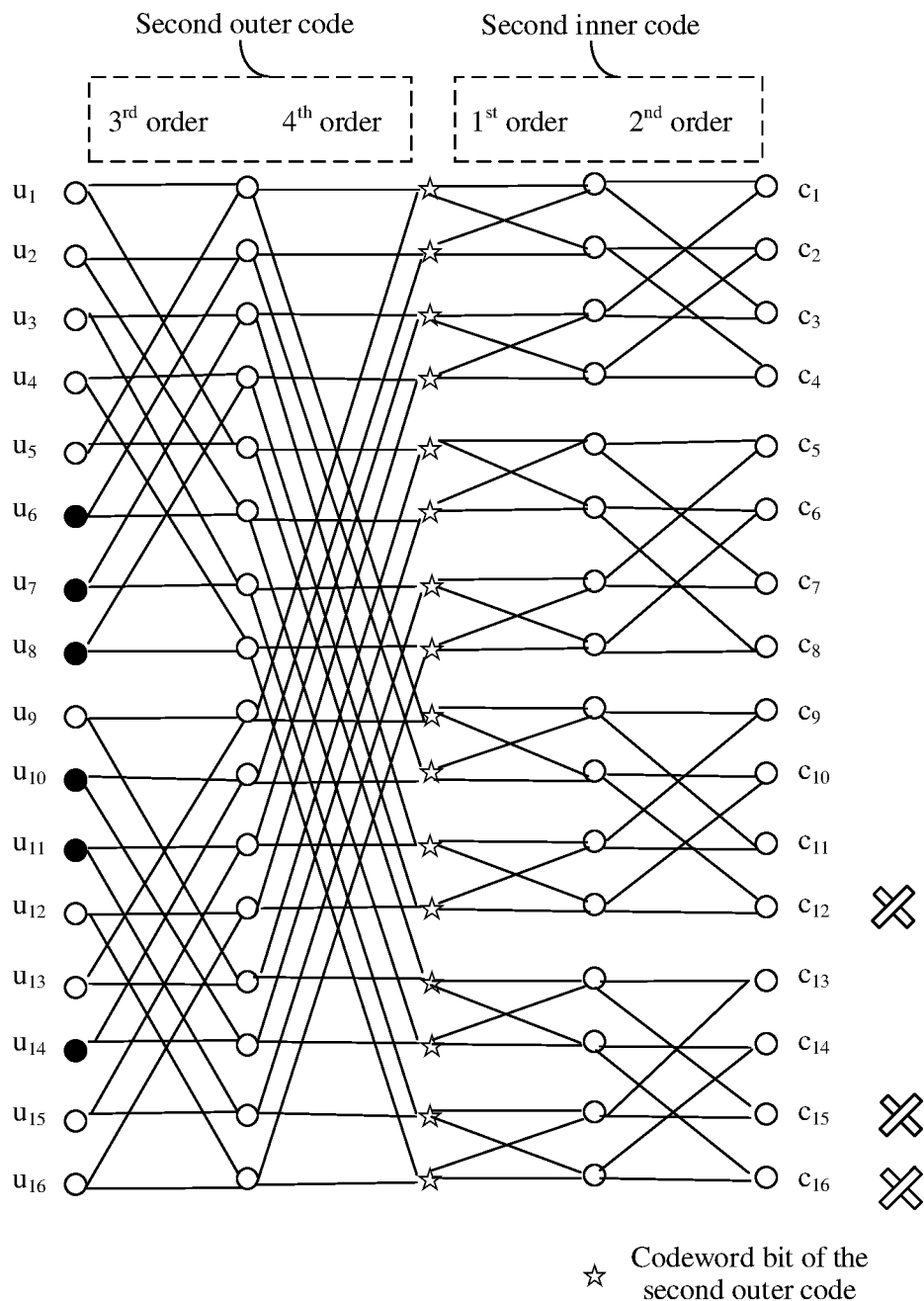
FIG. 11 is a schematic diagram of still another trellis graph according to an embodiment.

A value of the non-transmitted bit is independent of a value of the information bit of the seventh code. Descriptions are provided with reference to a corresponding trellis graph. A first outer code in a trellis graph shown in FIG. 10 is a second inner code in a trellis graph shown in FIG. 11, and a first inner code in the trellis graph shown in FIG. 10 is a second outer code in the trellis graph shown in FIG. 11. The communications device may perform encoding by using an encoding process indicated by the trellis graph shown in FIG. 10 or FIG. 11. As shown in FIG. 10 and FIG. 11, $u_6$, $u_7$, $u_8$, $u_{10}$, $u_{11}$, and $u_{14}$ are information bits, $u_1$, $u_2$, $u_3$, $u_4$, $u_5$, $u_9$, and $u_{13}$ are frozen bits, $c_{12}$, $c_{15}$, and $c_{16}$ are non-transmitted bits, and $u_{12}$, $u_{15}$, and $u_{16}$ are to-be-encoded bits corresponding to the non-transmitted bits. It can be understood from FIG. 10 and FIG. 11 that a value of the non-transmitted bit $c_{16}$ is determined based on a value of $u_{16}$, a value of the non-transmitted bit $c_{12}$ is determined based on values of $u_{12}$ and $u_{16}$, a value of the non-transmitted bit $c_{15}$ is determined based on values of $u_{15}$ and $u_{16}$, and the non-transmitted bits $c_{12}$, $c_{15}$, and $c_{16}$ have no relationship with values of the information bits. Therefore, even if $c_{12}$, $c_{15}$, and $c_{16}$ are removed, content corresponding to the information bits is not missed in the second bit sequence. This helps ensure information integrity.

Further, if the first binary sequence includes binary sequence numbers that are of elements in $P_1$ and that are arranged in descending order, the communications device may determine, from the first binary sequence and the second binary sequence in a top-to-bottom order, the elements used to indicate the non-transmitted bits. A specific implementation principle is the same as a principle for the communications device to determine, from the first binary sequence and the second binary sequence in the bottom-to-top order, the elements used to indicate the non-transmitted bits. Details are not described herein again.

The following describes a specific implementation in which the communications device determines the binary vector $P_7$ of the seventh code based on the binary vector $P_1$ of the first code when $k_1=k_7$.

The communications device sequentially changes, according to a second preset rule, elements indicating frozen bits in $P_1$ to elements indicating non-transmitted bits, until a quantity of the elements indicating the non-transmitted bits in $P_1$ is equal to $n_1-n_7$, to obtain the binary vector P7. Based on this implementation, the non-transmitted bit can be properly determined. Optionally, in this implementation, the non-transmitted bit may also be referred to as a punctured bit.

Optionally, the communications device sequentially changes, according to the second preset rule and based on a first binary sequence and a second binary sequence, the elements indicating the frozen bits in $P_1$ to the elements indicating the non-transmitted bits, until the quantity of the elements indicating the non-transmitted bits in $P_1$ is equal to $n_1-n_7$, to obtain the binary vector $P_7$. The first binary sequence includes binary sequence numbers that are of elements in $P_1$ and that are arranged in descending order or in ascending order. The second binary sequence also includes binary sequence numbers of elements in $P_1$. The first binary sequence and the second binary sequence are permuted.

For example, the code length $n_7$ of the seventh code is 13, and the quantity $k_7$ of information bits of the seventh code is equal to 6. The communications device determines $P_1=P_2 \otimes P_3=[0000001001110011]$ according to a principle the same as that in the foregoing example. The communications device determines the first binary sequence and the second binary sequence. For descriptions of the first binary sequence and the second binary sequence, refer to the foregoing descriptions.

As shown in FIG. 9, the communications device may determine, from the first binary sequence and the second binary sequence in a top-to-bottom order, the elements used to indicate the non-transmitted bits, until the quantity of the elements used to indicate the non-transmitted bits in $P_1$ is 3. For example, an element value 2 is used to indicate a non-transmitted bit. The communications device determines, from the first binary sequence for the first time, that an element corresponding to 0000 is used to indicate a non-transmitted bit. Therefore, the communications device changes a value of the $1^{st}$ element in $P_1$ to 2. The communications device determines, from the second binary sequence for the second time, that an element corresponding to 0100 is used to indicate a non-transmitted bit. Therefore, the communications device changes a value of the $5^{th}$ element in $P_1$ to 2. The communications device determines, from the first binary sequence for the third time, that an element corresponding to 0001 is used to indicate a non-transmitted bit. Therefore, the communications device changes a value of the $2^{nd}$ element in $P_1$ to 2. Finally, $P_7=[2200201001110011]$.

Further, if the first binary sequence includes binary sequence numbers that are of elements in $P_1$ and that are arranged in descending order, the communications device may determine, from the first binary sequence and the second binary sequence in a top-to-bottom order, the elements used to indicate the non-transmitted bits. A specific implementation principle is the same as a principle for the communications device to determine, from the first binary sequence and the second binary sequence in the bottom-to-top order, the elements used to indicate the non-transmitted bits. Details are not described herein again.

803: The communications device encodes the to-be-encoded information bit sequence based on the binary vector $P_7$ of the seventh code, to obtain an encoded first bit sequence with a length of m.

804: The communications device removes a non-transmitted bit from the first bit sequence, to obtain a second bit sequence with a length of $n_7$.

805: The communications device outputs the second bit sequence.

In an optional implementation, a value of a to-be-encoded bit corresponding to the non-transmitted bit is a value pre-agreed upon by a transmitter end and a receiver end.

For example, the binary vector of the seventh code is $P_7$=[0000011101120122]. As shown in FIG. 10 or FIG. 11, $u_6$, $u_7$, $u_8$, $u_{10}$, $u_{11}$, and $u_{14}$ are information bits, $u_1$, $u_2$, $u_3$, $u_4$, $u_5$, $u_9$, and $u_{13}$ are frozen bits, and $u_{12}$, $u_{15}$, and $u_{16}$ are to-be-encoded bits corresponding to non-transmitted bits. The communications device fills $u_6$, $u_7$, $u_8$, $u_{10}$, $u_{11}$, and $u_{14}$ with information in the received to-be-encoded information bit sequence and fills the frozen bits and the non-transmitted bits $u_1$, $u_2$, $u_3$, $u_4$, $u_5$, $u_9$, $u_{12}$, $u_{13}$, $u_{15}$, and $u_{16}$ with fixed values, for example, 0, pre-agreed upon by the transmitter end and the receiver end. The communications device fills $u_{12}$, $u_{15}$, and $u_{16}$ with values pre-agreed upon by the transmitter end and the receiver end. A value filled in the non-transmitted bit by the communications device may be the same as or different from the fixed value filled in the frozen bit. After encoding $u_1$ to $u_{16}$, the communications device obtains the first bit sequences $c_1$ to $c_{16}$. The communications device removes the non-transmitted bits $c_{16}$, $c_{15}$, and $c_{12}$. Remaining bits $c_1$ to $c_{11}$, $c_{13}$, and $c_{14}$ form the second bit sequence. The communications device outputs the second bit sequence.

Based on the method described in FIG. 8, the communications device can construct a code with any code length.

An embodiment further provides another encoding method. The following further describes the another encoding method.

After a communications device receives a to-be-encoded information bit sequence, the communications device encodes the to-be-encoded information bit sequence based on a binary vector $P_1$ of a first code, to obtain an encoded bit sequence. After obtaining the encoded bit sequence, the communications device outputs the encoded bit sequence. $P_1$ indicates an information bit and a frozen bit of the first code, and $P_1$ is determined based on a target sequence and a quantity $k_1$ of information bits of the first code. The quantity $k_1$ of information bits of the first code is equal to a length of the to-be-encoded information bit sequence. A code length of the first code is $n_1$. The target sequence is a sequence that is extracted from a stored sequence with a length of M and that includes a sequence number less than or equal to $n_1$. The sequence with the length of M includes a sequence number corresponding to each of M bits, and M is greater than or equal to $n_1$.

For example, M is 16. The communications device may store a sequence with a length of 16. The sequence is [10, 14, 12, 16, 13, 7, 6, 9, 11, 5, 2, 4, 15, 8, 3, 1]. The sequence indicates the following: A sequence number corresponding to a bit m is 10; a sequence number corresponding to a bit $u_2$ is 14; a sequence number corresponding to a bit $u_3$ is 12; a sequence number corresponding to a bit $u_4$ is 16; a sequence number corresponding to a bit $u_5$ is 13; a sequence number corresponding to a bit $u_6$ is 7; a sequence number corresponding to a bit $u_7$ is 6; a sequence number corresponding to a bit $u_8$ is 9; a sequence number corresponding to a bit $u_9$ is 11; a sequence number corresponding to a bit $u_{10}$ is 5; a sequence number corresponding to a bit $u_{11}$ is 2; a sequence number corresponding to a bit $u_{12}$ is 4; a sequence number corresponding to a bit $u_{13}$ is 15; a sequence number corresponding to a bit $u_{14}$ is 8; a sequence number corresponding to a bit $u_{15}$ is 3; and a sequence number corresponding to a bit $u_{16}$ is 1.

It is assumed that the length of the to-be-encoded information bit sequence received by the communications device is 15. After receiving the to-be-encoded information bit sequence, the communications device may determine that the quantity of information bits of the first code is 15. The code length of the first code may be preset, for example, may be 16. For example, the first code is a (16, 15) code. After determining the first code, the communications device obtains the target sequence from the stored sequence with the length of 16 based on the code length of the first code. The target sequence is the sequence that is extracted from the stored sequence with the length of M and that includes the sequence number less than or equal to m. Both M and m are equal to 16. Therefore, the target sequence is [10, 14, 12, 16, 13, 7, 6, 9, 11, 5, 2, 4, 15, 8, 3, 1]. The communications device determines a bit with a sequence number less than or equal to 15 in the target sequence as an information bit and determines a bit with a sequence number greater than 15 in the target sequence as a frozen bit. Therefore, the communications device determines that $P_1$=[1110111111111111].

For another example, it is assumed that the length of the to-be-encoded information bit sequence received by the communications device is 9. After receiving the to-be-encoded information bit sequence, the communications device may determine that the quantity of information bits of the first code is 9. The code length of the first code may be preset, for example, may be 16. For example, the first code is a (16, 9) code. After determining the first code, the communications device obtains the target sequence from the stored sequence with the length of 16 based on the code length of the first code. The target sequence is the sequence that is extracted from the stored sequence with the length of M and that includes the sequence number less than or equal to m. Both M and m are equal to 16. Therefore, the target sequence is [10, 14, 12, 16, 13, 7, 6, 9, 11, 5, 2, 4, 15, 8, 3, 1]. The communications device determines a bit with a sequence number less than or equal to 9 in the target sequence as an information bit and determines a bit with a sequence number greater than 9 in the target sequence as a frozen bit. Therefore, the communications device determines that $P_1$=[0000011101110111].

In an optional implementation, the communications device may further generate the sequence with the length of M in advance. That the communications device generates the sequence with the length of M is implemented in the following manner: determining a set $S_1$ from an information bit indicated by a binary vector $P_2$ of a second code, where when an information bit included in the set $S_1$ is changed to a frozen bit, at least one information bit of a first inner code can be changed to a frozen bit in a first encoding process; determining a first information bit from the set $S_1$; changing the first information bit in $P_2$ to a frozen bit, to obtain a binary vector $P_3$ of a third code, where a code length of the second code is M, a quantity of information bits of the second code is K, a code length of the third code is M, and a quantity of information bits of the third code is K−1;

determining that a sequence number corresponding to the first information bit is K; and traversing K from M to 1, to determine a sequence number corresponding to each bit in the sequence with the length of M.

Optionally, the set $S_1$ includes a plurality of information bits; and compared with another information bit in the set $S_1$, when the first information bit in the set $S_1$ is changed to a frozen bit, an information bit that is of the first inner code and that is changed to a frozen bit has a lowest reliability rank. Alternatively, the first information bit may be any information bit in the set $S_1$.

Herein, the second code and the third code are different from the second code and the third code in the embodiment described in FIG. 3. Herein, the code length of the second code is M, the quantity of information bits of the second code is K, the code length of the third code is M, and the quantity of information bits of the third code is K−1.

For example, a sequence with a length of 16 needs to be generated. First, K=16 is set. The communications device determines $P_3$ of the (16,15) third code based on the binary vector $P_2$=[1111111111111111] of the (16,16) second code. Herein, the communications device may determine, according to a principle the same as the principle for determining the set $S_3$ in the foregoing method embodiment, the set $S_1$ from the information bit indicated by $P_2$ of the second code. Then, the first information bit is obtained from the set $S_1$. The communications device changes the first information bit in $P_2$ to the frozen bit, to obtain $P_3$ of the third code. For example, if the first information bit is $u_4$, $P_3$=[1110111111111111]. The communications device determines that a sequence number corresponding to $u_4$ in the sequence with the length of 16 is 16.

Then, K=15 is set. The communications device determines $P_3$ of the (16, 14) third code of based on the binary vector $P_2$=[1110111111111111] of the (16, 15) second code. For example, if the first information bit is $u_{13}$, $P_3$=[1110111111110111]. The communications device determines that a sequence number corresponding to $u_{13}$ in the sequence with the length of 16 is 15. Similar operations are performed, until sequence numbers corresponding to all bits are determined. Then, the sequence numbers corresponding to all the bits form the sequence with the length of 16, and the sequence is stored in the communications device. For example, the sequence [10, 14, 12, 16, 13, 7, 6, 9, 11, 5, 2, 4, 15, 8, 3, 1] with the length of 16 is finally obtained.

In this embodiment, a sequence with a length of 4096 that is obtained in the foregoing manner when M is 4096 is further provided. Sequence numbers included in the sequence may be shown in Table 1, and the sequence may be prestored.

TABLE 1

Sequence with the length of M = 4096

| Index | Sequence number |
|---|---|
| 1 | 3970 |
| 2 | 3972 |
| 3 | 3974 |
| 4 | 3976 |
| 5 | 3978 |
| 6 | 3980 |
| 7 | 3982 |
| 8 | 3984 |
| 9 | 3986 |
| 10 | 3988 |
| 11 | 3990 |
| 12 | 3992 |
| 13 | 3994 |
| 14 | 3996 |
| 15 | 3998 |
| 16 | 4000 |
| 17 | 4002 |
| 18 | 4004 |
| 19 | 4006 |
| 20 | 4008 |
| 21 | 4010 |
| 22 | 4012 |
| 23 | 4014 |
| 24 | 4016 |
| 25 | 4018 |
| 26 | 4020 |
| 27 | 4022 |
| 28 | 4024 |
| 29 | 4026 |
| 30 | 4028 |
| 31 | 4030 |
| 32 | 4032 |
| 33 | 4034 |
| 34 | 4036 |
| 35 | 4038 |
| 36 | 4040 |
| 37 | 4042 |
| 38 | 4044 |
| 39 | 4046 |
| 40 | 4048 |
| 41 | 4050 |
| 42 | 4052 |
| 43 | 4054 |
| 44 | 4056 |
| 45 | 4058 |
| 46 | 4060 |
| 47 | 4062 |
| 48 | 4064 |
| 49 | 4066 |
| 50 | 4068 |
| 51 | 4070 |
| 52 | 4072 |
| 53 | 4074 |
| 54 | 4076 |
| 55 | 4078 |
| 56 | 4080 |
| 57 | 4082 |
| 58 | 4084 |
| 59 | 4086 |
| 60 | 4088 |
| 61 | 4090 |
| 62 | 4092 |
| 63 | 4094 |
| 64 | 4096 |
| 65 | 3971 |
| 66 | 3845 |
| 67 | 3847 |
| 68 | 3849 |
| 69 | 3851 |
| 70 | 3853 |
| 71 | 3855 |
| 72 | 3857 |
| 73 | 3859 |
| 74 | 3861 |
| 75 | 3863 |
| 76 | 3865 |
| 77 | 3867 |
| 78 | 3869 |
| 79 | 3871 |
| 80 | 3873 |
| 81 | 3875 |
| 82 | 3877 |
| 83 | 3879 |
| 84 | 3881 |

TABLE 1-continued

Sequence with the length of M = 4096

| Index | Sequence number |
|---|---|
| 85 | 3883 |
| 86 | 3885 |
| 87 | 3887 |
| 88 | 3889 |
| 89 | 3891 |
| 90 | 3893 |
| 91 | 3895 |
| 92 | 3897 |
| 93 | 3899 |
| 94 | 3901 |
| 95 | 3903 |
| 96 | 3905 |
| 97 | 3907 |
| 98 | 3909 |
| 99 | 3911 |
| 100 | 3913 |
| 101 | 3915 |
| 102 | 3917 |
| 103 | 3919 |
| 104 | 3921 |
| 105 | 3923 |
| 106 | 3925 |
| 107 | 3927 |
| 108 | 3929 |
| 109 | 3931 |
| 110 | 3933 |
| 111 | 3935 |
| 112 | 3937 |
| 113 | 3939 |
| 114 | 3941 |
| 115 | 3943 |
| 116 | 3945 |
| 117 | 3947 |
| 118 | 3949 |
| 119 | 3951 |
| 120 | 3953 |
| 121 | 3955 |
| 122 | 3957 |
| 123 | 3959 |
| 124 | 3961 |
| 125 | 3963 |
| 126 | 3965 |
| 127 | 3967 |
| 128 | 3969 |
| 129 | 3973 |
| 130 | 3846 |
| 131 | 3722 |
| 132 | 3724 |
| 133 | 3726 |
| 134 | 3728 |
| 135 | 3730 |
| 136 | 3732 |
| 137 | 3734 |
| 138 | 3736 |
| 139 | 3738 |
| 140 | 3740 |
| 141 | 3742 |
| 142 | 3744 |
| 143 | 3746 |
| 144 | 3748 |
| 145 | 3750 |
| 146 | 3752 |
| 147 | 3754 |
| 148 | 3756 |
| 149 | 3758 |
| 150 | 3760 |
| 151 | 3762 |
| 152 | 3764 |
| 153 | 3766 |
| 154 | 3768 |
| 155 | 3770 |
| 156 | 3772 |
| 157 | 3774 |
| 158 | 3776 |
| 159 | 3778 |
| 160 | 3780 |
| 161 | 3782 |
| 162 | 3784 |
| 163 | 3786 |
| 164 | 3788 |
| 165 | 3790 |
| 166 | 3792 |
| 167 | 3794 |
| 168 | 3796 |
| 169 | 3798 |
| 170 | 3800 |
| 171 | 3802 |
| 172 | 3804 |
| 173 | 3806 |
| 174 | 3808 |
| 175 | 3810 |
| 176 | 3812 |
| 177 | 3814 |
| 178 | 3816 |
| 179 | 3818 |
| 180 | 3820 |
| 181 | 3822 |
| 182 | 3824 |
| 183 | 3826 |
| 184 | 3828 |
| 185 | 3830 |
| 186 | 3832 |
| 187 | 3834 |
| 188 | 3836 |
| 189 | 3838 |
| 190 | 3840 |
| 191 | 3842 |
| 192 | 3844 |
| 193 | 3975 |
| 194 | 3848 |
| 195 | 3723 |
| 196 | 3250 |
| 197 | 3601 |
| 198 | 3252 |
| 199 | 3254 |
| 200 | 3256 |
| 201 | 3482 |
| 202 | 3258 |
| 203 | 3260 |
| 204 | 3262 |
| 205 | 3264 |
| 206 | 3266 |
| 207 | 3268 |
| 208 | 3270 |
| 209 | 3365 |
| 210 | 3272 |
| 211 | 3274 |
| 212 | 3276 |
| 213 | 3278 |
| 214 | 3280 |
| 215 | 3282 |
| 216 | 3284 |
| 217 | 3286 |
| 218 | 3288 |
| 219 | 3290 |
| 220 | 3292 |
| 221 | 3294 |
| 222 | 3296 |
| 223 | 3298 |
| 224 | 3300 |
| 225 | 3302 |
| 226 | 3304 |
| 227 | 3306 |
| 228 | 3308 |
| 229 | 3310 |
| 230 | 3312 |
| 231 | 3314 |
| 232 | 3316 |

TABLE 1-continued

Sequence with the length of M = 4096

| Index | Sequence number |
|---|---|
| 233 | 3318 |
| 234 | 3320 |
| 235 | 3322 |
| 236 | 3324 |
| 237 | 3326 |
| 238 | 3328 |
| 239 | 3330 |
| 240 | 3332 |
| 241 | 3334 |
| 242 | 3336 |
| 243 | 3338 |
| 244 | 3340 |
| 245 | 3342 |
| 246 | 3344 |
| 247 | 3346 |
| 248 | 3348 |
| 249 | 3350 |
| 250 | 3352 |
| 251 | 3354 |
| 252 | 3356 |
| 253 | 3358 |
| 254 | 3360 |
| 255 | 3362 |
| 256 | 3364 |
| 257 | 3977 |
| 258 | 3850 |
| 259 | 3725 |
| 260 | 3602 |
| 261 | 3603 |
| 262 | 3605 |
| 263 | 3607 |
| 264 | 3609 |
| 265 | 3611 |
| 266 | 3613 |
| 267 | 3615 |
| 268 | 3617 |
| 269 | 3619 |
| 270 | 3621 |
| 271 | 3623 |
| 272 | 3625 |
| 273 | 3627 |
| 274 | 3629 |
| 275 | 3631 |
| 276 | 3633 |
| 277 | 3635 |
| 278 | 3637 |
| 279 | 3639 |
| 280 | 3641 |
| 281 | 3643 |
| 282 | 3645 |
| 283 | 3647 |
| 284 | 3649 |
| 285 | 3651 |
| 286 | 3653 |
| 287 | 3655 |
| 288 | 3657 |
| 289 | 3659 |
| 290 | 3661 |
| 291 | 3663 |
| 292 | 3665 |
| 293 | 3667 |
| 294 | 3669 |
| 295 | 3671 |
| 296 | 3673 |
| 297 | 3675 |
| 298 | 3677 |
| 299 | 3679 |
| 300 | 3681 |
| 301 | 3683 |
| 302 | 3685 |
| 303 | 3687 |
| 304 | 3689 |
| 305 | 3691 |
| 306 | 3693 |
| 307 | 3695 |
| 308 | 3697 |
| 309 | 3699 |
| 310 | 3701 |
| 311 | 3703 |
| 312 | 3705 |
| 313 | 3707 |
| 314 | 3709 |
| 315 | 3711 |
| 316 | 3713 |
| 317 | 3715 |
| 318 | 3717 |
| 319 | 3719 |
| 320 | 3721 |
| 321 | 3979 |
| 322 | 3852 |
| 323 | 3727 |
| 324 | 3251 |
| 325 | 3604 |
| 326 | 3026 |
| 327 | 3028 |
| 328 | 3030 |
| 329 | 3484 |
| 330 | 3032 |
| 331 | 3034 |
| 332 | 3036 |
| 333 | 3038 |
| 334 | 3040 |
| 335 | 3042 |
| 336 | 3044 |
| 337 | 3367 |
| 338 | 3046 |
| 339 | 3048 |
| 340 | 3050 |
| 341 | 3052 |
| 342 | 3054 |
| 343 | 3056 |
| 344 | 3058 |
| 345 | 3060 |
| 346 | 3062 |
| 347 | 3064 |
| 348 | 3066 |
| 349 | 3068 |
| 350 | 3070 |
| 351 | 3072 |
| 352 | 3074 |
| 353 | 3137 |
| 354 | 3076 |
| 355 | 3078 |
| 356 | 3080 |
| 357 | 3082 |
| 358 | 3084 |
| 359 | 3086 |
| 360 | 3088 |
| 361 | 3090 |
| 362 | 3092 |
| 363 | 3094 |
| 364 | 3096 |
| 365 | 3098 |
| 366 | 3100 |
| 367 | 3102 |
| 368 | 3104 |
| 369 | 3106 |
| 370 | 3108 |
| 371 | 3110 |
| 372 | 3112 |
| 373 | 3114 |
| 374 | 3116 |
| 375 | 3118 |
| 376 | 3120 |
| 377 | 3122 |
| 378 | 3124 |
| 379 | 3126 |
| 380 | 3128 |

TABLE 1-continued

Sequence with the length of M = 4096

| Index | Sequence number |
|---|---|
| 381 | 3130 |
| 382 | 3132 |
| 383 | 3134 |
| 384 | 3136 |
| 385 | 3981 |
| 386 | 3854 |
| 387 | 3729 |
| 388 | 3253 |
| 389 | 3606 |
| 390 | 3027 |
| 391 | 2917 |
| 392 | 2919 |
| 393 | 3486 |
| 394 | 2921 |
| 395 | 2923 |
| 396 | 2925 |
| 397 | 2927 |
| 398 | 2929 |
| 399 | 2931 |
| 400 | 2933 |
| 401 | 3369 |
| 402 | 2935 |
| 403 | 2937 |
| 404 | 2939 |
| 405 | 2941 |
| 406 | 2943 |
| 407 | 2945 |
| 408 | 2947 |
| 409 | 2949 |
| 410 | 2951 |
| 411 | 2953 |
| 412 | 2955 |
| 413 | 2957 |
| 414 | 2959 |
| 415 | 2961 |
| 416 | 2963 |
| 417 | 3139 |
| 418 | 2965 |
| 419 | 2967 |
| 420 | 2969 |
| 421 | 2971 |
| 422 | 2973 |
| 423 | 2975 |
| 424 | 2977 |
| 425 | 2979 |
| 426 | 2981 |
| 427 | 2983 |
| 428 | 2985 |
| 429 | 2987 |
| 430 | 2989 |
| 431 | 2991 |
| 432 | 2993 |
| 433 | 2995 |
| 434 | 2997 |
| 435 | 2999 |
| 436 | 3001 |
| 437 | 3003 |
| 438 | 3005 |
| 439 | 3007 |
| 440 | 3009 |
| 441 | 3011 |
| 442 | 3013 |
| 443 | 3015 |
| 444 | 3017 |
| 445 | 3019 |
| 446 | 3021 |
| 447 | 3023 |
| 448 | 3025 |
| 449 | 3983 |
| 450 | 3856 |
| 451 | 3731 |
| 452 | 3255 |
| 453 | 3608 |
| 454 | 3029 |
| 455 | 2918 |
| 456 | 2026 |
| 457 | 3488 |
| 458 | 2810 |
| 459 | 2705 |
| 460 | 2028 |
| 461 | 2501 |
| 462 | 2030 |
| 463 | 2032 |
| 464 | 2034 |
| 465 | 3371 |
| 466 | 2602 |
| 467 | 2402 |
| 468 | 2036 |
| 469 | 2210 |
| 470 | 2038 |
| 471 | 2040 |
| 472 | 2042 |
| 473 | 2044 |
| 474 | 2046 |
| 475 | 2048 |
| 476 | 2050 |
| 477 | 2052 |
| 478 | 2054 |
| 479 | 2056 |
| 480 | 2058 |
| 481 | 3141 |
| 482 | 2305 |
| 483 | 2117 |
| 484 | 2060 |
| 485 | 2062 |
| 486 | 2064 |
| 487 | 2066 |
| 488 | 2068 |
| 489 | 2070 |
| 490 | 2072 |
| 491 | 2074 |
| 492 | 2076 |
| 493 | 2078 |
| 494 | 2080 |
| 495 | 2082 |
| 496 | 2084 |
| 497 | 2086 |
| 498 | 2088 |
| 499 | 2090 |
| 500 | 2092 |
| 501 | 2094 |
| 502 | 2096 |
| 503 | 2098 |
| 504 | 2100 |
| 505 | 2102 |
| 506 | 2104 |
| 507 | 2106 |
| 508 | 2108 |
| 509 | 2110 |
| 510 | 2112 |
| 511 | 2114 |
| 512 | 2116 |
| 513 | 3985 |
| 514 | 3858 |
| 515 | 3733 |
| 516 | 3483 |
| 517 | 3610 |
| 518 | 3485 |
| 519 | 3487 |
| 520 | 3489 |
| 521 | 3490 |
| 522 | 3492 |
| 523 | 3494 |
| 524 | 3496 |
| 525 | 3498 |
| 526 | 3500 |
| 527 | 3502 |
| 528 | 3504 |

TABLE 1-continued

Sequence with the length of M = 4096

| Index | Sequence number |
|---|---|
| 529 | 3506 |
| 530 | 3508 |
| 531 | 3510 |
| 532 | 3512 |
| 533 | 3514 |
| 534 | 3516 |
| 535 | 3518 |
| 536 | 3520 |
| 537 | 3522 |
| 538 | 3524 |
| 539 | 3526 |
| 540 | 3528 |
| 541 | 3530 |
| 542 | 3532 |
| 543 | 3534 |
| 544 | 3536 |
| 545 | 3538 |
| 546 | 3540 |
| 547 | 3542 |
| 548 | 3544 |
| 549 | 3546 |
| 550 | 3548 |
| 551 | 3550 |
| 552 | 3552 |
| 553 | 3554 |
| 554 | 3556 |
| 555 | 3558 |
| 556 | 3560 |
| 557 | 3562 |
| 558 | 3564 |
| 559 | 3566 |
| 560 | 3568 |
| 561 | 3570 |
| 562 | 3572 |
| 563 | 3574 |
| 564 | 3576 |
| 565 | 3578 |
| 566 | 3580 |
| 567 | 3582 |
| 568 | 3584 |
| 569 | 3586 |
| 570 | 3588 |
| 571 | 3590 |
| 572 | 3592 |
| 573 | 3594 |
| 574 | 3596 |
| 575 | 3598 |
| 576 | 3600 |
| 577 | 3987 |
| 578 | 3860 |
| 579 | 3735 |
| 580 | 3257 |
| 581 | 3612 |
| 582 | 3031 |
| 583 | 2920 |
| 584 | 2811 |
| 585 | 3491 |
| 586 | 2812 |
| 587 | 2814 |
| 588 | 2816 |
| 589 | 2818 |
| 590 | 2820 |
| 591 | 2822 |
| 592 | 2824 |
| 593 | 3373 |
| 594 | 2826 |
| 595 | 2828 |
| 596 | 2830 |
| 597 | 2832 |
| 598 | 2834 |
| 599 | 2836 |
| 600 | 2838 |
| 601 | 2840 |
| 602 | 2842 |
| 603 | 2844 |
| 604 | 2846 |
| 605 | 2848 |
| 606 | 2850 |
| 607 | 2852 |
| 608 | 2854 |
| 609 | 3143 |
| 610 | 2856 |
| 611 | 2858 |
| 612 | 2860 |
| 613 | 2862 |
| 614 | 2864 |
| 615 | 2866 |
| 616 | 2868 |
| 617 | 2870 |
| 618 | 2872 |
| 619 | 2874 |
| 620 | 2876 |
| 621 | 2878 |
| 622 | 2880 |
| 623 | 2882 |
| 624 | 2884 |
| 625 | 2886 |
| 626 | 2888 |
| 627 | 2890 |
| 628 | 2892 |
| 629 | 2894 |
| 630 | 2896 |
| 631 | 2898 |
| 632 | 2900 |
| 633 | 2902 |
| 634 | 2904 |
| 635 | 2906 |
| 636 | 2908 |
| 637 | 2910 |
| 638 | 2912 |
| 639 | 2914 |
| 640 | 2916 |
| 641 | 3989 |
| 642 | 3862 |
| 643 | 3737 |
| 644 | 3259 |
| 645 | 3614 |
| 646 | 3033 |
| 647 | 2922 |
| 648 | 2706 |
| 649 | 3493 |
| 650 | 2813 |
| 651 | 2707 |
| 652 | 2709 |
| 653 | 2711 |
| 654 | 2713 |
| 655 | 2715 |
| 656 | 2717 |
| 657 | 3375 |
| 658 | 2719 |
| 659 | 2721 |
| 660 | 2723 |
| 661 | 2725 |
| 662 | 2727 |
| 663 | 2729 |
| 664 | 2731 |
| 665 | 2733 |
| 666 | 2735 |
| 667 | 2737 |
| 668 | 2739 |
| 669 | 2741 |
| 670 | 2743 |
| 671 | 2745 |
| 672 | 2747 |
| 673 | 3145 |
| 674 | 2749 |
| 675 | 2751 |
| 676 | 2753 |

TABLE 1-continued

Sequence with the length of M = 4096

| Index | Sequence number |
|---|---|
| 677 | 2755 |
| 678 | 2757 |
| 679 | 2759 |
| 680 | 2761 |
| 681 | 2763 |
| 682 | 2765 |
| 683 | 2767 |
| 684 | 2769 |
| 685 | 2771 |
| 686 | 2773 |
| 687 | 2775 |
| 688 | 2777 |
| 689 | 2779 |
| 690 | 2781 |
| 691 | 2783 |
| 692 | 2785 |
| 693 | 2787 |
| 694 | 2789 |
| 695 | 2791 |
| 696 | 2793 |
| 697 | 2795 |
| 698 | 2797 |
| 699 | 2799 |
| 700 | 2801 |
| 701 | 2803 |
| 702 | 2805 |
| 703 | 2807 |
| 704 | 2809 |
| 705 | 3991 |
| 706 | 3864 |
| 707 | 3739 |
| 708 | 3261 |
| 709 | 3616 |
| 710 | 3035 |
| 711 | 2924 |
| 712 | 2027 |
| 713 | 3495 |
| 714 | 2815 |
| 715 | 2708 |
| 716 | 1765 |
| 717 | 2503 |
| 718 | 1767 |
| 719 | 1769 |
| 720 | 1771 |
| 721 | 3377 |
| 722 | 2604 |
| 723 | 2404 |
| 724 | 1773 |
| 725 | 2212 |
| 726 | 1775 |
| 727 | 1777 |
| 728 | 1779 |
| 729 | 1937 |
| 730 | 1781 |
| 731 | 1783 |
| 732 | 1785 |
| 733 | 1787 |
| 734 | 1789 |
| 735 | 1791 |
| 736 | 1793 |
| 737 | 3147 |
| 738 | 2307 |
| 739 | 2119 |
| 740 | 1795 |
| 741 | 1850 |
| 742 | 1797 |
| 743 | 1799 |
| 744 | 1801 |
| 745 | 1803 |
| 746 | 1805 |
| 747 | 1807 |
| 748 | 1809 |
| 749 | 1811 |
| 750 | 1813 |
| 751 | 1815 |
| 752 | 1817 |
| 753 | 1819 |
| 754 | 1821 |
| 755 | 1823 |
| 756 | 1825 |
| 757 | 1827 |
| 758 | 1829 |
| 759 | 1831 |
| 760 | 1833 |
| 761 | 1835 |
| 762 | 1837 |
| 763 | 1839 |
| 764 | 1841 |
| 765 | 1843 |
| 766 | 1845 |
| 767 | 1847 |
| 768 | 1849 |
| 769 | 3993 |
| 770 | 3866 |
| 771 | 3741 |
| 772 | 3263 |
| 773 | 3618 |
| 774 | 3037 |
| 775 | 2926 |
| 776 | 2502 |
| 777 | 3497 |
| 778 | 2817 |
| 779 | 2710 |
| 780 | 2504 |
| 781 | 2505 |
| 782 | 2507 |
| 783 | 2509 |
| 784 | 2511 |
| 785 | 3379 |
| 786 | 2606 |
| 787 | 2513 |
| 788 | 2515 |
| 789 | 2517 |
| 790 | 2519 |
| 791 | 2521 |
| 792 | 2523 |
| 793 | 2525 |
| 794 | 2527 |
| 795 | 2529 |
| 796 | 2531 |
| 797 | 2533 |
| 798 | 2535 |
| 799 | 2537 |
| 800 | 2539 |
| 801 | 3149 |
| 802 | 2541 |
| 803 | 2543 |
| 804 | 2545 |
| 805 | 2547 |
| 806 | 2549 |
| 807 | 2551 |
| 808 | 2553 |
| 809 | 2555 |
| 810 | 2557 |
| 811 | 2559 |
| 812 | 2561 |
| 813 | 2563 |
| 814 | 2565 |
| 815 | 2567 |
| 816 | 2569 |
| 817 | 2571 |
| 818 | 2573 |
| 819 | 2575 |
| 820 | 2577 |
| 821 | 2579 |
| 822 | 2581 |
| 823 | 2583 |
| 824 | 2585 |

TABLE 1-continued

Sequence with the length of M = 4096

| Index | Sequence number |
|---|---|
| 825 | 2587 |
| 826 | 2589 |
| 827 | 2591 |
| 828 | 2593 |
| 829 | 2595 |
| 830 | 2597 |
| 831 | 2599 |
| 832 | 2601 |
| 833 | 3995 |
| 834 | 3868 |
| 835 | 3743 |
| 836 | 3265 |
| 837 | 3620 |
| 838 | 3039 |
| 839 | 2928 |
| 840 | 2029 |
| 841 | 3499 |
| 842 | 2819 |
| 843 | 2712 |
| 844 | 1766 |
| 845 | 2506 |
| 846 | 1601 |
| 847 | 1603 |
| 848 | 1605 |
| 849 | 3381 |
| 850 | 2608 |
| 851 | 2406 |
| 852 | 1607 |
| 853 | 2214 |
| 854 | 1609 |
| 855 | 1611 |
| 856 | 1613 |
| 857 | 1939 |
| 858 | 1615 |
| 859 | 1617 |
| 860 | 1619 |
| 861 | 1621 |
| 862 | 1623 |
| 863 | 1625 |
| 864 | 1627 |
| 865 | 3151 |
| 866 | 2309 |
| 867 | 2121 |
| 868 | 1629 |
| 869 | 1852 |
| 870 | 1631 |
| 871 | 1633 |
| 872 | 1635 |
| 873 | 1682 |
| 874 | 1637 |
| 875 | 1639 |
| 876 | 1641 |
| 877 | 1643 |
| 878 | 1645 |
| 879 | 1647 |
| 880 | 1649 |
| 881 | 1651 |
| 882 | 1653 |
| 883 | 1655 |
| 884 | 1657 |
| 885 | 1659 |
| 886 | 1661 |
| 887 | 1663 |
| 888 | 1665 |
| 889 | 1667 |
| 890 | 1669 |
| 891 | 1671 |
| 892 | 1673 |
| 893 | 1675 |
| 894 | 1677 |
| 895 | 1679 |
| 896 | 1681 |
| 897 | 3997 |
| 898 | 3870 |
| 899 | 3745 |
| 900 | 3267 |
| 901 | 3622 |
| 902 | 3041 |
| 903 | 2930 |
| 904 | 2031 |
| 905 | 3501 |
| 906 | 2821 |
| 907 | 2714 |
| 908 | 1768 |
| 909 | 2508 |
| 910 | 1602 |
| 911 | 1445 |
| 912 | 1447 |
| 913 | 3383 |
| 914 | 2610 |
| 915 | 2408 |
| 916 | 1522 |
| 917 | 2216 |
| 918 | 1449 |
| 919 | 1451 |
| 920 | 1453 |
| 921 | 1941 |
| 922 | 1455 |
| 923 | 1457 |
| 924 | 1459 |
| 925 | 1461 |
| 926 | 1463 |
| 927 | 1465 |
| 928 | 1467 |
| 929 | 3153 |
| 930 | 2311 |
| 931 | 2123 |
| 932 | 1469 |
| 933 | 1854 |
| 934 | 1471 |
| 935 | 1473 |
| 936 | 1475 |
| 937 | 1684 |
| 938 | 1477 |
| 939 | 1479 |
| 940 | 1481 |
| 941 | 1483 |
| 942 | 1485 |
| 943 | 1487 |
| 944 | 1489 |
| 945 | 1491 |
| 946 | 1493 |
| 947 | 1495 |
| 948 | 1497 |
| 949 | 1499 |
| 950 | 1501 |
| 951 | 1503 |
| 952 | 1505 |
| 953 | 1507 |
| 954 | 1509 |
| 955 | 1511 |
| 956 | 1513 |
| 957 | 1515 |
| 958 | 1517 |
| 959 | 1519 |
| 960 | 1521 |
| 961 | 3999 |
| 962 | 3872 |
| 963 | 3747 |
| 964 | 3269 |
| 965 | 3624 |
| 966 | 3043 |
| 967 | 2932 |
| 968 | 2033 |
| 969 | 3503 |
| 970 | 2823 |
| 971 | 2716 |
| 972 | 1770 |

TABLE 1-continued

Sequence with the length of M = 4096

| Index | Sequence number |
|---|---|
| 973 | 2510 |
| 974 | 1604 |
| 975 | 1446 |
| 976 | 677 |
| 977 | 3385 |
| 978 | 2612 |
| 979 | 2410 |
| 980 | 1524 |
| 981 | 2218 |
| 982 | 1297 |
| 983 | 1157 |
| 984 | 679 |
| 985 | 1943 |
| 986 | 1090 |
| 987 | 962 |
| 988 | 681 |
| 989 | 785 |
| 990 | 683 |
| 991 | 685 |
| 992 | 687 |
| 993 | 3155 |
| 994 | 2313 |
| 995 | 2125 |
| 996 | 1226 |
| 997 | 1856 |
| 998 | 1025 |
| 999 | 901 |
| 1000 | 689 |
| 1001 | 1686 |
| 1002 | 842 |
| 1003 | 730 |
| 1004 | 691 |
| 1005 | 693 |
| 1006 | 695 |
| 1007 | 697 |
| 1008 | 699 |
| 1009 | 1370 |
| 1010 | 701 |
| 1011 | 703 |
| 1012 | 705 |
| 1013 | 707 |
| 1014 | 709 |
| 1015 | 711 |
| 1016 | 713 |
| 1017 | 715 |
| 1018 | 717 |
| 1019 | 719 |
| 1020 | 721 |
| 1021 | 723 |
| 1022 | 725 |
| 1023 | 727 |
| 1024 | 729 |
| 1025 | 4001 |
| 1026 | 3874 |
| 1027 | 3749 |
| 1028 | 3366 |
| 1029 | 3626 |
| 1030 | 3368 |
| 1031 | 3370 |
| 1032 | 3372 |
| 1033 | 3505 |
| 1034 | 3374 |
| 1035 | 3376 |
| 1036 | 3378 |
| 1037 | 3380 |
| 1038 | 3382 |
| 1039 | 3384 |
| 1040 | 3386 |
| 1041 | 3387 |
| 1042 | 3389 |
| 1043 | 3391 |
| 1044 | 3393 |
| 1045 | 3395 |
| 1046 | 3397 |
| 1047 | 3399 |
| 1048 | 3401 |
| 1049 | 3403 |
| 1050 | 3405 |
| 1051 | 3407 |
| 1052 | 3409 |
| 1053 | 3411 |
| 1054 | 3413 |
| 1055 | 3415 |
| 1056 | 3417 |
| 1057 | 3419 |
| 1058 | 3421 |
| 1059 | 3423 |
| 1060 | 3425 |
| 1061 | 3427 |
| 1062 | 3429 |
| 1063 | 3431 |
| 1064 | 3433 |
| 1065 | 3435 |
| 1066 | 3437 |
| 1067 | 3439 |
| 1068 | 3441 |
| 1069 | 3443 |
| 1070 | 3445 |
| 1071 | 3447 |
| 1072 | 3449 |
| 1073 | 3451 |
| 1074 | 3453 |
| 1075 | 3455 |
| 1076 | 3457 |
| 1077 | 3459 |
| 1078 | 3461 |
| 1079 | 3463 |
| 1080 | 3465 |
| 1081 | 3467 |
| 1082 | 3469 |
| 1083 | 3471 |
| 1084 | 3473 |
| 1085 | 3475 |
| 1086 | 3477 |
| 1087 | 3479 |
| 1088 | 3481 |
| 1089 | 4003 |
| 1090 | 3876 |
| 1091 | 3751 |
| 1092 | 3271 |
| 1093 | 3628 |
| 1094 | 3045 |
| 1095 | 2934 |
| 1096 | 2603 |
| 1097 | 3507 |
| 1098 | 2825 |
| 1099 | 2718 |
| 1100 | 2605 |
| 1101 | 2607 |
| 1102 | 2609 |
| 1103 | 2611 |
| 1104 | 2613 |
| 1105 | 3388 |
| 1106 | 2614 |
| 1107 | 2616 |
| 1108 | 2618 |
| 1109 | 2620 |
| 1110 | 2622 |
| 1111 | 2624 |
| 1112 | 2626 |
| 1113 | 2628 |
| 1114 | 2630 |
| 1115 | 2632 |
| 1116 | 2634 |
| 1117 | 2636 |
| 1118 | 2638 |
| 1119 | 2640 |
| 1120 | 2642 |

TABLE 1-continued

Sequence with the length of M = 4096

| Index | Sequence number |
|---|---|
| 1121 | 3157 |
| 1122 | 2644 |
| 1123 | 2646 |
| 1124 | 2648 |
| 1125 | 2650 |
| 1126 | 2652 |
| 1127 | 2654 |
| 1128 | 2656 |
| 1129 | 2658 |
| 1130 | 2660 |
| 1131 | 2662 |
| 1132 | 2664 |
| 1133 | 2666 |
| 1134 | 2668 |
| 1135 | 2670 |
| 1136 | 2672 |
| 1137 | 2674 |
| 1138 | 2676 |
| 1139 | 2678 |
| 1140 | 2680 |
| 1141 | 2682 |
| 1142 | 2684 |
| 1143 | 2686 |
| 1144 | 2688 |
| 1145 | 2690 |
| 1146 | 2692 |
| 1147 | 2694 |
| 1148 | 2696 |
| 1149 | 2698 |
| 1150 | 2700 |
| 1151 | 2702 |
| 1152 | 2704 |
| 1153 | 4005 |
| 1154 | 3878 |
| 1155 | 3753 |
| 1156 | 3273 |
| 1157 | 3630 |
| 1158 | 3047 |
| 1159 | 2936 |
| 1160 | 2403 |
| 1161 | 3509 |
| 1162 | 2827 |
| 1163 | 2720 |
| 1164 | 2405 |
| 1165 | 2512 |
| 1166 | 2407 |
| 1167 | 2409 |
| 1168 | 2411 |
| 1169 | 3390 |
| 1170 | 2615 |
| 1171 | 2412 |
| 1172 | 2414 |
| 1173 | 2416 |
| 1174 | 2418 |
| 1175 | 2420 |
| 1176 | 2422 |
| 1177 | 2424 |
| 1178 | 2426 |
| 1179 | 2428 |
| 1180 | 2430 |
| 1181 | 2432 |
| 1182 | 2434 |
| 1183 | 2436 |
| 1184 | 2438 |
| 1185 | 3159 |
| 1186 | 2440 |
| 1187 | 2442 |
| 1188 | 2444 |
| 1189 | 2446 |
| 1190 | 2448 |
| 1191 | 2450 |
| 1192 | 2452 |
| 1193 | 2454 |
| 1194 | 2456 |
| 1195 | 2458 |
| 1196 | 2460 |
| 1197 | 2462 |
| 1198 | 2464 |
| 1199 | 2466 |
| 1200 | 2468 |
| 1201 | 2470 |
| 1202 | 2472 |
| 1203 | 2474 |
| 1204 | 2476 |
| 1205 | 2478 |
| 1206 | 2480 |
| 1207 | 2482 |
| 1208 | 2484 |
| 1209 | 2486 |
| 1210 | 2488 |
| 1211 | 2490 |
| 1212 | 2492 |
| 1213 | 2494 |
| 1214 | 2496 |
| 1215 | 2498 |
| 1216 | 2500 |
| 1217 | 4007 |
| 1218 | 3880 |
| 1219 | 3755 |
| 1220 | 3275 |
| 1221 | 3632 |
| 1222 | 3049 |
| 1223 | 2938 |
| 1224 | 2035 |
| 1225 | 3511 |
| 1226 | 2829 |
| 1227 | 2722 |
| 1228 | 1772 |
| 1229 | 2514 |
| 1230 | 1606 |
| 1231 | 1523 |
| 1232 | 1525 |
| 1233 | 3392 |
| 1234 | 2617 |
| 1235 | 2413 |
| 1236 | 1526 |
| 1237 | 2220 |
| 1238 | 1528 |
| 1239 | 1530 |
| 1240 | 1532 |
| 1241 | 1945 |
| 1242 | 1534 |
| 1243 | 1536 |
| 1244 | 1538 |
| 1245 | 1540 |
| 1246 | 1542 |
| 1247 | 1544 |
| 1248 | 1546 |
| 1249 | 3161 |
| 1250 | 2315 |
| 1251 | 2127 |
| 1252 | 1548 |
| 1253 | 1858 |
| 1254 | 1550 |
| 1255 | 1552 |
| 1256 | 1554 |
| 1257 | 1688 |
| 1258 | 1556 |
| 1259 | 1558 |
| 1260 | 1560 |
| 1261 | 1562 |
| 1262 | 1564 |
| 1263 | 1566 |
| 1264 | 1568 |
| 1265 | 1570 |
| 1266 | 1572 |
| 1267 | 1574 |
| 1268 | 1576 |

TABLE 1-continued

Sequence with the length of M = 4096

| Index | Sequence number |
|---|---|
| 1269 | 1578 |
| 1270 | 1580 |
| 1271 | 1582 |
| 1272 | 1584 |
| 1273 | 1586 |
| 1274 | 1588 |
| 1275 | 1590 |
| 1276 | 1592 |
| 1277 | 1594 |
| 1278 | 1596 |
| 1279 | 1598 |
| 1280 | 1600 |
| 1281 | 4009 |
| 1282 | 3882 |
| 1283 | 3757 |
| 1284 | 3277 |
| 1285 | 3634 |
| 1286 | 3051 |
| 1287 | 2940 |
| 1288 | 2211 |
| 1289 | 3513 |
| 1290 | 2831 |
| 1291 | 2724 |
| 1292 | 2213 |
| 1293 | 2516 |
| 1294 | 2215 |
| 1295 | 2217 |
| 1296 | 2219 |
| 1297 | 3394 |
| 1298 | 2619 |
| 1299 | 2415 |
| 1300 | 2221 |
| 1301 | 2222 |
| 1302 | 2224 |
| 1303 | 2226 |
| 1304 | 2228 |
| 1305 | 2230 |
| 1306 | 2232 |
| 1307 | 2234 |
| 1308 | 2236 |
| 1309 | 2238 |
| 1310 | 2240 |
| 1311 | 2242 |
| 1312 | 2244 |
| 1313 | 3163 |
| 1314 | 2317 |
| 1315 | 2246 |
| 1316 | 2248 |
| 1317 | 2250 |
| 1318 | 2252 |
| 1319 | 2254 |
| 1320 | 2256 |
| 1321 | 2258 |
| 1322 | 2260 |
| 1323 | 2262 |
| 1324 | 2264 |
| 1325 | 2266 |
| 1326 | 2268 |
| 1327 | 2270 |
| 1328 | 2272 |
| 1329 | 2274 |
| 1330 | 2276 |
| 1331 | 2278 |
| 1332 | 2280 |
| 1333 | 2282 |
| 1334 | 2284 |
| 1335 | 2286 |
| 1336 | 2288 |
| 1337 | 2290 |
| 1338 | 2292 |
| 1339 | 2294 |
| 1340 | 2296 |
| 1341 | 2298 |
| 1342 | 2300 |
| 1343 | 2302 |
| 1344 | 2304 |
| 1345 | 4011 |
| 1346 | 3884 |
| 1347 | 3759 |
| 1348 | 3279 |
| 1349 | 3636 |
| 1350 | 3053 |
| 1351 | 2942 |
| 1352 | 2037 |
| 1353 | 3515 |
| 1354 | 2833 |
| 1355 | 2726 |
| 1356 | 1774 |
| 1357 | 2518 |
| 1358 | 1608 |
| 1359 | 1448 |
| 1360 | 1298 |
| 1361 | 3396 |
| 1362 | 2621 |
| 1363 | 2417 |
| 1364 | 1527 |
| 1365 | 2223 |
| 1366 | 1299 |
| 1367 | 1301 |
| 1368 | 1303 |
| 1369 | 1947 |
| 1370 | 1305 |
| 1371 | 1307 |
| 1372 | 1309 |
| 1373 | 1311 |
| 1374 | 1313 |
| 1375 | 1315 |
| 1376 | 1317 |
| 1377 | 3165 |
| 1378 | 2319 |
| 1379 | 2129 |
| 1380 | 1319 |
| 1381 | 1860 |
| 1382 | 1321 |
| 1383 | 1323 |
| 1384 | 1325 |
| 1385 | 1690 |
| 1386 | 1327 |
| 1387 | 1329 |
| 1388 | 1331 |
| 1389 | 1333 |
| 1390 | 1335 |
| 1391 | 1337 |
| 1392 | 1339 |
| 1393 | 1372 |
| 1394 | 1341 |
| 1395 | 1343 |
| 1396 | 1345 |
| 1397 | 1347 |
| 1398 | 1349 |
| 1399 | 1351 |
| 1400 | 1353 |
| 1401 | 1355 |
| 1402 | 1357 |
| 1403 | 1359 |
| 1404 | 1361 |
| 1405 | 1363 |
| 1406 | 1365 |
| 1407 | 1367 |
| 1408 | 1369 |
| 1409 | 4013 |
| 1410 | 3886 |
| 1411 | 3761 |
| 1412 | 3281 |
| 1413 | 3638 |
| 1414 | 3055 |
| 1415 | 2944 |
| 1416 | 2039 |

TABLE 1-continued

Sequence with the length of M = 4096

| Index | Sequence number |
|---|---|
| 1417 | 3517 |
| 1418 | 2835 |
| 1419 | 2728 |
| 1420 | 1776 |
| 1421 | 2520 |
| 1422 | 1610 |
| 1423 | 1450 |
| 1424 | 1158 |
| 1425 | 3398 |
| 1426 | 2623 |
| 1427 | 2419 |
| 1428 | 1529 |
| 1429 | 2225 |
| 1430 | 1300 |
| 1431 | 1159 |
| 1432 | 1161 |
| 1433 | 1949 |
| 1434 | 1163 |
| 1435 | 1165 |
| 1436 | 1167 |
| 1437 | 1169 |
| 1438 | 1171 |
| 1439 | 1173 |
| 1440 | 1175 |
| 1441 | 3167 |
| 1442 | 2321 |
| 1443 | 2131 |
| 1444 | 1228 |
| 1445 | 1862 |
| 1446 | 1177 |
| 1447 | 1179 |
| 1448 | 1181 |
| 1449 | 1692 |
| 1450 | 1183 |
| 1451 | 1185 |
| 1452 | 1187 |
| 1453 | 1189 |
| 1454 | 1191 |
| 1455 | 1193 |
| 1456 | 1195 |
| 1457 | 1374 |
| 1458 | 1197 |
| 1459 | 1199 |
| 1460 | 1201 |
| 1461 | 1203 |
| 1462 | 1205 |
| 1463 | 1207 |
| 1464 | 1209 |
| 1465 | 1211 |
| 1466 | 1213 |
| 1467 | 1215 |
| 1468 | 1217 |
| 1469 | 1219 |
| 1470 | 1221 |
| 1471 | 1223 |
| 1472 | 1225 |
| 1473 | 4015 |
| 1474 | 3888 |
| 1475 | 3763 |
| 1476 | 3283 |
| 1477 | 3640 |
| 1478 | 3057 |
| 1479 | 2946 |
| 1480 | 2041 |
| 1481 | 3519 |
| 1482 | 2837 |
| 1483 | 2730 |
| 1484 | 1778 |
| 1485 | 2522 |
| 1486 | 1612 |
| 1487 | 1452 |
| 1488 | 678 |
| 1489 | 3400 |
| 1490 | 2625 |
| 1491 | 2421 |
| 1492 | 1531 |
| 1493 | 2227 |
| 1494 | 1302 |
| 1495 | 1160 |
| 1496 | 485 |
| 1497 | 1951 |
| 1498 | 1092 |
| 1499 | 964 |
| 1500 | 487 |
| 1501 | 787 |
| 1502 | 489 |
| 1503 | 491 |
| 1504 | 493 |
| 1505 | 3169 |
| 1506 | 2323 |
| 1507 | 2133 |
| 1508 | 1230 |
| 1509 | 1864 |
| 1510 | 1027 |
| 1511 | 903 |
| 1512 | 495 |
| 1513 | 1694 |
| 1514 | 844 |
| 1515 | 732 |
| 1516 | 497 |
| 1517 | 577 |
| 1518 | 499 |
| 1519 | 501 |
| 1520 | 503 |
| 1521 | 1376 |
| 1522 | 626 |
| 1523 | 530 |
| 1524 | 505 |
| 1525 | 507 |
| 1526 | 509 |
| 1527 | 511 |
| 1528 | 513 |
| 1529 | 515 |
| 1530 | 517 |
| 1531 | 519 |
| 1532 | 521 |
| 1533 | 523 |
| 1534 | 525 |
| 1535 | 527 |
| 1536 | 529 |
| 1537 | 4017 |
| 1538 | 3890 |
| 1539 | 3765 |
| 1540 | 3285 |
| 1541 | 3642 |
| 1542 | 3059 |
| 1543 | 2948 |
| 1544 | 2043 |
| 1545 | 3521 |
| 1546 | 2839 |
| 1547 | 2732 |
| 1548 | 1938 |
| 1549 | 2524 |
| 1550 | 1940 |
| 1551 | 1942 |
| 1552 | 1944 |
| 1553 | 3402 |
| 1554 | 2627 |
| 1555 | 2423 |
| 1556 | 1946 |
| 1557 | 2229 |
| 1558 | 1948 |
| 1559 | 1950 |
| 1560 | 1952 |
| 1561 | 1953 |
| 1562 | 1955 |
| 1563 | 1957 |
| 1564 | 1959 |

TABLE 1-continued

Sequence with the length of M = 4096

| Index | Sequence number |
|---|---|
| 1565 | 1961 |
| 1566 | 1963 |
| 1567 | 1965 |
| 1568 | 1967 |
| 1569 | 3171 |
| 1570 | 2325 |
| 1571 | 2135 |
| 1572 | 1969 |
| 1573 | 1971 |
| 1574 | 1973 |
| 1575 | 1975 |
| 1576 | 1977 |
| 1577 | 1979 |
| 1578 | 1981 |
| 1579 | 1983 |
| 1580 | 1985 |
| 1581 | 1987 |
| 1582 | 1989 |
| 1583 | 1991 |
| 1584 | 1993 |
| 1585 | 1995 |
| 1586 | 1997 |
| 1587 | 1999 |
| 1588 | 2001 |
| 1589 | 2003 |
| 1590 | 2005 |
| 1591 | 2007 |
| 1592 | 2009 |
| 1593 | 2011 |
| 1594 | 2013 |
| 1595 | 2015 |
| 1596 | 2017 |
| 1597 | 2019 |
| 1598 | 2021 |
| 1599 | 2023 |
| 1600 | 2025 |
| 1601 | 4019 |
| 1602 | 3892 |
| 1603 | 3767 |
| 1604 | 3287 |
| 1605 | 3644 |
| 1606 | 3061 |
| 1607 | 2950 |
| 1608 | 2045 |
| 1609 | 3523 |
| 1610 | 2841 |
| 1611 | 2734 |
| 1612 | 1780 |
| 1613 | 2526 |
| 1614 | 1614 |
| 1615 | 1454 |
| 1616 | 1091 |
| 1617 | 3404 |
| 1618 | 2629 |
| 1619 | 2425 |
| 1620 | 1533 |
| 1621 | 2231 |
| 1622 | 1304 |
| 1623 | 1162 |
| 1624 | 1093 |
| 1625 | 1954 |
| 1626 | 1094 |
| 1627 | 1096 |
| 1628 | 1098 |
| 1629 | 1100 |
| 1630 | 1102 |
| 1631 | 1104 |
| 1632 | 1106 |
| 1633 | 3173 |
| 1634 | 2327 |
| 1635 | 2137 |
| 1636 | 1232 |
| 1637 | 1866 |
| 1638 | 1108 |
| 1639 | 1110 |
| 1640 | 1112 |
| 1641 | 1696 |
| 1642 | 1114 |
| 1643 | 1116 |
| 1644 | 1118 |
| 1645 | 1120 |
| 1646 | 1122 |
| 1647 | 1124 |
| 1648 | 1126 |
| 1649 | 1378 |
| 1650 | 1128 |
| 1651 | 1130 |
| 1652 | 1132 |
| 1653 | 1134 |
| 1654 | 1136 |
| 1655 | 1138 |
| 1656 | 1140 |
| 1657 | 1142 |
| 1658 | 1144 |
| 1659 | 1146 |
| 1660 | 1148 |
| 1661 | 1150 |
| 1662 | 1152 |
| 1663 | 1154 |
| 1664 | 1156 |
| 1665 | 4021 |
| 1666 | 3894 |
| 1667 | 3769 |
| 1668 | 3289 |
| 1669 | 3646 |
| 1670 | 3063 |
| 1671 | 2952 |
| 1672 | 2047 |
| 1673 | 3525 |
| 1674 | 2843 |
| 1675 | 2736 |
| 1676 | 1782 |
| 1677 | 2528 |
| 1678 | 1616 |
| 1679 | 1456 |
| 1680 | 963 |
| 1681 | 3406 |
| 1682 | 2631 |
| 1683 | 2427 |
| 1684 | 1535 |
| 1685 | 2233 |
| 1686 | 1306 |
| 1687 | 1164 |
| 1688 | 965 |
| 1689 | 1956 |
| 1690 | 1095 |
| 1691 | 966 |
| 1692 | 968 |
| 1693 | 970 |
| 1694 | 972 |
| 1695 | 974 |
| 1696 | 976 |
| 1697 | 3175 |
| 1698 | 2329 |
| 1699 | 2139 |
| 1700 | 1234 |
| 1701 | 1868 |
| 1702 | 1029 |
| 1703 | 978 |
| 1704 | 980 |
| 1705 | 1698 |
| 1706 | 982 |
| 1707 | 984 |
| 1708 | 986 |
| 1709 | 988 |
| 1710 | 990 |
| 1711 | 992 |
| 1712 | 994 |

TABLE 1-continued

Sequence with the length of M = 4096

| Index | Sequence number |
|---|---|
| 1713 | 1380 |
| 1714 | 996 |
| 1715 | 998 |
| 1716 | 1000 |
| 1717 | 1002 |
| 1718 | 1004 |
| 1719 | 1006 |
| 1720 | 1008 |
| 1721 | 1010 |
| 1722 | 1012 |
| 1723 | 1014 |
| 1724 | 1016 |
| 1725 | 1018 |
| 1726 | 1020 |
| 1727 | 1022 |
| 1728 | 1024 |
| 1729 | 4023 |
| 1730 | 3896 |
| 1731 | 3771 |
| 1732 | 3291 |
| 1733 | 3648 |
| 1734 | 3065 |
| 1735 | 2954 |
| 1736 | 2049 |
| 1737 | 3527 |
| 1738 | 2845 |
| 1739 | 2738 |
| 1740 | 1784 |
| 1741 | 2530 |
| 1742 | 1618 |
| 1743 | 1458 |
| 1744 | 680 |
| 1745 | 3408 |
| 1746 | 2633 |
| 1747 | 2429 |
| 1748 | 1537 |
| 1749 | 2235 |
| 1750 | 1308 |
| 1751 | 1166 |
| 1752 | 486 |
| 1753 | 1958 |
| 1754 | 1097 |
| 1755 | 967 |
| 1756 | 401 |
| 1757 | 789 |
| 1758 | 403 |
| 1759 | 405 |
| 1760 | 407 |
| 1761 | 3177 |
| 1762 | 2331 |
| 1763 | 2141 |
| 1764 | 1236 |
| 1765 | 1870 |
| 1766 | 1031 |
| 1767 | 905 |
| 1768 | 409 |
| 1769 | 1700 |
| 1770 | 846 |
| 1771 | 734 |
| 1772 | 411 |
| 1773 | 579 |
| 1774 | 413 |
| 1775 | 415 |
| 1776 | 417 |
| 1777 | 1382 |
| 1778 | 628 |
| 1779 | 532 |
| 1780 | 419 |
| 1781 | 442 |
| 1782 | 421 |
| 1783 | 423 |
| 1784 | 425 |
| 1785 | 427 |
| 1786 | 429 |
| 1787 | 431 |
| 1788 | 433 |
| 1789 | 435 |
| 1790 | 437 |
| 1791 | 439 |
| 1792 | 441 |
| 1793 | 4025 |
| 1794 | 3898 |
| 1795 | 3773 |
| 1796 | 3293 |
| 1797 | 3650 |
| 1798 | 3067 |
| 1799 | 2956 |
| 1800 | 2051 |
| 1801 | 3529 |
| 1802 | 2847 |
| 1803 | 2740 |
| 1804 | 1786 |
| 1805 | 2532 |
| 1806 | 1620 |
| 1807 | 1460 |
| 1808 | 786 |
| 1809 | 3410 |
| 1810 | 2635 |
| 1811 | 2431 |
| 1812 | 1539 |
| 1813 | 2237 |
| 1814 | 1310 |
| 1815 | 1168 |
| 1816 | 788 |
| 1817 | 1960 |
| 1818 | 1099 |
| 1819 | 969 |
| 1820 | 790 |
| 1821 | 791 |
| 1822 | 793 |
| 1823 | 795 |
| 1824 | 797 |
| 1825 | 3179 |
| 1826 | 2333 |
| 1827 | 2143 |
| 1828 | 1238 |
| 1829 | 1872 |
| 1830 | 1033 |
| 1831 | 907 |
| 1832 | 799 |
| 1833 | 1702 |
| 1834 | 848 |
| 1835 | 801 |
| 1836 | 803 |
| 1837 | 805 |
| 1838 | 807 |
| 1839 | 809 |
| 1840 | 811 |
| 1841 | 1384 |
| 1842 | 813 |
| 1843 | 815 |
| 1844 | 817 |
| 1845 | 819 |
| 1846 | 821 |
| 1847 | 823 |
| 1848 | 825 |
| 1849 | 827 |
| 1850 | 829 |
| 1851 | 831 |
| 1852 | 833 |
| 1853 | 835 |
| 1854 | 837 |
| 1855 | 839 |
| 1856 | 841 |
| 1857 | 4027 |
| 1858 | 3900 |
| 1859 | 3775 |
| 1860 | 3295 |

TABLE 1-continued

Sequence with the length of M = 4096

| Index | Sequence number |
|---|---|
| 1861 | 3652 |
| 1862 | 3069 |
| 1863 | 2958 |
| 1864 | 2053 |
| 1865 | 3531 |
| 1866 | 2849 |
| 1867 | 2742 |
| 1868 | 1788 |
| 1869 | 2534 |
| 1870 | 1622 |
| 1871 | 1462 |
| 1872 | 682 |
| 1873 | 3412 |
| 1874 | 2637 |
| 1875 | 2433 |
| 1876 | 1541 |
| 1877 | 2239 |
| 1878 | 1312 |
| 1879 | 1170 |
| 1880 | 488 |
| 1881 | 1962 |
| 1882 | 1101 |
| 1883 | 971 |
| 1884 | 402 |
| 1885 | 792 |
| 1886 | 290 |
| 1887 | 292 |
| 1888 | 294 |
| 1889 | 3181 |
| 1890 | 2335 |
| 1891 | 2145 |
| 1892 | 1240 |
| 1893 | 1874 |
| 1894 | 1035 |
| 1895 | 909 |
| 1896 | 362 |
| 1897 | 1704 |
| 1898 | 850 |
| 1899 | 736 |
| 1900 | 296 |
| 1901 | 581 |
| 1902 | 298 |
| 1903 | 300 |
| 1904 | 302 |
| 1905 | 1386 |
| 1906 | 630 |
| 1907 | 534 |
| 1908 | 304 |
| 1909 | 444 |
| 1910 | 306 |
| 1911 | 308 |
| 1912 | 310 |
| 1913 | 325 |
| 1914 | 312 |
| 1915 | 314 |
| 1916 | 316 |
| 1917 | 318 |
| 1918 | 320 |
| 1919 | 322 |
| 1920 | 324 |
| 1921 | 4029 |
| 1922 | 3902 |
| 1923 | 3777 |
| 1924 | 3297 |
| 1925 | 3654 |
| 1926 | 3071 |
| 1927 | 2960 |
| 1928 | 2055 |
| 1929 | 3533 |
| 1930 | 2851 |
| 1931 | 2744 |
| 1932 | 1790 |
| 1933 | 2536 |
| 1934 | 1624 |
| 1935 | 1464 |
| 1936 | 684 |
| 1937 | 3414 |
| 1938 | 2639 |
| 1939 | 2435 |
| 1940 | 1543 |
| 1941 | 2241 |
| 1942 | 1314 |
| 1943 | 1172 |
| 1944 | 490 |
| 1945 | 1964 |
| 1946 | 1103 |
| 1947 | 973 |
| 1948 | 404 |
| 1949 | 794 |
| 1950 | 291 |
| 1951 | 226 |
| 1952 | 228 |
| 1953 | 3183 |
| 1954 | 2337 |
| 1955 | 2147 |
| 1956 | 1242 |
| 1957 | 1876 |
| 1958 | 1037 |
| 1959 | 911 |
| 1960 | 364 |
| 1961 | 1706 |
| 1962 | 852 |
| 1963 | 738 |
| 1964 | 257 |
| 1965 | 583 |
| 1966 | 230 |
| 1967 | 232 |
| 1968 | 234 |
| 1969 | 1388 |
| 1970 | 632 |
| 1971 | 536 |
| 1972 | 236 |
| 1973 | 446 |
| 1974 | 238 |
| 1975 | 240 |
| 1976 | 242 |
| 1977 | 327 |
| 1978 | 244 |
| 1979 | 246 |
| 1980 | 248 |
| 1981 | 250 |
| 1982 | 252 |
| 1983 | 254 |
| 1984 | 256 |
| 1985 | 4031 |
| 1986 | 3904 |
| 1987 | 3779 |
| 1988 | 3299 |
| 1989 | 3656 |
| 1990 | 3073 |
| 1991 | 2962 |
| 1992 | 2057 |
| 1993 | 3535 |
| 1994 | 2853 |
| 1995 | 2746 |
| 1996 | 1792 |
| 1997 | 2538 |
| 1998 | 1626 |
| 1999 | 1466 |
| 2000 | 686 |
| 2001 | 3416 |
| 2002 | 2641 |
| 2003 | 2437 |
| 2004 | 1545 |
| 2005 | 2243 |
| 2006 | 1316 |
| 2007 | 1174 |
| 2008 | 492 |

TABLE 1-continued

Sequence with the length of M = 4096

| Index | Sequence number |
|---|---|
| 2009 | 1966 |
| 2010 | 1105 |
| 2011 | 975 |
| 2012 | 406 |
| 2013 | 796 |
| 2014 | 293 |
| 2015 | 227 |
| 2016 | 50 |
| 2017 | 3185 |
| 2018 | 2339 |
| 2019 | 2149 |
| 2020 | 1244 |
| 2021 | 1878 |
| 2022 | 1039 |
| 2023 | 913 |
| 2024 | 366 |
| 2025 | 1708 |
| 2026 | 854 |
| 2027 | 740 |
| 2028 | 259 |
| 2029 | 585 |
| 2030 | 197 |
| 2031 | 145 |
| 2032 | 52 |
| 2033 | 1390 |
| 2034 | 634 |
| 2035 | 538 |
| 2036 | 170 |
| 2037 | 448 |
| 2038 | 122 |
| 2039 | 101 |
| 2040 | 54 |
| 2041 | 329 |
| 2042 | 82 |
| 2043 | 65 |
| 2044 | 56 |
| 2045 | 58 |
| 2046 | 60 |
| 2047 | 62 |
| 2048 | 64 |
| 2049 | 4033 |
| 2050 | 3906 |
| 2051 | 3781 |
| 2052 | 3301 |
| 2053 | 3658 |
| 2054 | 3138 |
| 2055 | 3140 |
| 2056 | 3142 |
| 2057 | 3537 |
| 2058 | 3144 |
| 2059 | 3146 |
| 2060 | 3148 |
| 2061 | 3150 |
| 2062 | 3152 |
| 2063 | 3154 |
| 2064 | 3156 |
| 2065 | 3418 |
| 2066 | 3158 |
| 2067 | 3160 |
| 2068 | 3162 |
| 2069 | 3164 |
| 2070 | 3166 |
| 2071 | 3168 |
| 2072 | 3170 |
| 2073 | 3172 |
| 2074 | 3174 |
| 2075 | 3176 |
| 2076 | 3178 |
| 2077 | 3180 |
| 2078 | 3182 |
| 2079 | 3184 |
| 2080 | 3186 |
| 2081 | 3187 |
| 2082 | 3189 |
| 2083 | 3191 |
| 2084 | 3193 |
| 2085 | 3195 |
| 2086 | 3197 |
| 2087 | 3199 |
| 2088 | 3201 |
| 2089 | 3203 |
| 2090 | 3205 |
| 2091 | 3207 |
| 2092 | 3209 |
| 2093 | 3211 |
| 2094 | 3213 |
| 2095 | 3215 |
| 2096 | 3217 |
| 2097 | 3219 |
| 2098 | 3221 |
| 2099 | 3223 |
| 2100 | 3225 |
| 2101 | 3227 |
| 2102 | 3229 |
| 2103 | 3231 |
| 2104 | 3233 |
| 2105 | 3235 |
| 2106 | 3237 |
| 2107 | 3239 |
| 2108 | 3241 |
| 2109 | 3243 |
| 2110 | 3245 |
| 2111 | 3247 |
| 2112 | 3249 |
| 2113 | 4035 |
| 2114 | 3908 |
| 2115 | 3783 |
| 2116 | 3303 |
| 2117 | 3660 |
| 2118 | 3075 |
| 2119 | 2964 |
| 2120 | 2306 |
| 2121 | 3539 |
| 2122 | 2855 |
| 2123 | 2748 |
| 2124 | 2308 |
| 2125 | 2540 |
| 2126 | 2310 |
| 2127 | 2312 |
| 2128 | 2314 |
| 2129 | 3420 |
| 2130 | 2643 |
| 2131 | 2439 |
| 2132 | 2316 |
| 2133 | 2318 |
| 2134 | 2320 |
| 2135 | 2322 |
| 2136 | 2324 |
| 2137 | 2326 |
| 2138 | 2328 |
| 2139 | 2330 |
| 2140 | 2332 |
| 2141 | 2334 |
| 2142 | 2336 |
| 2143 | 2338 |
| 2144 | 2340 |
| 2145 | 3188 |
| 2146 | 2341 |
| 2147 | 2343 |
| 2148 | 2345 |
| 2149 | 2347 |
| 2150 | 2349 |
| 2151 | 2351 |
| 2152 | 2353 |
| 2153 | 2355 |
| 2154 | 2357 |
| 2155 | 2359 |
| 2156 | 2361 |

TABLE 1-continued

Sequence with the length of M = 4096

| Index | Sequence number |
|---|---|
| 2157 | 2363 |
| 2158 | 2365 |
| 2159 | 2367 |
| 2160 | 2369 |
| 2161 | 2371 |
| 2162 | 2373 |
| 2163 | 2375 |
| 2164 | 2377 |
| 2165 | 2379 |
| 2166 | 2381 |
| 2167 | 2383 |
| 2168 | 2385 |
| 2169 | 2387 |
| 2170 | 2389 |
| 2171 | 2391 |
| 2172 | 2393 |
| 2173 | 2395 |
| 2174 | 2397 |
| 2175 | 2399 |
| 2176 | 2401 |
| 2177 | 4037 |
| 2178 | 3910 |
| 2179 | 3785 |
| 2180 | 3305 |
| 2181 | 3662 |
| 2182 | 3077 |
| 2183 | 2966 |
| 2184 | 2118 |
| 2185 | 3541 |
| 2186 | 2857 |
| 2187 | 2750 |
| 2188 | 2120 |
| 2189 | 2542 |
| 2190 | 2122 |
| 2191 | 2124 |
| 2192 | 2126 |
| 2193 | 3422 |
| 2194 | 2645 |
| 2195 | 2441 |
| 2196 | 2128 |
| 2197 | 2245 |
| 2198 | 2130 |
| 2199 | 2132 |
| 2200 | 2134 |
| 2201 | 2136 |
| 2202 | 2138 |
| 2203 | 2140 |
| 2204 | 2142 |
| 2205 | 2144 |
| 2206 | 2146 |
| 2207 | 2148 |
| 2208 | 2150 |
| 2209 | 3190 |
| 2210 | 2342 |
| 2211 | 2151 |
| 2212 | 2153 |
| 2213 | 2155 |
| 2214 | 2157 |
| 2215 | 2159 |
| 2216 | 2161 |
| 2217 | 2163 |
| 2218 | 2165 |
| 2219 | 2167 |
| 2220 | 2169 |
| 2221 | 2171 |
| 2222 | 2173 |
| 2223 | 2175 |
| 2224 | 2177 |
| 2225 | 2179 |
| 2226 | 2181 |
| 2227 | 2183 |
| 2228 | 2185 |
| 2229 | 2187 |
| 2230 | 2189 |
| 2231 | 2191 |
| 2232 | 2193 |
| 2233 | 2195 |
| 2234 | 2197 |
| 2235 | 2199 |
| 2236 | 2201 |
| 2237 | 2203 |
| 2238 | 2205 |
| 2239 | 2207 |
| 2240 | 2209 |
| 2241 | 4039 |
| 2242 | 3912 |
| 2243 | 3787 |
| 2244 | 3307 |
| 2245 | 3664 |
| 2246 | 3079 |
| 2247 | 2968 |
| 2248 | 2059 |
| 2249 | 3543 |
| 2250 | 2859 |
| 2251 | 2752 |
| 2252 | 1794 |
| 2253 | 2544 |
| 2254 | 1628 |
| 2255 | 1468 |
| 2256 | 1227 |
| 2257 | 3424 |
| 2258 | 2647 |
| 2259 | 2443 |
| 2260 | 1547 |
| 2261 | 2247 |
| 2262 | 1318 |
| 2263 | 1229 |
| 2264 | 1231 |
| 2265 | 1968 |
| 2266 | 1233 |
| 2267 | 1235 |
| 2268 | 1237 |
| 2269 | 1239 |
| 2270 | 1241 |
| 2271 | 1243 |
| 2272 | 1245 |
| 2273 | 3192 |
| 2274 | 2344 |
| 2275 | 2152 |
| 2276 | 1246 |
| 2277 | 1880 |
| 2278 | 1248 |
| 2279 | 1250 |
| 2280 | 1252 |
| 2281 | 1710 |
| 2282 | 1254 |
| 2283 | 1256 |
| 2284 | 1258 |
| 2285 | 1260 |
| 2286 | 1262 |
| 2287 | 1264 |
| 2288 | 1266 |
| 2289 | 1392 |
| 2290 | 1268 |
| 2291 | 1270 |
| 2292 | 1272 |
| 2293 | 1274 |
| 2294 | 1276 |
| 2295 | 1278 |
| 2296 | 1280 |
| 2297 | 1282 |
| 2298 | 1284 |
| 2299 | 1286 |
| 2300 | 1288 |
| 2301 | 1290 |
| 2302 | 1292 |
| 2303 | 1294 |
| 2304 | 1296 |

TABLE 1-continued

Sequence with the length of M = 4096

| Index | Sequence number |
|---|---|
| 2305 | 4041 |
| 2306 | 3914 |
| 2307 | 3789 |
| 2308 | 3309 |
| 2309 | 3666 |
| 2310 | 3081 |
| 2311 | 2970 |
| 2312 | 2061 |
| 2313 | 3545 |
| 2314 | 2861 |
| 2315 | 2754 |
| 2316 | 1851 |
| 2317 | 2546 |
| 2318 | 1853 |
| 2319 | 1855 |
| 2320 | 1857 |
| 2321 | 3426 |
| 2322 | 2649 |
| 2323 | 2445 |
| 2324 | 1859 |
| 2325 | 2249 |
| 2326 | 1861 |
| 2327 | 1863 |
| 2328 | 1865 |
| 2329 | 1970 |
| 2330 | 1867 |
| 2331 | 1869 |
| 2332 | 1871 |
| 2333 | 1873 |
| 2334 | 1875 |
| 2335 | 1877 |
| 2336 | 1879 |
| 2337 | 3194 |
| 2338 | 2346 |
| 2339 | 2154 |
| 2340 | 1881 |
| 2341 | 1882 |
| 2342 | 1884 |
| 2343 | 1886 |
| 2344 | 1888 |
| 2345 | 1890 |
| 2346 | 1892 |
| 2347 | 1894 |
| 2348 | 1896 |
| 2349 | 1898 |
| 2350 | 1900 |
| 2351 | 1902 |
| 2352 | 1904 |
| 2353 | 1906 |
| 2354 | 1908 |
| 2355 | 1910 |
| 2356 | 1912 |
| 2357 | 1914 |
| 2358 | 1916 |
| 2359 | 1918 |
| 2360 | 1920 |
| 2361 | 1922 |
| 2362 | 1924 |
| 2363 | 1926 |
| 2364 | 1928 |
| 2365 | 1930 |
| 2366 | 1932 |
| 2367 | 1934 |
| 2368 | 1936 |
| 2369 | 4043 |
| 2370 | 3916 |
| 2371 | 3791 |
| 2372 | 3311 |
| 2373 | 3668 |
| 2374 | 3083 |
| 2375 | 2972 |
| 2376 | 2063 |
| 2377 | 3547 |
| 2378 | 2863 |
| 2379 | 2756 |
| 2380 | 1796 |
| 2381 | 2548 |
| 2382 | 1630 |
| 2383 | 1470 |
| 2384 | 1026 |
| 2385 | 3428 |
| 2386 | 2651 |
| 2387 | 2447 |
| 2388 | 1549 |
| 2389 | 2251 |
| 2390 | 1320 |
| 2391 | 1176 |
| 2392 | 1028 |
| 2393 | 1972 |
| 2394 | 1107 |
| 2395 | 1030 |
| 2396 | 1032 |
| 2397 | 1034 |
| 2398 | 1036 |
| 2399 | 1038 |
| 2400 | 1040 |
| 2401 | 3196 |
| 2402 | 2348 |
| 2403 | 2156 |
| 2404 | 1247 |
| 2405 | 1883 |
| 2406 | 1041 |
| 2407 | 1043 |
| 2408 | 1045 |
| 2409 | 1712 |
| 2410 | 1047 |
| 2411 | 1049 |
| 2412 | 1051 |
| 2413 | 1053 |
| 2414 | 1055 |
| 2415 | 1057 |
| 2416 | 1059 |
| 2417 | 1394 |
| 2418 | 1061 |
| 2419 | 1063 |
| 2420 | 1065 |
| 2421 | 1067 |
| 2422 | 1069 |
| 2423 | 1071 |
| 2424 | 1073 |
| 2425 | 1075 |
| 2426 | 1077 |
| 2427 | 1079 |
| 2428 | 1081 |
| 2429 | 1083 |
| 2430 | 1085 |
| 2431 | 1087 |
| 2432 | 1089 |
| 2433 | 4045 |
| 2434 | 3918 |
| 2435 | 3793 |
| 2436 | 3313 |
| 2437 | 3670 |
| 2438 | 3085 |
| 2439 | 2974 |
| 2440 | 2065 |
| 2441 | 3549 |
| 2442 | 2865 |
| 2443 | 2758 |
| 2444 | 1798 |
| 2445 | 2550 |
| 2446 | 1632 |
| 2447 | 1472 |
| 2448 | 902 |
| 2449 | 3430 |
| 2450 | 2653 |
| 2451 | 2449 |
| 2452 | 1551 |

TABLE 1-continued

Sequence with the length of M = 4096

| Index | Sequence number |
|---|---|
| 2453 | 2253 |
| 2454 | 1322 |
| 2455 | 1178 |
| 2456 | 904 |
| 2457 | 1974 |
| 2458 | 1109 |
| 2459 | 977 |
| 2460 | 906 |
| 2461 | 908 |
| 2462 | 910 |
| 2463 | 912 |
| 2464 | 914 |
| 2465 | 3198 |
| 2466 | 2350 |
| 2467 | 2158 |
| 2468 | 1249 |
| 2469 | 1885 |
| 2470 | 1042 |
| 2471 | 915 |
| 2472 | 917 |
| 2473 | 1714 |
| 2474 | 919 |
| 2475 | 921 |
| 2476 | 923 |
| 2477 | 925 |
| 2478 | 927 |
| 2479 | 929 |
| 2480 | 931 |
| 2481 | 1396 |
| 2482 | 933 |
| 2483 | 935 |
| 2484 | 937 |
| 2485 | 939 |
| 2486 | 941 |
| 2487 | 943 |
| 2488 | 945 |
| 2489 | 947 |
| 2490 | 949 |
| 2491 | 951 |
| 2492 | 953 |
| 2493 | 955 |
| 2494 | 957 |
| 2495 | 959 |
| 2496 | 961 |
| 2497 | 4047 |
| 2498 | 3920 |
| 2499 | 3795 |
| 2500 | 3315 |
| 2501 | 3672 |
| 2502 | 3087 |
| 2503 | 2976 |
| 2504 | 2067 |
| 2505 | 3551 |
| 2506 | 2867 |
| 2507 | 2760 |
| 2508 | 1800 |
| 2509 | 2552 |
| 2510 | 1634 |
| 2511 | 1474 |
| 2512 | 688 |
| 2513 | 3432 |
| 2514 | 2655 |
| 2515 | 2451 |
| 2516 | 1553 |
| 2517 | 2255 |
| 2518 | 1324 |
| 2519 | 1180 |
| 2520 | 494 |
| 2521 | 1976 |
| 2522 | 1111 |
| 2523 | 979 |
| 2524 | 408 |
| 2525 | 798 |
| 2526 | 363 |
| 2527 | 365 |
| 2528 | 367 |
| 2529 | 3200 |
| 2530 | 2352 |
| 2531 | 2160 |
| 2532 | 1251 |
| 2533 | 1887 |
| 2534 | 1044 |
| 2535 | 916 |
| 2536 | 368 |
| 2537 | 1716 |
| 2538 | 856 |
| 2539 | 742 |
| 2540 | 370 |
| 2541 | 587 |
| 2542 | 372 |
| 2543 | 374 |
| 2544 | 376 |
| 2545 | 1398 |
| 2546 | 636 |
| 2547 | 540 |
| 2548 | 378 |
| 2549 | 450 |
| 2550 | 380 |
| 2551 | 382 |
| 2552 | 384 |
| 2553 | 386 |
| 2554 | 388 |
| 2555 | 390 |
| 2556 | 392 |
| 2557 | 394 |
| 2558 | 396 |
| 2559 | 398 |
| 2560 | 400 |
| 2561 | 4049 |
| 2562 | 3922 |
| 2563 | 3797 |
| 2564 | 3317 |
| 2565 | 3674 |
| 2566 | 3089 |
| 2567 | 2978 |
| 2568 | 2069 |
| 2569 | 3553 |
| 2570 | 2869 |
| 2571 | 2762 |
| 2572 | 1802 |
| 2573 | 2554 |
| 2574 | 1683 |
| 2575 | 1685 |
| 2576 | 1687 |
| 2577 | 3434 |
| 2578 | 2657 |
| 2579 | 2453 |
| 2580 | 1689 |
| 2581 | 2257 |
| 2582 | 1691 |
| 2583 | 1693 |
| 2584 | 1695 |
| 2585 | 1978 |
| 2586 | 1697 |
| 2587 | 1699 |
| 2588 | 1701 |
| 2589 | 1703 |
| 2590 | 1705 |
| 2591 | 1707 |
| 2592 | 1709 |
| 2593 | 3202 |
| 2594 | 2354 |
| 2595 | 2162 |
| 2596 | 1711 |
| 2597 | 1889 |
| 2598 | 1713 |
| 2599 | 1715 |
| 2600 | 1717 |

TABLE 1-continued

Sequence with the length of M = 4096

| Index | Sequence number |
|---|---|
| 2601 | 1718 |
| 2602 | 1720 |
| 2603 | 1722 |
| 2604 | 1724 |
| 2605 | 1726 |
| 2606 | 1728 |
| 2607 | 1730 |
| 2608 | 1732 |
| 2609 | 1734 |
| 2610 | 1736 |
| 2611 | 1738 |
| 2612 | 1740 |
| 2613 | 1742 |
| 2614 | 1744 |
| 2615 | 1746 |
| 2616 | 1748 |
| 2617 | 1750 |
| 2618 | 1752 |
| 2619 | 1754 |
| 2620 | 1756 |
| 2621 | 1758 |
| 2622 | 1760 |
| 2623 | 1762 |
| 2624 | 1764 |
| 2625 | 4051 |
| 2626 | 3924 |
| 2627 | 3799 |
| 2628 | 3319 |
| 2629 | 3676 |
| 2630 | 3091 |
| 2631 | 2980 |
| 2632 | 2071 |
| 2633 | 3555 |
| 2634 | 2871 |
| 2635 | 2764 |
| 2636 | 1804 |
| 2637 | 2556 |
| 2638 | 1636 |
| 2639 | 1476 |
| 2640 | 843 |
| 2641 | 3436 |
| 2642 | 2659 |
| 2643 | 2455 |
| 2644 | 1555 |
| 2645 | 2259 |
| 2646 | 1326 |
| 2647 | 1182 |
| 2648 | 845 |
| 2649 | 1980 |
| 2650 | 1113 |
| 2651 | 981 |
| 2652 | 847 |
| 2653 | 849 |
| 2654 | 851 |
| 2655 | 853 |
| 2656 | 855 |
| 2657 | 3204 |
| 2658 | 2356 |
| 2659 | 2164 |
| 2660 | 1253 |
| 2661 | 1891 |
| 2662 | 1046 |
| 2663 | 918 |
| 2664 | 857 |
| 2665 | 1719 |
| 2666 | 858 |
| 2667 | 860 |
| 2668 | 862 |
| 2669 | 864 |
| 2670 | 866 |
| 2671 | 868 |
| 2672 | 870 |
| 2673 | 1400 |
| 2674 | 872 |
| 2675 | 874 |
| 2676 | 876 |
| 2677 | 878 |
| 2678 | 880 |
| 2679 | 882 |
| 2680 | 884 |
| 2681 | 886 |
| 2682 | 888 |
| 2683 | 890 |
| 2684 | 892 |
| 2685 | 894 |
| 2686 | 896 |
| 2687 | 898 |
| 2688 | 900 |
| 2689 | 4053 |
| 2690 | 3926 |
| 2691 | 3801 |
| 2692 | 3321 |
| 2693 | 3678 |
| 2694 | 3093 |
| 2695 | 2982 |
| 2696 | 2073 |
| 2697 | 3557 |
| 2698 | 2873 |
| 2699 | 2766 |
| 2700 | 1806 |
| 2701 | 2558 |
| 2702 | 1638 |
| 2703 | 1478 |
| 2704 | 731 |
| 2705 | 3438 |
| 2706 | 2661 |
| 2707 | 2457 |
| 2708 | 1557 |
| 2709 | 2261 |
| 2710 | 1328 |
| 2711 | 1184 |
| 2712 | 733 |
| 2713 | 1982 |
| 2714 | 1115 |
| 2715 | 983 |
| 2716 | 735 |
| 2717 | 800 |
| 2718 | 737 |
| 2719 | 739 |
| 2720 | 741 |
| 2721 | 3206 |
| 2722 | 2358 |
| 2723 | 2166 |
| 2724 | 1255 |
| 2725 | 1893 |
| 2726 | 1048 |
| 2727 | 920 |
| 2728 | 743 |
| 2729 | 1721 |
| 2730 | 859 |
| 2731 | 744 |
| 2732 | 746 |
| 2733 | 748 |
| 2734 | 750 |
| 2735 | 752 |
| 2736 | 754 |
| 2737 | 1402 |
| 2738 | 756 |
| 2739 | 758 |
| 2740 | 760 |
| 2741 | 762 |
| 2742 | 764 |
| 2743 | 766 |
| 2744 | 768 |
| 2745 | 770 |
| 2746 | 772 |
| 2747 | 774 |
| 2748 | 776 |

TABLE 1-continued

Sequence with the length of M = 4096

| Index | Sequence number |
|---|---|
| 2749 | 778 |
| 2750 | 780 |
| 2751 | 782 |
| 2752 | 784 |
| 2753 | 4055 |
| 2754 | 3928 |
| 2755 | 3803 |
| 2756 | 3323 |
| 2757 | 3680 |
| 2758 | 3095 |
| 2759 | 2984 |
| 2760 | 2075 |
| 2761 | 3559 |
| 2762 | 2875 |
| 2763 | 2768 |
| 2764 | 1808 |
| 2765 | 2560 |
| 2766 | 1640 |
| 2767 | 1480 |
| 2768 | 690 |
| 2769 | 3440 |
| 2770 | 2663 |
| 2771 | 2459 |
| 2772 | 1559 |
| 2773 | 2263 |
| 2774 | 1330 |
| 2775 | 1186 |
| 2776 | 496 |
| 2777 | 1984 |
| 2778 | 1117 |
| 2779 | 985 |
| 2780 | 410 |
| 2781 | 802 |
| 2782 | 295 |
| 2783 | 258 |
| 2784 | 260 |
| 2785 | 3208 |
| 2786 | 2360 |
| 2787 | 2168 |
| 2788 | 1257 |
| 2789 | 1895 |
| 2790 | 1050 |
| 2791 | 922 |
| 2792 | 369 |
| 2793 | 1723 |
| 2794 | 861 |
| 2795 | 745 |
| 2796 | 261 |
| 2797 | 589 |
| 2798 | 263 |
| 2799 | 265 |
| 2800 | 267 |
| 2801 | 1404 |
| 2802 | 638 |
| 2803 | 542 |
| 2804 | 269 |
| 2805 | 452 |
| 2806 | 271 |
| 2807 | 273 |
| 2808 | 275 |
| 2809 | 331 |
| 2810 | 277 |
| 2811 | 279 |
| 2812 | 281 |
| 2813 | 283 |
| 2814 | 285 |
| 2815 | 287 |
| 2816 | 289 |
| 2817 | 4057 |
| 2818 | 3930 |
| 2819 | 3805 |
| 2820 | 3325 |
| 2821 | 3682 |
| 2822 | 3097 |
| 2823 | 2986 |
| 2824 | 2077 |
| 2825 | 3561 |
| 2826 | 2877 |
| 2827 | 2770 |
| 2828 | 1810 |
| 2829 | 2562 |
| 2830 | 1642 |
| 2831 | 1482 |
| 2832 | 692 |
| 2833 | 3442 |
| 2834 | 2665 |
| 2835 | 2461 |
| 2836 | 1561 |
| 2837 | 2265 |
| 2838 | 1332 |
| 2839 | 1188 |
| 2840 | 578 |
| 2841 | 1986 |
| 2842 | 1119 |
| 2843 | 987 |
| 2844 | 580 |
| 2845 | 804 |
| 2846 | 582 |
| 2847 | 584 |
| 2848 | 586 |
| 2849 | 3210 |
| 2850 | 2362 |
| 2851 | 2170 |
| 2852 | 1259 |
| 2853 | 1897 |
| 2854 | 1052 |
| 2855 | 924 |
| 2856 | 588 |
| 2857 | 1725 |
| 2858 | 863 |
| 2859 | 747 |
| 2860 | 590 |
| 2861 | 591 |
| 2862 | 593 |
| 2863 | 595 |
| 2864 | 597 |
| 2865 | 1406 |
| 2866 | 640 |
| 2867 | 599 |
| 2868 | 601 |
| 2869 | 603 |
| 2870 | 605 |
| 2871 | 607 |
| 2872 | 609 |
| 2873 | 611 |
| 2874 | 613 |
| 2875 | 615 |
| 2876 | 617 |
| 2877 | 619 |
| 2878 | 621 |
| 2879 | 623 |
| 2880 | 625 |
| 2881 | 4059 |
| 2882 | 3932 |
| 2883 | 3807 |
| 2884 | 3327 |
| 2885 | 3684 |
| 2886 | 3099 |
| 2887 | 2988 |
| 2888 | 2079 |
| 2889 | 3563 |
| 2890 | 2879 |
| 2891 | 2772 |
| 2892 | 1812 |
| 2893 | 2564 |
| 2894 | 1644 |
| 2895 | 1484 |
| 2896 | 694 |

TABLE 1-continued

Sequence with the length of M = 4096

| Index | Sequence number |
|---|---|
| 2897 | 3444 |
| 2898 | 2667 |
| 2899 | 2463 |
| 2900 | 1563 |
| 2901 | 2267 |
| 2902 | 1334 |
| 2903 | 1190 |
| 2904 | 498 |
| 2905 | 1988 |
| 2906 | 1121 |
| 2907 | 989 |
| 2908 | 412 |
| 2909 | 806 |
| 2910 | 297 |
| 2911 | 229 |
| 2912 | 198 |
| 2913 | 3212 |
| 2914 | 2364 |
| 2915 | 2172 |
| 2916 | 1261 |
| 2917 | 1899 |
| 2918 | 1054 |
| 2919 | 926 |
| 2920 | 371 |
| 2921 | 1727 |
| 2922 | 865 |
| 2923 | 749 |
| 2924 | 262 |
| 2925 | 592 |
| 2926 | 199 |
| 2927 | 201 |
| 2928 | 203 |
| 2929 | 1408 |
| 2930 | 642 |
| 2931 | 544 |
| 2932 | 205 |
| 2933 | 454 |
| 2934 | 207 |
| 2935 | 209 |
| 2936 | 211 |
| 2937 | 333 |
| 2938 | 213 |
| 2939 | 215 |
| 2940 | 217 |
| 2941 | 219 |
| 2942 | 221 |
| 2943 | 223 |
| 2944 | 225 |
| 2945 | 4061 |
| 2946 | 3934 |
| 2947 | 3809 |
| 2948 | 3329 |
| 2949 | 3686 |
| 2950 | 3101 |
| 2951 | 2990 |
| 2952 | 2081 |
| 2953 | 3565 |
| 2954 | 2881 |
| 2955 | 2774 |
| 2956 | 1814 |
| 2957 | 2566 |
| 2958 | 1646 |
| 2959 | 1486 |
| 2960 | 696 |
| 2961 | 3446 |
| 2962 | 2669 |
| 2963 | 2465 |
| 2964 | 1565 |
| 2965 | 2269 |
| 2966 | 1336 |
| 2967 | 1192 |
| 2968 | 500 |
| 2969 | 1990 |
| 2970 | 1123 |
| 2971 | 991 |
| 2972 | 414 |
| 2973 | 808 |
| 2974 | 299 |
| 2975 | 231 |
| 2976 | 146 |
| 2977 | 3214 |
| 2978 | 2366 |
| 2979 | 2174 |
| 2980 | 1263 |
| 2981 | 1901 |
| 2982 | 1056 |
| 2983 | 928 |
| 2984 | 373 |
| 2985 | 1729 |
| 2986 | 867 |
| 2987 | 751 |
| 2988 | 264 |
| 2989 | 594 |
| 2990 | 200 |
| 2991 | 147 |
| 2992 | 149 |
| 2993 | 1410 |
| 2994 | 644 |
| 2995 | 546 |
| 2996 | 172 |
| 2997 | 456 |
| 2998 | 151 |
| 2999 | 153 |
| 3000 | 155 |
| 3001 | 335 |
| 3002 | 157 |
| 3003 | 159 |
| 3004 | 161 |
| 3005 | 163 |
| 3006 | 165 |
| 3007 | 167 |
| 3008 | 169 |
| 3009 | 4063 |
| 3010 | 3936 |
| 3011 | 3811 |
| 3012 | 3331 |
| 3013 | 3688 |
| 3014 | 3103 |
| 3015 | 2992 |
| 3016 | 2083 |
| 3017 | 3567 |
| 3018 | 2883 |
| 3019 | 2776 |
| 3020 | 1816 |
| 3021 | 2568 |
| 3022 | 1648 |
| 3023 | 1488 |
| 3024 | 698 |
| 3025 | 3448 |
| 3026 | 2671 |
| 3027 | 2467 |
| 3028 | 1567 |
| 3029 | 2271 |
| 3030 | 1338 |
| 3031 | 1194 |
| 3032 | 502 |
| 3033 | 1992 |
| 3034 | 1125 |
| 3035 | 993 |
| 3036 | 416 |
| 3037 | 810 |
| 3038 | 301 |
| 3039 | 233 |
| 3040 | 51 |
| 3041 | 3216 |
| 3042 | 2368 |
| 3043 | 2176 |
| 3044 | 1265 |

TABLE 1-continued

Sequence with the length of M = 4096

| Index | Sequence number |
|---|---|
| 3045 | 1903 |
| 3046 | 1058 |
| 3047 | 930 |
| 3048 | 375 |
| 3049 | 1731 |
| 3050 | 869 |
| 3051 | 753 |
| 3052 | 266 |
| 3053 | 596 |
| 3054 | 202 |
| 3055 | 148 |
| 3056 | 26 |
| 3057 | 1412 |
| 3058 | 646 |
| 3059 | 548 |
| 3060 | 174 |
| 3061 | 458 |
| 3062 | 124 |
| 3063 | 103 |
| 3064 | 28 |
| 3065 | 337 |
| 3066 | 84 |
| 3067 | 67 |
| 3068 | 30 |
| 3069 | 37 |
| 3070 | 32 |
| 3071 | 34 |
| 3072 | 36 |
| 3073 | 4065 |
| 3074 | 3938 |
| 3075 | 3813 |
| 3076 | 3333 |
| 3077 | 3690 |
| 3078 | 3105 |
| 3079 | 2994 |
| 3080 | 2085 |
| 3081 | 3569 |
| 3082 | 2885 |
| 3083 | 2778 |
| 3084 | 1818 |
| 3085 | 2570 |
| 3086 | 1650 |
| 3087 | 1490 |
| 3088 | 1371 |
| 3089 | 3450 |
| 3090 | 2673 |
| 3091 | 2469 |
| 3092 | 1569 |
| 3093 | 2273 |
| 3094 | 1373 |
| 3095 | 1375 |
| 3096 | 1377 |
| 3097 | 1994 |
| 3098 | 1379 |
| 3099 | 1381 |
| 3100 | 1383 |
| 3101 | 1385 |
| 3102 | 1387 |
| 3103 | 1389 |
| 3104 | 1391 |
| 3105 | 3218 |
| 3106 | 2370 |
| 3107 | 2178 |
| 3108 | 1393 |
| 3109 | 1905 |
| 3110 | 1395 |
| 3111 | 1397 |
| 3112 | 1399 |
| 3113 | 1733 |
| 3114 | 1401 |
| 3115 | 1403 |
| 3116 | 1405 |
| 3117 | 1407 |
| 3118 | 1409 |
| 3119 | 1411 |
| 3120 | 1413 |
| 3121 | 1414 |
| 3122 | 1416 |
| 3123 | 1418 |
| 3124 | 1420 |
| 3125 | 1422 |
| 3126 | 1424 |
| 3127 | 1426 |
| 3128 | 1428 |
| 3129 | 1430 |
| 3130 | 1432 |
| 3131 | 1434 |
| 3132 | 1436 |
| 3133 | 1438 |
| 3134 | 1440 |
| 3135 | 1442 |
| 3136 | 1444 |
| 3137 | 4067 |
| 3138 | 3940 |
| 3139 | 3815 |
| 3140 | 3335 |
| 3141 | 3692 |
| 3142 | 3107 |
| 3143 | 2996 |
| 3144 | 2087 |
| 3145 | 3571 |
| 3146 | 2887 |
| 3147 | 2780 |
| 3148 | 1820 |
| 3149 | 2572 |
| 3150 | 1652 |
| 3151 | 1492 |
| 3152 | 700 |
| 3153 | 3452 |
| 3154 | 2675 |
| 3155 | 2471 |
| 3156 | 1571 |
| 3157 | 2275 |
| 3158 | 1340 |
| 3159 | 1196 |
| 3160 | 627 |
| 3161 | 1996 |
| 3162 | 1127 |
| 3163 | 995 |
| 3164 | 629 |
| 3165 | 812 |
| 3166 | 631 |
| 3167 | 633 |
| 3168 | 635 |
| 3169 | 3220 |
| 3170 | 2372 |
| 3171 | 2180 |
| 3172 | 1267 |
| 3173 | 1907 |
| 3174 | 1060 |
| 3175 | 932 |
| 3176 | 637 |
| 3177 | 1735 |
| 3178 | 871 |
| 3179 | 755 |
| 3180 | 639 |
| 3181 | 641 |
| 3182 | 643 |
| 3183 | 645 |
| 3184 | 647 |
| 3185 | 1415 |
| 3186 | 648 |
| 3187 | 650 |
| 3188 | 652 |
| 3189 | 654 |
| 3190 | 656 |
| 3191 | 658 |
| 3192 | 660 |

TABLE 1-continued

Sequence with the length of M = 4096

| Index | Sequence number |
|---|---|
| 3193 | 662 |
| 3194 | 664 |
| 3195 | 666 |
| 3196 | 668 |
| 3197 | 670 |
| 3198 | 672 |
| 3199 | 674 |
| 3200 | 676 |
| 3201 | 4069 |
| 3202 | 3942 |
| 3203 | 3817 |
| 3204 | 3337 |
| 3205 | 3694 |
| 3206 | 3109 |
| 3207 | 2998 |
| 3208 | 2089 |
| 3209 | 3573 |
| 3210 | 2889 |
| 3211 | 2782 |
| 3212 | 1822 |
| 3213 | 2574 |
| 3214 | 1654 |
| 3215 | 1494 |
| 3216 | 702 |
| 3217 | 3454 |
| 3218 | 2677 |
| 3219 | 2473 |
| 3220 | 1573 |
| 3221 | 2277 |
| 3222 | 1342 |
| 3223 | 1198 |
| 3224 | 531 |
| 3225 | 1998 |
| 3226 | 1129 |
| 3227 | 997 |
| 3228 | 533 |
| 3229 | 814 |
| 3230 | 535 |
| 3231 | 537 |
| 3232 | 539 |
| 3233 | 3222 |
| 3234 | 2374 |
| 3235 | 2182 |
| 3236 | 1269 |
| 3237 | 1909 |
| 3238 | 1062 |
| 3239 | 934 |
| 3240 | 541 |
| 3241 | 1737 |
| 3242 | 873 |
| 3243 | 757 |
| 3244 | 543 |
| 3245 | 598 |
| 3246 | 545 |
| 3247 | 547 |
| 3248 | 549 |
| 3249 | 1417 |
| 3250 | 649 |
| 3251 | 550 |
| 3252 | 552 |
| 3253 | 554 |
| 3254 | 556 |
| 3255 | 558 |
| 3256 | 560 |
| 3257 | 562 |
| 3258 | 564 |
| 3259 | 566 |
| 3260 | 568 |
| 3261 | 570 |
| 3262 | 572 |
| 3263 | 574 |
| 3264 | 576 |
| 3265 | 4071 |
| 3266 | 3944 |
| 3267 | 3819 |
| 3268 | 3339 |
| 3269 | 3696 |
| 3270 | 3111 |
| 3271 | 3000 |
| 3272 | 2091 |
| 3273 | 3575 |
| 3274 | 2891 |
| 3275 | 2784 |
| 3276 | 1824 |
| 3277 | 2576 |
| 3278 | 1656 |
| 3279 | 1496 |
| 3280 | 704 |
| 3281 | 3456 |
| 3282 | 2679 |
| 3283 | 2475 |
| 3284 | 1575 |
| 3285 | 2279 |
| 3286 | 1344 |
| 3287 | 1200 |
| 3288 | 504 |
| 3289 | 2000 |
| 3290 | 1131 |
| 3291 | 999 |
| 3292 | 418 |
| 3293 | 816 |
| 3294 | 303 |
| 3295 | 235 |
| 3296 | 171 |
| 3297 | 3224 |
| 3298 | 2376 |
| 3299 | 2184 |
| 3300 | 1271 |
| 3301 | 1911 |
| 3302 | 1064 |
| 3303 | 936 |
| 3304 | 377 |
| 3305 | 1739 |
| 3306 | 875 |
| 3307 | 759 |
| 3308 | 268 |
| 3309 | 600 |
| 3310 | 204 |
| 3311 | 173 |
| 3312 | 175 |
| 3313 | 1419 |
| 3314 | 651 |
| 3315 | 551 |
| 3316 | 176 |
| 3317 | 460 |
| 3318 | 178 |
| 3319 | 180 |
| 3320 | 182 |
| 3321 | 339 |
| 3322 | 184 |
| 3323 | 186 |
| 3324 | 188 |
| 3325 | 190 |
| 3326 | 192 |
| 3327 | 194 |
| 3328 | 196 |
| 3329 | 4073 |
| 3330 | 3946 |
| 3331 | 3821 |
| 3332 | 3341 |
| 3333 | 3698 |
| 3334 | 3113 |
| 3335 | 3002 |
| 3336 | 2093 |
| 3337 | 3577 |
| 3338 | 2893 |
| 3339 | 2786 |
| 3340 | 1826 |

TABLE 1-continued

Sequence with the length of M = 4096

| Index | Sequence number |
|---|---|
| 3341 | 2578 |
| 3342 | 1658 |
| 3343 | 1498 |
| 3344 | 706 |
| 3345 | 3458 |
| 3346 | 2681 |
| 3347 | 2477 |
| 3348 | 1577 |
| 3349 | 2281 |
| 3350 | 1346 |
| 3351 | 1202 |
| 3352 | 506 |
| 3353 | 2002 |
| 3354 | 1133 |
| 3355 | 1001 |
| 3356 | 443 |
| 3357 | 818 |
| 3358 | 445 |
| 3359 | 447 |
| 3360 | 449 |
| 3361 | 3226 |
| 3362 | 2378 |
| 3363 | 2186 |
| 3364 | 1273 |
| 3365 | 1913 |
| 3366 | 1066 |
| 3367 | 938 |
| 3368 | 451 |
| 3369 | 1741 |
| 3370 | 877 |
| 3371 | 761 |
| 3372 | 453 |
| 3373 | 602 |
| 3374 | 455 |
| 3375 | 457 |
| 3376 | 459 |
| 3377 | 1421 |
| 3378 | 653 |
| 3379 | 553 |
| 3380 | 461 |
| 3381 | 462 |
| 3382 | 464 |
| 3383 | 466 |
| 3384 | 468 |
| 3385 | 470 |
| 3386 | 472 |
| 3387 | 474 |
| 3388 | 476 |
| 3389 | 478 |
| 3390 | 480 |
| 3391 | 482 |
| 3392 | 484 |
| 3393 | 4075 |
| 3394 | 3948 |
| 3395 | 3823 |
| 3396 | 3343 |
| 3397 | 3700 |
| 3398 | 3115 |
| 3399 | 3004 |
| 3400 | 2095 |
| 3401 | 3579 |
| 3402 | 2895 |
| 3403 | 2788 |
| 3404 | 1828 |
| 3405 | 2580 |
| 3406 | 1660 |
| 3407 | 1500 |
| 3408 | 708 |
| 3409 | 3460 |
| 3410 | 2683 |
| 3411 | 2479 |
| 3412 | 1579 |
| 3413 | 2283 |
| 3414 | 1348 |
| 3415 | 1204 |
| 3416 | 508 |
| 3417 | 2004 |
| 3418 | 1135 |
| 3419 | 1003 |
| 3420 | 420 |
| 3421 | 820 |
| 3422 | 305 |
| 3423 | 237 |
| 3424 | 123 |
| 3425 | 3228 |
| 3426 | 2380 |
| 3427 | 2188 |
| 3428 | 1275 |
| 3429 | 1915 |
| 3430 | 1068 |
| 3431 | 940 |
| 3432 | 379 |
| 3433 | 1743 |
| 3434 | 879 |
| 3435 | 763 |
| 3436 | 270 |
| 3437 | 604 |
| 3438 | 206 |
| 3439 | 150 |
| 3440 | 125 |
| 3441 | 1423 |
| 3442 | 655 |
| 3443 | 555 |
| 3444 | 177 |
| 3445 | 463 |
| 3446 | 126 |
| 3447 | 128 |
| 3448 | 130 |
| 3449 | 341 |
| 3450 | 132 |
| 3451 | 134 |
| 3452 | 136 |
| 3453 | 138 |
| 3454 | 140 |
| 3455 | 142 |
| 3456 | 144 |
| 3457 | 4077 |
| 3458 | 3950 |
| 3459 | 3825 |
| 3460 | 3345 |
| 3461 | 3702 |
| 3462 | 3117 |
| 3463 | 3006 |
| 3464 | 2097 |
| 3465 | 3581 |
| 3466 | 2897 |
| 3467 | 2790 |
| 3468 | 1830 |
| 3469 | 2582 |
| 3470 | 1662 |
| 3471 | 1502 |
| 3472 | 710 |
| 3473 | 3462 |
| 3474 | 2685 |
| 3475 | 2481 |
| 3476 | 1581 |
| 3477 | 2285 |
| 3478 | 1350 |
| 3479 | 1206 |
| 3480 | 510 |
| 3481 | 2006 |
| 3482 | 1137 |
| 3483 | 1005 |
| 3484 | 422 |
| 3485 | 822 |
| 3486 | 307 |
| 3487 | 239 |
| 3488 | 102 |

TABLE 1-continued

Sequence with the length of M = 4096

| Index | Sequence number |
|---|---|
| 3489 | 3230 |
| 3490 | 2382 |
| 3491 | 2190 |
| 3492 | 1277 |
| 3493 | 1917 |
| 3494 | 1070 |
| 3495 | 942 |
| 3496 | 381 |
| 3497 | 1745 |
| 3498 | 881 |
| 3499 | 765 |
| 3500 | 272 |
| 3501 | 606 |
| 3502 | 208 |
| 3503 | 152 |
| 3504 | 104 |
| 3505 | 1425 |
| 3506 | 657 |
| 3507 | 557 |
| 3508 | 179 |
| 3509 | 465 |
| 3510 | 127 |
| 3511 | 105 |
| 3512 | 107 |
| 3513 | 343 |
| 3514 | 109 |
| 3515 | 111 |
| 3516 | 113 |
| 3517 | 115 |
| 3518 | 117 |
| 3519 | 119 |
| 3520 | 121 |
| 3521 | 4079 |
| 3522 | 3952 |
| 3523 | 3827 |
| 3524 | 3347 |
| 3525 | 3704 |
| 3526 | 3119 |
| 3527 | 3008 |
| 3528 | 2099 |
| 3529 | 3583 |
| 3530 | 2899 |
| 3531 | 2792 |
| 3532 | 1832 |
| 3533 | 2584 |
| 3534 | 1664 |
| 3535 | 1504 |
| 3536 | 712 |
| 3537 | 3464 |
| 3538 | 2687 |
| 3539 | 2483 |
| 3540 | 1583 |
| 3541 | 2287 |
| 3542 | 1352 |
| 3543 | 1208 |
| 3544 | 512 |
| 3545 | 2008 |
| 3546 | 1139 |
| 3547 | 1007 |
| 3548 | 424 |
| 3549 | 824 |
| 3550 | 309 |
| 3551 | 241 |
| 3552 | 53 |
| 3553 | 3232 |
| 3554 | 2384 |
| 3555 | 2192 |
| 3556 | 1279 |
| 3557 | 1919 |
| 3558 | 1072 |
| 3559 | 944 |
| 3560 | 383 |
| 3561 | 1747 |
| 3562 | 883 |

TABLE 1-continued

Sequence with the length of M = 4096

| Index | Sequence number |
|---|---|
| 3563 | 767 |
| 3564 | 274 |
| 3565 | 608 |
| 3566 | 210 |
| 3567 | 154 |
| 3568 | 27 |
| 3569 | 1427 |
| 3570 | 659 |
| 3571 | 559 |
| 3572 | 181 |
| 3573 | 467 |
| 3574 | 129 |
| 3575 | 106 |
| 3576 | 17 |
| 3577 | 345 |
| 3578 | 86 |
| 3579 | 69 |
| 3580 | 19 |
| 3581 | 39 |
| 3582 | 21 |
| 3583 | 23 |
| 3584 | 25 |
| 3585 | 4081 |
| 3586 | 3954 |
| 3587 | 3829 |
| 3588 | 3349 |
| 3589 | 3706 |
| 3590 | 3121 |
| 3591 | 3010 |
| 3592 | 2101 |
| 3593 | 3585 |
| 3594 | 2901 |
| 3595 | 2794 |
| 3596 | 1834 |
| 3597 | 2586 |
| 3598 | 1666 |
| 3599 | 1506 |
| 3600 | 714 |
| 3601 | 3466 |
| 3602 | 2689 |
| 3603 | 2485 |
| 3604 | 1585 |
| 3605 | 2289 |
| 3606 | 1354 |
| 3607 | 1210 |
| 3608 | 514 |
| 3609 | 2010 |
| 3610 | 1141 |
| 3611 | 1009 |
| 3612 | 426 |
| 3613 | 826 |
| 3614 | 326 |
| 3615 | 328 |
| 3616 | 330 |
| 3617 | 3234 |
| 3618 | 2386 |
| 3619 | 2194 |
| 3620 | 1281 |
| 3621 | 1921 |
| 3622 | 1074 |
| 3623 | 946 |
| 3624 | 385 |
| 3625 | 1749 |
| 3626 | 885 |
| 3627 | 769 |
| 3628 | 332 |
| 3629 | 610 |
| 3630 | 334 |
| 3631 | 336 |
| 3632 | 338 |
| 3633 | 1429 |
| 3634 | 661 |
| 3635 | 561 |
| 3636 | 340 |

TABLE 1-continued

Sequence with the length of M = 4096

| Index | Sequence number |
|---|---|
| 3637 | 469 |
| 3638 | 342 |
| 3639 | 344 |
| 3640 | 346 |
| 3641 | 347 |
| 3642 | 349 |
| 3643 | 351 |
| 3644 | 353 |
| 3645 | 355 |
| 3646 | 357 |
| 3647 | 359 |
| 3648 | 361 |
| 3649 | 4083 |
| 3650 | 3956 |
| 3651 | 3831 |
| 3652 | 3351 |
| 3653 | 3708 |
| 3654 | 3123 |
| 3655 | 3012 |
| 3656 | 2103 |
| 3657 | 3587 |
| 3658 | 2903 |
| 3659 | 2796 |
| 3660 | 1836 |
| 3661 | 2588 |
| 3662 | 1668 |
| 3663 | 1508 |
| 3664 | 716 |
| 3665 | 3468 |
| 3666 | 2691 |
| 3667 | 2487 |
| 3668 | 1587 |
| 3669 | 2291 |
| 3670 | 1356 |
| 3671 | 1212 |
| 3672 | 516 |
| 3673 | 2012 |
| 3674 | 1143 |
| 3675 | 1011 |
| 3676 | 428 |
| 3677 | 828 |
| 3678 | 311 |
| 3679 | 243 |
| 3680 | 83 |
| 3681 | 3236 |
| 3682 | 2388 |
| 3683 | 2196 |
| 3684 | 1283 |
| 3685 | 1923 |
| 3686 | 1076 |
| 3687 | 948 |
| 3688 | 387 |
| 3689 | 1751 |
| 3690 | 887 |
| 3691 | 771 |
| 3692 | 276 |
| 3693 | 612 |
| 3694 | 212 |
| 3695 | 156 |
| 3696 | 85 |
| 3697 | 1431 |
| 3698 | 663 |
| 3699 | 563 |
| 3700 | 183 |
| 3701 | 471 |
| 3702 | 131 |
| 3703 | 108 |
| 3704 | 87 |
| 3705 | 348 |
| 3706 | 88 |
| 3707 | 90 |
| 3708 | 92 |
| 3709 | 94 |
| 3710 | 96 |
| 3711 | 98 |
| 3712 | 100 |
| 3713 | 4085 |
| 3714 | 3958 |
| 3715 | 3833 |
| 3716 | 3353 |
| 3717 | 3710 |
| 3718 | 3125 |
| 3719 | 3014 |
| 3720 | 2105 |
| 3721 | 3589 |
| 3722 | 2905 |
| 3723 | 2798 |
| 3724 | 1838 |
| 3725 | 2590 |
| 3726 | 1670 |
| 3727 | 1510 |
| 3728 | 718 |
| 3729 | 3470 |
| 3730 | 2693 |
| 3731 | 2489 |
| 3732 | 1589 |
| 3733 | 2293 |
| 3734 | 1358 |
| 3735 | 1214 |
| 3736 | 518 |
| 3737 | 2014 |
| 3738 | 1145 |
| 3739 | 1013 |
| 3740 | 430 |
| 3741 | 830 |
| 3742 | 313 |
| 3743 | 245 |
| 3744 | 66 |
| 3745 | 3238 |
| 3746 | 2390 |
| 3747 | 2198 |
| 3748 | 1285 |
| 3749 | 1925 |
| 3750 | 1078 |
| 3751 | 950 |
| 3752 | 389 |
| 3753 | 1753 |
| 3754 | 889 |
| 3755 | 773 |
| 3756 | 278 |
| 3757 | 614 |
| 3758 | 214 |
| 3759 | 158 |
| 3760 | 68 |
| 3761 | 1433 |
| 3762 | 665 |
| 3763 | 565 |
| 3764 | 185 |
| 3765 | 473 |
| 3766 | 133 |
| 3767 | 110 |
| 3768 | 70 |
| 3769 | 350 |
| 3770 | 89 |
| 3771 | 71 |
| 3772 | 73 |
| 3773 | 75 |
| 3774 | 77 |
| 3775 | 79 |
| 3776 | 81 |
| 3777 | 4087 |
| 3778 | 3960 |
| 3779 | 3835 |
| 3780 | 3355 |
| 3781 | 3712 |
| 3782 | 3127 |
| 3783 | 3016 |
| 3784 | 2107 |

TABLE 1-continued

Sequence with the length of M = 4096

| Index | Sequence number |
|---|---|
| 3785 | 3591 |
| 3786 | 2907 |
| 3787 | 2800 |
| 3788 | 1840 |
| 3789 | 2592 |
| 3790 | 1672 |
| 3791 | 1512 |
| 3792 | 720 |
| 3793 | 3472 |
| 3794 | 2695 |
| 3795 | 2491 |
| 3796 | 1591 |
| 3797 | 2295 |
| 3798 | 1360 |
| 3799 | 1216 |
| 3800 | 520 |
| 3801 | 2016 |
| 3802 | 1147 |
| 3803 | 1015 |
| 3804 | 432 |
| 3805 | 832 |
| 3806 | 315 |
| 3807 | 247 |
| 3808 | 55 |
| 3809 | 3240 |
| 3810 | 2392 |
| 3811 | 2200 |
| 3812 | 1287 |
| 3813 | 1927 |
| 3814 | 1080 |
| 3815 | 952 |
| 3816 | 391 |
| 3817 | 1755 |
| 3818 | 891 |
| 3819 | 775 |
| 3820 | 280 |
| 3821 | 616 |
| 3822 | 216 |
| 3823 | 160 |
| 3824 | 29 |
| 3825 | 1435 |
| 3826 | 667 |
| 3827 | 567 |
| 3828 | 187 |
| 3829 | 475 |
| 3830 | 135 |
| 3831 | 112 |
| 3832 | 18 |
| 3833 | 352 |
| 3834 | 91 |
| 3835 | 72 |
| 3836 | 10 |
| 3837 | 41 |
| 3838 | 12 |
| 3839 | 14 |
| 3840 | 16 |
| 3841 | 4089 |
| 3842 | 3962 |
| 3843 | 3837 |
| 3844 | 3357 |
| 3845 | 3714 |
| 3846 | 3129 |
| 3847 | 3018 |
| 3848 | 2109 |
| 3849 | 3593 |
| 3850 | 2909 |
| 3851 | 2802 |
| 3852 | 1842 |
| 3853 | 2594 |
| 3854 | 1674 |
| 3855 | 1514 |
| 3856 | 722 |
| 3857 | 3474 |
| 3858 | 2697 |
| 3859 | 2493 |
| 3860 | 1593 |
| 3861 | 2297 |
| 3862 | 1362 |
| 3863 | 1218 |
| 3864 | 522 |
| 3865 | 2018 |
| 3866 | 1149 |
| 3867 | 1017 |
| 3868 | 434 |
| 3869 | 834 |
| 3870 | 317 |
| 3871 | 249 |
| 3872 | 57 |
| 3873 | 3242 |
| 3874 | 2394 |
| 3875 | 2202 |
| 3876 | 1289 |
| 3877 | 1929 |
| 3878 | 1082 |
| 3879 | 954 |
| 3880 | 393 |
| 3881 | 1757 |
| 3882 | 893 |
| 3883 | 777 |
| 3884 | 282 |
| 3885 | 618 |
| 3886 | 218 |
| 3887 | 162 |
| 3888 | 38 |
| 3889 | 1437 |
| 3890 | 669 |
| 3891 | 569 |
| 3892 | 189 |
| 3893 | 477 |
| 3894 | 137 |
| 3895 | 114 |
| 3896 | 40 |
| 3897 | 354 |
| 3898 | 93 |
| 3899 | 74 |
| 3900 | 42 |
| 3901 | 43 |
| 3902 | 45 |
| 3903 | 47 |
| 3904 | 49 |
| 3905 | 4091 |
| 3906 | 3964 |
| 3907 | 3839 |
| 3908 | 3359 |
| 3909 | 3716 |
| 3910 | 3131 |
| 3911 | 3020 |
| 3912 | 2111 |
| 3913 | 3595 |
| 3914 | 2911 |
| 3915 | 2804 |
| 3916 | 1844 |
| 3917 | 2596 |
| 3918 | 1676 |
| 3919 | 1516 |
| 3920 | 724 |
| 3921 | 3476 |
| 3922 | 2699 |
| 3923 | 2495 |
| 3924 | 1595 |
| 3925 | 2299 |
| 3926 | 1364 |
| 3927 | 1220 |
| 3928 | 524 |
| 3929 | 2020 |
| 3930 | 1151 |
| 3931 | 1019 |
| 3932 | 436 |

TABLE 1-continued

Sequence with the length of M = 4096

| Index | Sequence number |
|---|---|
| 3933 | 836 |
| 3934 | 319 |
| 3935 | 251 |
| 3936 | 59 |
| 3937 | 3244 |
| 3938 | 2396 |
| 3939 | 2204 |
| 3940 | 1291 |
| 3941 | 1931 |
| 3942 | 1084 |
| 3943 | 956 |
| 3944 | 395 |
| 3945 | 1759 |
| 3946 | 895 |
| 3947 | 779 |
| 3948 | 284 |
| 3949 | 620 |
| 3950 | 220 |
| 3951 | 164 |
| 3952 | 31 |
| 3953 | 1439 |
| 3954 | 671 |
| 3955 | 571 |
| 3956 | 191 |
| 3957 | 479 |
| 3958 | 139 |
| 3959 | 116 |
| 3960 | 20 |
| 3961 | 356 |
| 3962 | 95 |
| 3963 | 76 |
| 3964 | 11 |
| 3965 | 44 |
| 3966 | 5 |
| 3967 | 7 |
| 3968 | 9 |
| 3969 | 4093 |
| 3970 | 3966 |
| 3971 | 3841 |
| 3972 | 3361 |
| 3973 | 3718 |
| 3974 | 3133 |
| 3975 | 3022 |
| 3976 | 2113 |
| 3977 | 3597 |
| 3978 | 2913 |
| 3979 | 2806 |
| 3980 | 1846 |
| 3981 | 2598 |
| 3982 | 1678 |
| 3983 | 1518 |
| 3984 | 726 |
| 3985 | 3478 |
| 3986 | 2701 |
| 3987 | 2497 |
| 3988 | 1597 |
| 3989 | 2301 |
| 3990 | 1366 |
| 3991 | 1222 |
| 3992 | 526 |
| 3993 | 2022 |
| 3994 | 1153 |
| 3995 | 1021 |
| 3996 | 438 |
| 3997 | 838 |
| 3998 | 321 |
| 3999 | 253 |
| 4000 | 61 |
| 4001 | 3246 |
| 4002 | 2398 |
| 4003 | 2206 |
| 4004 | 1293 |
| 4005 | 1933 |
| 4006 | 1086 |
| 4007 | 958 |
| 4008 | 397 |
| 4009 | 1761 |
| 4010 | 897 |
| 4011 | 781 |
| 4012 | 286 |
| 4013 | 622 |
| 4014 | 222 |
| 4015 | 166 |
| 4016 | 33 |
| 4017 | 1441 |
| 4018 | 673 |
| 4019 | 573 |
| 4020 | 193 |
| 4021 | 481 |
| 4022 | 141 |
| 4023 | 118 |
| 4024 | 22 |
| 4025 | 358 |
| 4026 | 97 |
| 4027 | 78 |
| 4028 | 13 |
| 4029 | 46 |
| 4030 | 6 |
| 4031 | 2 |
| 4032 | 4 |
| 4033 | 4095 |
| 4034 | 3968 |
| 4035 | 3843 |
| 4036 | 3363 |
| 4037 | 3720 |
| 4038 | 3135 |
| 4039 | 3024 |
| 4040 | 2115 |
| 4041 | 3599 |
| 4042 | 2915 |
| 4043 | 2808 |
| 4044 | 1848 |
| 4045 | 2600 |
| 4046 | 1680 |
| 4047 | 1520 |
| 4048 | 728 |
| 4049 | 3480 |
| 4050 | 2703 |
| 4051 | 2499 |
| 4052 | 1599 |
| 4053 | 2303 |
| 4054 | 1368 |
| 4055 | 1224 |
| 4056 | 528 |
| 4057 | 2024 |
| 4058 | 1155 |
| 4059 | 1023 |
| 4060 | 440 |
| 4061 | 840 |
| 4062 | 323 |
| 4063 | 255 |
| 4064 | 63 |
| 4065 | 3248 |
| 4066 | 2400 |
| 4067 | 2208 |
| 4068 | 1295 |
| 4069 | 1935 |
| 4070 | 1088 |
| 4071 | 960 |
| 4072 | 399 |
| 4073 | 1763 |
| 4074 | 899 |
| 4075 | 783 |
| 4076 | 288 |
| 4077 | 624 |
| 4078 | 224 |
| 4079 | 168 |
| 4080 | 35 |

TABLE 1-continued

Sequence with the length of M = 4096

| Index | Sequence number |
|---|---|
| 4081 | 1443 |
| 4082 | 675 |
| 4083 | 575 |
| 4084 | 195 |
| 4085 | 483 |
| 4086 | 143 |
| 4087 | 120 |
| 4088 | 24 |
| 4089 | 360 |
| 4090 | 99 |
| 4091 | 80 |
| 4092 | 15 |
| 4093 | 48 |
| 4094 | 8 |
| 4095 | 3 |
| 4096 | 1 |

A sequence with a length of an even power of 2 may be constructed by using the foregoing sequence construction method provided in this embodiment, or may be obtained from a longer sequence based on a nested feature (for example, a sequence with a length of 1024 may be obtained from the foregoing sequence with the length of 4096 by reading sequence numbers less than or equal to 1024 in order). The sequence with the length of the even power of 2 constructed by using the foregoing sequence construction method may be the same as or different from the sequence with the length of the even power of 2 obtained from the longer sequence based on the nested feature. For example, as shown in Table 2, an embodiment further provides a sequence with a length of M=1024 constructed by using the foregoing sequence construction method. The sequence may be prestored. It should be noted that the sequence corresponding to M=1024 may be constructed in a manner such as an NR sequence or a PW sequence.

TABLE 2

Sequence with the length of M = 1024

| Index | Sequence number |
|---|---|
| 1 | 962 |
| 2 | 964 |
| 3 | 966 |
| 4 | 968 |
| 5 | 970 |
| 6 | 972 |
| 7 | 974 |
| 8 | 976 |
| 9 | 978 |
| 10 | 980 |
| 11 | 982 |
| 12 | 984 |
| 13 | 986 |
| 14 | 988 |
| 15 | 990 |
| 16 | 992 |
| 17 | 994 |
| 18 | 996 |
| 19 | 998 |
| 20 | 1000 |
| 21 | 1002 |
| 22 | 1004 |
| 23 | 1006 |
| 24 | 1008 |
| 25 | 1010 |
| 26 | 1012 |
| 27 | 1014 |
| 28 | 1016 |
| 29 | 1018 |
| 30 | 1020 |
| 31 | 1022 |
| 32 | 1024 |
| 33 | 963 |
| 34 | 901 |
| 35 | 903 |
| 36 | 905 |
| 37 | 907 |
| 38 | 909 |
| 39 | 911 |
| 40 | 913 |
| 41 | 915 |
| 42 | 917 |
| 43 | 919 |
| 44 | 921 |
| 45 | 923 |
| 46 | 925 |
| 47 | 927 |
| 48 | 929 |
| 49 | 931 |
| 50 | 933 |
| 51 | 935 |
| 52 | 937 |
| 53 | 939 |
| 54 | 941 |
| 55 | 943 |
| 56 | 945 |
| 57 | 947 |
| 58 | 949 |
| 59 | 951 |
| 60 | 953 |
| 61 | 955 |
| 62 | 957 |
| 63 | 959 |
| 64 | 961 |
| 65 | 965 |
| 66 | 902 |
| 67 | 842 |
| 68 | 844 |
| 69 | 846 |
| 70 | 848 |
| 71 | 850 |
| 72 | 852 |
| 73 | 854 |
| 74 | 856 |
| 75 | 858 |
| 76 | 860 |
| 77 | 862 |
| 78 | 864 |
| 79 | 866 |
| 80 | 868 |
| 81 | 870 |
| 82 | 872 |
| 83 | 874 |
| 84 | 876 |
| 85 | 878 |
| 86 | 880 |
| 87 | 882 |
| 88 | 884 |
| 89 | 886 |
| 90 | 888 |
| 91 | 890 |
| 92 | 892 |
| 93 | 894 |
| 94 | 896 |
| 95 | 898 |
| 96 | 900 |
| 97 | 967 |
| 98 | 904 |

TABLE 2-continued

Sequence with the length of M = 1024

| Index | Sequence number |
|---|---|
| 99 | 843 |
| 100 | 626 |
| 101 | 785 |
| 102 | 628 |
| 103 | 630 |
| 104 | 632 |
| 105 | 730 |
| 106 | 634 |
| 107 | 636 |
| 108 | 638 |
| 109 | 640 |
| 110 | 642 |
| 111 | 644 |
| 112 | 646 |
| 113 | 677 |
| 114 | 648 |
| 115 | 650 |
| 116 | 652 |
| 117 | 654 |
| 118 | 656 |
| 119 | 658 |
| 120 | 660 |
| 121 | 662 |
| 122 | 664 |
| 123 | 666 |
| 124 | 668 |
| 125 | 670 |
| 126 | 672 |
| 127 | 674 |
| 128 | 676 |
| 129 | 969 |
| 130 | 906 |
| 131 | 845 |
| 132 | 786 |
| 133 | 787 |
| 134 | 789 |
| 135 | 791 |
| 136 | 793 |
| 137 | 795 |
| 138 | 797 |
| 139 | 799 |
| 140 | 801 |
| 141 | 803 |
| 142 | 805 |
| 143 | 807 |
| 144 | 809 |
| 145 | 811 |
| 146 | 813 |
| 147 | 815 |
| 148 | 817 |
| 149 | 819 |
| 150 | 821 |
| 151 | 823 |
| 152 | 825 |
| 153 | 827 |
| 154 | 829 |
| 155 | 831 |
| 156 | 833 |
| 157 | 835 |
| 158 | 837 |
| 159 | 839 |
| 160 | 841 |
| 161 | 971 |
| 162 | 908 |
| 163 | 847 |
| 164 | 627 |
| 165 | 788 |
| 166 | 577 |
| 167 | 579 |
| 168 | 581 |
| 169 | 732 |
| 170 | 583 |
| 171 | 585 |
| 172 | 587 |

TABLE 2-continued

Sequence with the length of M = 1024

| Index | Sequence number |
|---|---|
| 173 | 589 |
| 174 | 591 |
| 175 | 593 |
| 176 | 595 |
| 177 | 679 |
| 178 | 597 |
| 179 | 599 |
| 180 | 601 |
| 181 | 603 |
| 182 | 605 |
| 183 | 607 |
| 184 | 609 |
| 185 | 611 |
| 186 | 613 |
| 187 | 615 |
| 188 | 617 |
| 189 | 619 |
| 190 | 621 |
| 191 | 623 |
| 192 | 625 |
| 193 | 973 |
| 194 | 910 |
| 195 | 849 |
| 196 | 629 |
| 197 | 790 |
| 198 | 578 |
| 199 | 530 |
| 200 | 532 |
| 201 | 734 |
| 202 | 534 |
| 203 | 536 |
| 204 | 538 |
| 205 | 540 |
| 206 | 542 |
| 207 | 544 |
| 208 | 546 |
| 209 | 681 |
| 210 | 548 |
| 211 | 550 |
| 212 | 552 |
| 213 | 554 |
| 214 | 556 |
| 215 | 558 |
| 216 | 560 |
| 217 | 562 |
| 218 | 564 |
| 219 | 566 |
| 220 | 568 |
| 221 | 570 |
| 222 | 572 |
| 223 | 574 |
| 224 | 576 |
| 225 | 975 |
| 226 | 912 |
| 227 | 851 |
| 228 | 631 |
| 229 | 792 |
| 230 | 580 |
| 231 | 531 |
| 232 | 257 |
| 233 | 736 |
| 234 | 485 |
| 235 | 442 |
| 236 | 259 |
| 237 | 362 |
| 238 | 261 |
| 239 | 263 |
| 240 | 265 |
| 241 | 683 |
| 242 | 401 |
| 243 | 325 |
| 244 | 267 |
| 245 | 290 |
| 246 | 269 |

TABLE 2-continued

Sequence with the length of M = 1024

| Index | Sequence number |
|---|---|
| 247 | 271 |
| 248 | 273 |
| 249 | 275 |
| 250 | 277 |
| 251 | 279 |
| 252 | 281 |
| 253 | 283 |
| 254 | 285 |
| 255 | 287 |
| 256 | 289 |
| 257 | 977 |
| 258 | 914 |
| 259 | 853 |
| 260 | 731 |
| 261 | 794 |
| 262 | 733 |
| 263 | 735 |
| 264 | 737 |
| 265 | 738 |
| 266 | 740 |
| 267 | 742 |
| 268 | 744 |
| 269 | 746 |
| 270 | 748 |
| 271 | 750 |
| 272 | 752 |
| 273 | 754 |
| 274 | 756 |
| 275 | 758 |
| 276 | 760 |
| 277 | 762 |
| 278 | 764 |
| 279 | 766 |
| 280 | 768 |
| 281 | 770 |
| 282 | 772 |
| 283 | 774 |
| 284 | 776 |
| 285 | 778 |
| 286 | 780 |
| 287 | 782 |
| 288 | 784 |
| 289 | 979 |
| 290 | 916 |
| 291 | 855 |
| 292 | 633 |
| 293 | 796 |
| 294 | 582 |
| 295 | 533 |
| 296 | 486 |
| 297 | 739 |
| 298 | 487 |
| 299 | 489 |
| 300 | 491 |
| 301 | 493 |
| 302 | 495 |
| 303 | 497 |
| 304 | 499 |
| 305 | 685 |
| 306 | 501 |
| 307 | 503 |
| 308 | 505 |
| 309 | 507 |
| 310 | 509 |
| 311 | 511 |
| 312 | 513 |
| 313 | 515 |
| 314 | 517 |
| 315 | 519 |
| 316 | 521 |
| 317 | 523 |
| 318 | 525 |
| 319 | 527 |
| 320 | 529 |

TABLE 2-continued

Sequence with the length of M = 1024

| Index | Sequence number |
|---|---|
| 321 | 981 |
| 322 | 918 |
| 323 | 857 |
| 324 | 635 |
| 325 | 798 |
| 326 | 584 |
| 327 | 535 |
| 328 | 443 |
| 329 | 741 |
| 330 | 488 |
| 331 | 444 |
| 332 | 446 |
| 333 | 448 |
| 334 | 450 |
| 335 | 452 |
| 336 | 454 |
| 337 | 687 |
| 338 | 456 |
| 339 | 458 |
| 340 | 460 |
| 341 | 462 |
| 342 | 464 |
| 343 | 466 |
| 344 | 468 |
| 345 | 470 |
| 346 | 472 |
| 347 | 474 |
| 348 | 476 |
| 349 | 478 |
| 350 | 480 |
| 351 | 482 |
| 352 | 484 |
| 353 | 983 |
| 354 | 920 |
| 355 | 859 |
| 356 | 637 |
| 357 | 800 |
| 358 | 586 |
| 359 | 537 |
| 360 | 258 |
| 361 | 743 |
| 362 | 490 |
| 363 | 445 |
| 364 | 197 |
| 365 | 364 |
| 366 | 199 |
| 367 | 201 |
| 368 | 203 |
| 369 | 689 |
| 370 | 403 |
| 371 | 327 |
| 372 | 205 |
| 373 | 292 |
| 374 | 207 |
| 375 | 209 |
| 376 | 211 |
| 377 | 226 |
| 378 | 213 |
| 379 | 215 |
| 380 | 217 |
| 381 | 219 |
| 382 | 221 |
| 383 | 223 |
| 384 | 225 |
| 385 | 985 |
| 386 | 922 |
| 387 | 861 |
| 388 | 639 |
| 389 | 802 |
| 390 | 588 |
| 391 | 539 |
| 392 | 363 |
| 393 | 745 |
| 394 | 492 |

TABLE 2-continued

Sequence with the length of M = 1024

| Index | Sequence number |
|---|---|
| 395 | 447 |
| 396 | 365 |
| 397 | 366 |
| 398 | 368 |
| 399 | 370 |
| 400 | 372 |
| 401 | 691 |
| 402 | 405 |
| 403 | 374 |
| 404 | 376 |
| 405 | 378 |
| 406 | 380 |
| 407 | 382 |
| 408 | 384 |
| 409 | 386 |
| 410 | 388 |
| 411 | 390 |
| 412 | 392 |
| 413 | 394 |
| 414 | 396 |
| 415 | 398 |
| 416 | 400 |
| 417 | 987 |
| 418 | 924 |
| 419 | 863 |
| 420 | 641 |
| 421 | 804 |
| 422 | 590 |
| 423 | 541 |
| 424 | 260 |
| 425 | 747 |
| 426 | 494 |
| 427 | 449 |
| 428 | 198 |
| 429 | 367 |
| 430 | 170 |
| 431 | 172 |
| 432 | 174 |
| 433 | 693 |
| 434 | 407 |
| 435 | 329 |
| 436 | 176 |
| 437 | 294 |
| 438 | 178 |
| 439 | 180 |
| 440 | 182 |
| 441 | 228 |
| 442 | 184 |
| 443 | 186 |
| 444 | 188 |
| 445 | 190 |
| 446 | 192 |
| 447 | 194 |
| 448 | 196 |
| 449 | 989 |
| 450 | 926 |
| 451 | 865 |
| 452 | 643 |
| 453 | 806 |
| 454 | 592 |
| 455 | 543 |
| 456 | 262 |
| 457 | 749 |
| 458 | 496 |
| 459 | 451 |
| 460 | 200 |
| 461 | 369 |
| 462 | 171 |
| 463 | 122 |
| 464 | 124 |
| 465 | 695 |
| 466 | 409 |
| 467 | 331 |
| 468 | 145 |
| 469 | 296 |
| 470 | 126 |
| 471 | 128 |
| 472 | 130 |
| 473 | 230 |
| 474 | 132 |
| 475 | 134 |
| 476 | 136 |
| 477 | 138 |
| 478 | 140 |
| 479 | 142 |
| 480 | 144 |
| 481 | 991 |
| 482 | 928 |
| 483 | 867 |
| 484 | 645 |
| 485 | 808 |
| 486 | 594 |
| 487 | 545 |
| 488 | 264 |
| 489 | 751 |
| 490 | 498 |
| 491 | 453 |
| 492 | 202 |
| 493 | 371 |
| 494 | 173 |
| 495 | 123 |
| 496 | 26 |
| 497 | 697 |
| 498 | 411 |
| 499 | 333 |
| 500 | 147 |
| 501 | 298 |
| 502 | 101 |
| 503 | 82 |
| 504 | 28 |
| 505 | 232 |
| 506 | 65 |
| 507 | 50 |
| 508 | 30 |
| 509 | 37 |
| 510 | 32 |
| 511 | 34 |
| 512 | 36 |
| 513 | 993 |
| 514 | 930 |
| 515 | 869 |
| 516 | 678 |
| 517 | 810 |
| 518 | 680 |
| 519 | 682 |
| 520 | 684 |
| 521 | 753 |
| 522 | 686 |
| 523 | 688 |
| 524 | 690 |
| 525 | 692 |
| 526 | 694 |
| 527 | 696 |
| 528 | 698 |
| 529 | 699 |
| 530 | 701 |
| 531 | 703 |
| 532 | 705 |
| 533 | 707 |
| 534 | 709 |
| 535 | 711 |
| 536 | 713 |
| 537 | 715 |
| 538 | 717 |
| 539 | 719 |
| 540 | 721 |
| 541 | 723 |
| 542 | 725 |

TABLE 2-continued

Sequence with the length of M = 1024

| Index | Sequence number |
|---|---|
| 543 | 727 |
| 544 | 729 |
| 545 | 995 |
| 546 | 932 |
| 547 | 871 |
| 548 | 647 |
| 549 | 812 |
| 550 | 596 |
| 551 | 547 |
| 552 | 402 |
| 553 | 755 |
| 554 | 500 |
| 555 | 455 |
| 556 | 404 |
| 557 | 406 |
| 558 | 408 |
| 559 | 410 |
| 560 | 412 |
| 561 | 700 |
| 562 | 413 |
| 563 | 415 |
| 564 | 417 |
| 565 | 419 |
| 566 | 421 |
| 567 | 423 |
| 568 | 425 |
| 569 | 427 |
| 570 | 429 |
| 571 | 431 |
| 572 | 433 |
| 573 | 435 |
| 574 | 437 |
| 575 | 439 |
| 576 | 441 |
| 577 | 997 |
| 578 | 934 |
| 579 | 873 |
| 580 | 649 |
| 581 | 814 |
| 582 | 598 |
| 583 | 549 |
| 584 | 326 |
| 585 | 757 |
| 586 | 502 |
| 587 | 457 |
| 588 | 328 |
| 589 | 373 |
| 590 | 330 |
| 591 | 332 |
| 592 | 334 |
| 593 | 702 |
| 594 | 414 |
| 595 | 335 |
| 596 | 337 |
| 597 | 339 |
| 598 | 341 |
| 599 | 343 |
| 600 | 345 |
| 601 | 347 |
| 602 | 349 |
| 603 | 351 |
| 604 | 353 |
| 605 | 355 |
| 606 | 357 |
| 607 | 359 |
| 608 | 361 |
| 609 | 999 |
| 610 | 936 |
| 611 | 875 |
| 612 | 651 |
| 613 | 816 |
| 614 | 600 |
| 615 | 551 |
| 616 | 266 |

TABLE 2-continued

Sequence with the length of M = 1024

| Index | Sequence number |
|---|---|
| 617 | 759 |
| 618 | 504 |
| 619 | 459 |
| 620 | 204 |
| 621 | 375 |
| 622 | 175 |
| 623 | 146 |
| 624 | 148 |
| 625 | 704 |
| 626 | 416 |
| 627 | 336 |
| 628 | 149 |
| 629 | 300 |
| 630 | 151 |
| 631 | 153 |
| 632 | 155 |
| 633 | 234 |
| 634 | 157 |
| 635 | 159 |
| 636 | 161 |
| 637 | 163 |
| 638 | 165 |
| 639 | 167 |
| 640 | 169 |
| 641 | 1001 |
| 642 | 938 |
| 643 | 877 |
| 644 | 653 |
| 645 | 818 |
| 646 | 602 |
| 647 | 553 |
| 648 | 291 |
| 649 | 761 |
| 650 | 506 |
| 651 | 461 |
| 652 | 293 |
| 653 | 377 |
| 654 | 295 |
| 655 | 297 |
| 656 | 299 |
| 657 | 706 |
| 658 | 418 |
| 659 | 338 |
| 660 | 301 |
| 661 | 302 |
| 662 | 304 |
| 663 | 306 |
| 664 | 308 |
| 665 | 310 |
| 666 | 312 |
| 667 | 314 |
| 668 | 316 |
| 669 | 318 |
| 670 | 320 |
| 671 | 322 |
| 672 | 324 |
| 673 | 1003 |
| 674 | 940 |
| 675 | 879 |
| 676 | 655 |
| 677 | 820 |
| 678 | 604 |
| 679 | 555 |
| 680 | 268 |
| 681 | 763 |
| 682 | 508 |
| 683 | 463 |
| 684 | 206 |
| 685 | 379 |
| 686 | 177 |
| 687 | 125 |
| 688 | 102 |
| 689 | 708 |
| 690 | 420 |

TABLE 2-continued

Sequence with the length of M = 1024

| Index | Sequence number |
|---|---|
| 691 | 340 |
| 692 | 150 |
| 693 | 303 |
| 694 | 103 |
| 695 | 105 |
| 696 | 107 |
| 697 | 236 |
| 698 | 109 |
| 699 | 111 |
| 700 | 113 |
| 701 | 115 |
| 702 | 117 |
| 703 | 119 |
| 704 | 121 |
| 705 | 1005 |
| 706 | 942 |
| 707 | 881 |
| 708 | 657 |
| 709 | 822 |
| 710 | 606 |
| 711 | 557 |
| 712 | 270 |
| 713 | 765 |
| 714 | 510 |
| 715 | 465 |
| 716 | 208 |
| 717 | 381 |
| 718 | 179 |
| 719 | 127 |
| 720 | 83 |
| 721 | 710 |
| 722 | 422 |
| 723 | 342 |
| 724 | 152 |
| 725 | 305 |
| 726 | 104 |
| 727 | 84 |
| 728 | 86 |
| 729 | 238 |
| 730 | 88 |
| 731 | 90 |
| 732 | 92 |
| 733 | 94 |
| 734 | 96 |
| 735 | 98 |
| 736 | 100 |
| 737 | 1007 |
| 738 | 944 |
| 739 | 883 |
| 740 | 659 |
| 741 | 824 |
| 742 | 608 |
| 743 | 559 |
| 744 | 272 |
| 745 | 767 |
| 746 | 512 |
| 747 | 467 |
| 748 | 210 |
| 749 | 383 |
| 750 | 181 |
| 751 | 129 |
| 752 | 27 |
| 753 | 712 |
| 754 | 424 |
| 755 | 344 |
| 756 | 154 |
| 757 | 307 |
| 758 | 106 |
| 759 | 85 |
| 760 | 17 |
| 761 | 240 |
| 762 | 67 |
| 763 | 52 |
| 764 | 19 |

TABLE 2-continued

Sequence with the length of M = 1024

| Index | Sequence number |
|---|---|
| 765 | 39 |
| 766 | 21 |
| 767 | 23 |
| 768 | 25 |
| 769 | 1009 |
| 770 | 946 |
| 771 | 885 |
| 772 | 661 |
| 773 | 826 |
| 774 | 610 |
| 775 | 561 |
| 776 | 274 |
| 777 | 769 |
| 778 | 514 |
| 779 | 469 |
| 780 | 227 |
| 781 | 385 |
| 782 | 229 |
| 783 | 231 |
| 784 | 233 |
| 785 | 714 |
| 786 | 426 |
| 787 | 346 |
| 788 | 235 |
| 789 | 309 |
| 790 | 237 |
| 791 | 239 |
| 792 | 241 |
| 793 | 242 |
| 794 | 244 |
| 795 | 246 |
| 796 | 248 |
| 797 | 250 |
| 798 | 252 |
| 799 | 254 |
| 800 | 256 |
| 801 | 1011 |
| 802 | 948 |
| 803 | 887 |
| 804 | 663 |
| 805 | 828 |
| 806 | 612 |
| 807 | 563 |
| 808 | 276 |
| 809 | 771 |
| 810 | 516 |
| 811 | 471 |
| 812 | 212 |
| 813 | 387 |
| 814 | 183 |
| 815 | 131 |
| 816 | 66 |
| 817 | 716 |
| 818 | 428 |
| 819 | 348 |
| 820 | 156 |
| 821 | 311 |
| 822 | 108 |
| 823 | 87 |
| 824 | 68 |
| 825 | 243 |
| 826 | 69 |
| 827 | 71 |
| 828 | 73 |
| 829 | 75 |
| 830 | 77 |
| 831 | 79 |
| 832 | 81 |
| 833 | 1013 |
| 834 | 950 |
| 835 | 889 |
| 836 | 665 |
| 837 | 830 |
| 838 | 614 |

TABLE 2-continued

Sequence with the length of M = 1024

| Index | Sequence number |
|---|---|
| 839 | 565 |
| 840 | 278 |
| 841 | 773 |
| 842 | 518 |
| 843 | 473 |
| 844 | 214 |
| 845 | 389 |
| 846 | 185 |
| 847 | 133 |
| 848 | 51 |
| 849 | 718 |
| 850 | 430 |
| 851 | 350 |
| 852 | 158 |
| 853 | 313 |
| 854 | 110 |
| 855 | 89 |
| 856 | 53 |
| 857 | 245 |
| 858 | 70 |
| 859 | 54 |
| 860 | 56 |
| 861 | 58 |
| 862 | 60 |
| 863 | 62 |
| 864 | 64 |
| 865 | 1015 |
| 866 | 952 |
| 867 | 891 |
| 868 | 667 |
| 869 | 832 |
| 870 | 616 |
| 871 | 567 |
| 872 | 280 |
| 873 | 775 |
| 874 | 520 |
| 875 | 475 |
| 876 | 216 |
| 877 | 391 |
| 878 | 187 |
| 879 | 135 |
| 880 | 29 |
| 881 | 720 |
| 882 | 432 |
| 883 | 352 |
| 884 | 160 |
| 885 | 315 |
| 886 | 112 |
| 887 | 91 |
| 888 | 18 |
| 889 | 247 |
| 890 | 72 |
| 891 | 55 |
| 892 | 10 |
| 893 | 41 |
| 894 | 12 |
| 895 | 14 |
| 896 | 16 |
| 897 | 1017 |
| 898 | 954 |
| 899 | 893 |
| 900 | 669 |
| 901 | 834 |
| 902 | 618 |
| 903 | 569 |
| 904 | 282 |
| 905 | 777 |
| 906 | 522 |
| 907 | 477 |
| 908 | 218 |
| 909 | 393 |
| 910 | 189 |
| 911 | 137 |
| 912 | 38 |

TABLE 2-continued

Sequence with the length of M = 1024

| Index | Sequence number |
|---|---|
| 913 | 722 |
| 914 | 434 |
| 915 | 354 |
| 916 | 162 |
| 917 | 317 |
| 918 | 114 |
| 919 | 93 |
| 920 | 40 |
| 921 | 249 |
| 922 | 74 |
| 923 | 57 |
| 924 | 42 |
| 925 | 43 |
| 926 | 45 |
| 927 | 47 |
| 928 | 49 |
| 929 | 1019 |
| 930 | 956 |
| 931 | 895 |
| 932 | 671 |
| 933 | 836 |
| 934 | 620 |
| 935 | 571 |
| 936 | 284 |
| 937 | 779 |
| 938 | 524 |
| 939 | 479 |
| 940 | 220 |
| 941 | 395 |
| 942 | 191 |
| 943 | 139 |
| 944 | 31 |
| 945 | 724 |
| 946 | 436 |
| 947 | 356 |
| 948 | 164 |
| 949 | 319 |
| 950 | 116 |
| 951 | 95 |
| 952 | 20 |
| 953 | 251 |
| 954 | 76 |
| 955 | 59 |
| 956 | 11 |
| 957 | 44 |
| 958 | 5 |
| 959 | 7 |
| 960 | 9 |
| 961 | 1021 |
| 962 | 958 |
| 963 | 897 |
| 964 | 673 |
| 965 | 838 |
| 966 | 622 |
| 967 | 573 |
| 968 | 286 |
| 969 | 781 |
| 970 | 526 |
| 971 | 481 |
| 972 | 222 |
| 973 | 397 |
| 974 | 193 |
| 975 | 141 |
| 976 | 33 |
| 977 | 726 |
| 978 | 438 |
| 979 | 358 |
| 980 | 166 |
| 981 | 321 |
| 982 | 118 |
| 983 | 97 |
| 984 | 22 |
| 985 | 253 |
| 986 | 78 |

TABLE 2-continued

Sequence with the length of M = 1024

| Index | Sequence number |
|---|---|
| 987 | 61 |
| 988 | 13 |
| 989 | 46 |
| 990 | 6 |
| 991 | 2 |
| 992 | 4 |
| 993 | 1023 |
| 994 | 960 |
| 995 | 899 |
| 996 | 675 |
| 997 | 840 |
| 998 | 624 |
| 999 | 575 |
| 1000 | 288 |
| 1001 | 783 |
| 1002 | 528 |
| 1003 | 483 |
| 1004 | 224 |
| 1005 | 399 |
| 1006 | 195 |
| 1007 | 143 |
| 1008 | 35 |
| 1009 | 728 |
| 1010 | 440 |
| 1011 | 360 |
| 1012 | 168 |
| 1013 | 323 |
| 1014 | 120 |
| 1015 | 99 |
| 1016 | 24 |
| 1017 | 255 |
| 1018 | 80 |
| 1019 | 63 |
| 1020 | 15 |
| 1021 | 48 |
| 1022 | 8 |
| 1023 | 3 |
| 1024 | 1 |

Stored sequences have a nested feature. This helps reduce a quantity of required storage units. For example, based on the nested feature, a sequence with a length of M can be used to construct any sequence with a code length less than the length of M. Optionally, a sequence with a length of an odd power of 2 may be read from a longer sequence with a length of an even power of 2 based on the nested feature. For example, during construction of a sequence with a length of 8 ($2^3$), sequence numbers less than or equal to 8 are selected in order from a sequence with a length of M=16 ($2^4$) or a longer sequence with a length of an even power of 2 (for example, M=64, 256, 1024, or 4096), to form the sequence with the length of 8. For example, if the sequence numbers less than or equal to 8 are selected in order from the foregoing sequence with the length of M=4096, a sequence [5 7 6 2 4 8 3 1] can be obtained. According to this method, a sequence with a length of 2048 may be read from a mother code sequence with a length of 4096, and a sequence with a length of 512 may be read from a sequence with a length of 1024. In this embodiment, that the sequence with the length of 2048 is read from the foregoing sequence with the length of 4096 is used as an example for description. Sequence numbers of the sequence with the length of 2048 are shown in Table 3.

TABLE 3

Sequence with the length of 2048

| Index | Sequence number |
|---|---|
| 1 | 2026 |
| 2 | 2028 |
| 3 | 2030 |
| 4 | 2032 |
| 5 | 2034 |
| 6 | 2036 |
| 7 | 2038 |
| 8 | 2040 |
| 9 | 2042 |
| 10 | 2044 |
| 11 | 2046 |
| 12 | 2048 |
| 13 | 2027 |
| 14 | 1765 |
| 15 | 1767 |
| 16 | 1769 |
| 17 | 1771 |
| 18 | 1773 |
| 19 | 1775 |
| 20 | 1777 |
| 21 | 1779 |
| 22 | 1937 |
| 23 | 1781 |
| 24 | 1783 |
| 25 | 1785 |
| 26 | 1787 |
| 27 | 1789 |
| 28 | 1791 |
| 29 | 1793 |
| 30 | 1795 |
| 31 | 1850 |
| 32 | 1797 |
| 33 | 1799 |
| 34 | 1801 |
| 35 | 1803 |
| 36 | 1805 |
| 37 | 1807 |
| 38 | 1809 |
| 39 | 1811 |
| 40 | 1813 |
| 41 | 1815 |
| 42 | 1817 |
| 43 | 1819 |
| 44 | 1821 |
| 45 | 1823 |
| 46 | 1825 |
| 47 | 1827 |
| 48 | 1829 |
| 49 | 1831 |
| 50 | 1833 |
| 51 | 1835 |
| 52 | 1837 |
| 53 | 1839 |
| 54 | 1841 |
| 55 | 1843 |
| 56 | 1845 |
| 57 | 1847 |
| 58 | 1849 |
| 59 | 2029 |
| 60 | 1766 |
| 61 | 1601 |
| 62 | 1603 |
| 63 | 1605 |
| 64 | 1607 |
| 65 | 1609 |
| 66 | 1611 |
| 67 | 1613 |
| 68 | 1939 |
| 69 | 1615 |
| 70 | 1617 |
| 71 | 1619 |
| 72 | 1621 |
| 73 | 1623 |
| 74 | 1625 |
| 75 | 1627 |

TABLE 3-continued

Sequence with the length of 2048

| Index | Sequence number |
|---|---|
| 76 | 1629 |
| 77 | 1852 |
| 78 | 1631 |
| 79 | 1633 |
| 80 | 1635 |
| 81 | 1682 |
| 82 | 1637 |
| 83 | 1639 |
| 84 | 1641 |
| 85 | 1643 |
| 86 | 1645 |
| 87 | 1647 |
| 88 | 1649 |
| 89 | 1651 |
| 90 | 1653 |
| 91 | 1655 |
| 92 | 1657 |
| 93 | 1659 |
| 94 | 1661 |
| 95 | 1663 |
| 96 | 1665 |
| 97 | 1667 |
| 98 | 1669 |
| 99 | 1671 |
| 100 | 1673 |
| 101 | 1675 |
| 102 | 1677 |
| 103 | 1679 |
| 104 | 1681 |
| 105 | 2031 |
| 106 | 1768 |
| 107 | 1602 |
| 108 | 1445 |
| 109 | 1447 |
| 110 | 1522 |
| 111 | 1449 |
| 112 | 1451 |
| 113 | 1453 |
| 114 | 1941 |
| 115 | 1455 |
| 116 | 1457 |
| 117 | 1459 |
| 118 | 1461 |
| 119 | 1463 |
| 120 | 1465 |
| 121 | 1467 |
| 122 | 1469 |
| 123 | 1854 |
| 124 | 1471 |
| 125 | 1473 |
| 126 | 1475 |
| 127 | 1684 |
| 128 | 1477 |
| 129 | 1479 |
| 130 | 1481 |
| 131 | 1483 |
| 132 | 1485 |
| 133 | 1487 |
| 134 | 1489 |
| 135 | 1491 |
| 136 | 1493 |
| 137 | 1495 |
| 138 | 1497 |
| 139 | 1499 |
| 140 | 1501 |
| 141 | 1503 |
| 142 | 1505 |
| 143 | 1507 |
| 144 | 1509 |
| 145 | 1511 |
| 146 | 1513 |
| 147 | 1515 |
| 148 | 1517 |
| 149 | 1519 |
| 150 | 1521 |
| 151 | 2033 |
| 152 | 1770 |
| 153 | 1604 |
| 154 | 1446 |
| 155 | 677 |
| 156 | 1524 |
| 157 | 1297 |
| 158 | 1157 |
| 159 | 679 |
| 160 | 1943 |
| 161 | 1090 |
| 162 | 962 |
| 163 | 681 |
| 164 | 785 |
| 165 | 683 |
| 166 | 685 |
| 167 | 687 |
| 168 | 1226 |
| 169 | 1856 |
| 170 | 1025 |
| 171 | 901 |
| 172 | 689 |
| 173 | 1686 |
| 174 | 842 |
| 175 | 730 |
| 176 | 691 |
| 177 | 693 |
| 178 | 695 |
| 179 | 697 |
| 180 | 699 |
| 181 | 1370 |
| 182 | 701 |
| 183 | 703 |
| 184 | 705 |
| 185 | 707 |
| 186 | 709 |
| 187 | 711 |
| 188 | 713 |
| 189 | 715 |
| 190 | 717 |
| 191 | 719 |
| 192 | 721 |
| 193 | 723 |
| 194 | 725 |
| 195 | 727 |
| 196 | 729 |
| 197 | 2035 |
| 198 | 1772 |
| 199 | 1606 |
| 200 | 1523 |
| 201 | 1525 |
| 202 | 1526 |
| 203 | 1528 |
| 204 | 1530 |
| 205 | 1532 |
| 206 | 1945 |
| 207 | 1534 |
| 208 | 1536 |
| 209 | 1538 |
| 210 | 1540 |
| 211 | 1542 |
| 212 | 1544 |
| 213 | 1546 |
| 214 | 1548 |
| 215 | 1858 |
| 216 | 1550 |
| 217 | 1552 |
| 218 | 1554 |
| 219 | 1688 |
| 220 | 1556 |
| 221 | 1558 |
| 222 | 1560 |
| 223 | 1562 |
| 224 | 1564 |
| 225 | 1566 |

TABLE 3-continued

Sequence with the length of 2048

| Index | Sequence number |
|---|---|
| 226 | 1568 |
| 227 | 1570 |
| 228 | 1572 |
| 229 | 1574 |
| 230 | 1576 |
| 231 | 1578 |
| 232 | 1580 |
| 233 | 1582 |
| 234 | 1584 |
| 235 | 1586 |
| 236 | 1588 |
| 237 | 1590 |
| 238 | 1592 |
| 239 | 1594 |
| 240 | 1596 |
| 241 | 1598 |
| 242 | 1600 |
| 243 | 2037 |
| 244 | 1774 |
| 245 | 1608 |
| 246 | 1448 |
| 247 | 1298 |
| 248 | 1527 |
| 249 | 1299 |
| 250 | 1301 |
| 251 | 1303 |
| 252 | 1947 |
| 253 | 1305 |
| 254 | 1307 |
| 255 | 1309 |
| 256 | 1311 |
| 257 | 1313 |
| 258 | 1315 |
| 259 | 1317 |
| 260 | 1319 |
| 261 | 1860 |
| 262 | 1321 |
| 263 | 1323 |
| 264 | 1325 |
| 265 | 1690 |
| 266 | 1327 |
| 267 | 1329 |
| 268 | 1331 |
| 269 | 1333 |
| 270 | 1335 |
| 271 | 1337 |
| 272 | 1339 |
| 273 | 1372 |
| 274 | 1341 |
| 275 | 1343 |
| 276 | 1345 |
| 277 | 1347 |
| 278 | 1349 |
| 279 | 1351 |
| 280 | 1353 |
| 281 | 1355 |
| 282 | 1357 |
| 283 | 1359 |
| 284 | 1361 |
| 285 | 1363 |
| 286 | 1365 |
| 287 | 1367 |
| 288 | 1369 |
| 289 | 2039 |
| 290 | 1776 |
| 291 | 1610 |
| 292 | 1450 |
| 293 | 1158 |
| 294 | 1529 |
| 295 | 1300 |
| 296 | 1159 |
| 297 | 1161 |
| 298 | 1949 |
| 299 | 1163 |
| 300 | 1165 |
| 301 | 1167 |
| 302 | 1169 |
| 303 | 1171 |
| 304 | 1173 |
| 305 | 1175 |
| 306 | 1228 |
| 307 | 1862 |
| 308 | 1177 |
| 309 | 1179 |
| 310 | 1181 |
| 311 | 1692 |
| 312 | 1183 |
| 313 | 1185 |
| 314 | 1187 |
| 315 | 1189 |
| 316 | 1191 |
| 317 | 1193 |
| 318 | 1195 |
| 319 | 1374 |
| 320 | 1197 |
| 321 | 1199 |
| 322 | 1201 |
| 323 | 1203 |
| 324 | 1205 |
| 325 | 1207 |
| 326 | 1209 |
| 327 | 1211 |
| 328 | 1213 |
| 329 | 1215 |
| 330 | 1217 |
| 331 | 1219 |
| 332 | 1221 |
| 333 | 1223 |
| 334 | 1225 |
| 335 | 2041 |
| 336 | 1778 |
| 337 | 1612 |
| 338 | 1452 |
| 339 | 678 |
| 340 | 1531 |
| 341 | 1302 |
| 342 | 1160 |
| 343 | 485 |
| 344 | 1951 |
| 345 | 1092 |
| 346 | 964 |
| 347 | 487 |
| 348 | 787 |
| 349 | 489 |
| 350 | 491 |
| 351 | 493 |
| 352 | 1230 |
| 353 | 1864 |
| 354 | 1027 |
| 355 | 903 |
| 356 | 495 |
| 357 | 1694 |
| 358 | 844 |
| 359 | 732 |
| 360 | 497 |
| 361 | 577 |
| 362 | 499 |
| 363 | 501 |
| 364 | 503 |
| 365 | 1376 |
| 366 | 626 |
| 367 | 530 |
| 368 | 505 |
| 369 | 507 |
| 370 | 509 |
| 371 | 511 |
| 372 | 513 |
| 373 | 515 |
| 374 | 517 |
| 375 | 519 |

TABLE 3-continued

Sequence with the length of 2048

| Index | Sequence number |
|---|---|
| 376 | 521 |
| 377 | 523 |
| 378 | 525 |
| 379 | 527 |
| 380 | 529 |
| 381 | 2043 |
| 382 | 1938 |
| 383 | 1940 |
| 384 | 1942 |
| 385 | 1944 |
| 386 | 1946 |
| 387 | 1948 |
| 388 | 1950 |
| 389 | 1952 |
| 390 | 1953 |
| 391 | 1955 |
| 392 | 1957 |
| 393 | 1959 |
| 394 | 1961 |
| 395 | 1963 |
| 396 | 1965 |
| 397 | 1967 |
| 398 | 1969 |
| 399 | 1971 |
| 400 | 1973 |
| 401 | 1975 |
| 402 | 1977 |
| 403 | 1979 |
| 404 | 1981 |
| 405 | 1983 |
| 406 | 1985 |
| 407 | 1987 |
| 408 | 1989 |
| 409 | 1991 |
| 410 | 1993 |
| 411 | 1995 |
| 412 | 1997 |
| 413 | 1999 |
| 414 | 2001 |
| 415 | 2003 |
| 416 | 2005 |
| 417 | 2007 |
| 418 | 2009 |
| 419 | 2011 |
| 420 | 2013 |
| 421 | 2015 |
| 422 | 2017 |
| 423 | 2019 |
| 424 | 2021 |
| 425 | 2023 |
| 426 | 2025 |
| 427 | 2045 |
| 428 | 1780 |
| 429 | 1614 |
| 430 | 1454 |
| 431 | 1091 |
| 432 | 1533 |
| 433 | 1304 |
| 434 | 1162 |
| 435 | 1093 |
| 436 | 1954 |
| 437 | 1094 |
| 438 | 1096 |
| 439 | 1098 |
| 440 | 1100 |
| 441 | 1102 |
| 442 | 1104 |
| 443 | 1106 |
| 444 | 1232 |
| 445 | 1866 |
| 446 | 1108 |
| 447 | 1110 |
| 448 | 1112 |
| 449 | 1696 |
| 450 | 1114 |
| 451 | 1116 |
| 452 | 1118 |
| 453 | 1120 |
| 454 | 1122 |
| 455 | 1124 |
| 456 | 1126 |
| 457 | 1378 |
| 458 | 1128 |
| 459 | 1130 |
| 460 | 1132 |
| 461 | 1134 |
| 462 | 1136 |
| 463 | 1138 |
| 464 | 1140 |
| 465 | 1142 |
| 466 | 1144 |
| 467 | 1146 |
| 468 | 1148 |
| 469 | 1150 |
| 470 | 1152 |
| 471 | 1154 |
| 472 | 1156 |
| 473 | 2047 |
| 474 | 1782 |
| 475 | 1616 |
| 476 | 1456 |
| 477 | 963 |
| 478 | 1535 |
| 479 | 1306 |
| 480 | 1164 |
| 481 | 965 |
| 482 | 1956 |
| 483 | 1095 |
| 484 | 966 |
| 485 | 968 |
| 486 | 970 |
| 487 | 972 |
| 488 | 974 |
| 489 | 976 |
| 490 | 1234 |
| 491 | 1868 |
| 492 | 1029 |
| 493 | 978 |
| 494 | 980 |
| 495 | 1698 |
| 496 | 982 |
| 497 | 984 |
| 498 | 986 |
| 499 | 988 |
| 500 | 990 |
| 501 | 992 |
| 502 | 994 |
| 503 | 1380 |
| 504 | 996 |
| 505 | 998 |
| 506 | 1000 |
| 507 | 1002 |
| 508 | 1004 |
| 509 | 1006 |
| 510 | 1008 |
| 511 | 1010 |
| 512 | 1012 |
| 513 | 1014 |
| 514 | 1016 |
| 515 | 1018 |
| 516 | 1020 |
| 517 | 1022 |
| 518 | 1024 |
| 519 | 1784 |
| 520 | 1618 |
| 521 | 1458 |
| 522 | 680 |
| 523 | 1537 |
| 524 | 1308 |
| 525 | 1166 |

TABLE 3-continued

Sequence with the length of 2048

| Index | Sequence number |
|---|---|
| 526 | 486 |
| 527 | 1958 |
| 528 | 1097 |
| 529 | 967 |
| 530 | 401 |
| 531 | 789 |
| 532 | 403 |
| 533 | 405 |
| 534 | 407 |
| 535 | 1236 |
| 536 | 1870 |
| 537 | 1031 |
| 538 | 905 |
| 539 | 409 |
| 540 | 1700 |
| 541 | 846 |
| 542 | 734 |
| 543 | 411 |
| 544 | 579 |
| 545 | 413 |
| 546 | 415 |
| 547 | 417 |
| 548 | 1382 |
| 549 | 628 |
| 550 | 532 |
| 551 | 419 |
| 552 | 442 |
| 553 | 421 |
| 554 | 423 |
| 555 | 425 |
| 556 | 427 |
| 557 | 429 |
| 558 | 431 |
| 559 | 433 |
| 560 | 435 |
| 561 | 437 |
| 562 | 439 |
| 563 | 441 |
| 564 | 1786 |
| 565 | 1620 |
| 566 | 1460 |
| 567 | 786 |
| 568 | 1539 |
| 569 | 1310 |
| 570 | 1168 |
| 571 | 788 |
| 572 | 1960 |
| 573 | 1099 |
| 574 | 969 |
| 575 | 790 |
| 576 | 791 |
| 577 | 793 |
| 578 | 795 |
| 579 | 797 |
| 580 | 1238 |
| 581 | 1872 |
| 582 | 1033 |
| 583 | 907 |
| 584 | 799 |
| 585 | 1702 |
| 586 | 848 |
| 587 | 801 |
| 588 | 803 |
| 589 | 805 |
| 590 | 807 |
| 591 | 809 |
| 592 | 811 |
| 593 | 1384 |
| 594 | 813 |
| 595 | 815 |
| 596 | 817 |
| 597 | 819 |
| 598 | 821 |
| 599 | 823 |
| 600 | 825 |

TABLE 3-continued

Sequence with the length of 2048

| Index | Sequence number |
|---|---|
| 601 | 827 |
| 602 | 829 |
| 603 | 831 |
| 604 | 833 |
| 605 | 835 |
| 606 | 837 |
| 607 | 839 |
| 608 | 841 |
| 609 | 1788 |
| 610 | 1622 |
| 611 | 1462 |
| 612 | 682 |
| 613 | 1541 |
| 614 | 1312 |
| 615 | 1170 |
| 616 | 488 |
| 617 | 1962 |
| 618 | 1101 |
| 619 | 971 |
| 620 | 402 |
| 621 | 792 |
| 622 | 290 |
| 623 | 292 |
| 624 | 294 |
| 625 | 1240 |
| 626 | 1874 |
| 627 | 1035 |
| 628 | 909 |
| 629 | 362 |
| 630 | 1704 |
| 631 | 850 |
| 632 | 736 |
| 633 | 296 |
| 634 | 581 |
| 635 | 298 |
| 636 | 300 |
| 637 | 302 |
| 638 | 1386 |
| 639 | 630 |
| 640 | 534 |
| 641 | 304 |
| 642 | 444 |
| 643 | 306 |
| 644 | 308 |
| 645 | 310 |
| 646 | 325 |
| 647 | 312 |
| 648 | 314 |
| 649 | 316 |
| 650 | 318 |
| 651 | 320 |
| 652 | 322 |
| 653 | 324 |
| 654 | 1790 |
| 655 | 1624 |
| 656 | 1464 |
| 657 | 684 |
| 658 | 1543 |
| 659 | 1314 |
| 660 | 1172 |
| 661 | 490 |
| 662 | 1964 |
| 663 | 1103 |
| 664 | 973 |
| 665 | 404 |
| 666 | 794 |
| 667 | 291 |
| 668 | 226 |
| 669 | 228 |
| 670 | 1242 |
| 671 | 1876 |
| 672 | 1037 |
| 673 | 911 |
| 674 | 364 |
| 675 | 1706 |

TABLE 3-continued

Sequence with the length of 2048

| Index | Sequence number |
|---|---|
| 676 | 852 |
| 677 | 738 |
| 678 | 257 |
| 679 | 583 |
| 680 | 230 |
| 681 | 232 |
| 682 | 234 |
| 683 | 1388 |
| 684 | 632 |
| 685 | 536 |
| 686 | 236 |
| 687 | 446 |
| 688 | 238 |
| 689 | 240 |
| 690 | 242 |
| 691 | 327 |
| 692 | 244 |
| 693 | 246 |
| 694 | 248 |
| 695 | 250 |
| 696 | 252 |
| 697 | 254 |
| 698 | 256 |
| 699 | 1792 |
| 700 | 1626 |
| 701 | 1466 |
| 702 | 686 |
| 703 | 1545 |
| 704 | 1316 |
| 705 | 1174 |
| 706 | 492 |
| 707 | 1966 |
| 708 | 1105 |
| 709 | 975 |
| 710 | 406 |
| 711 | 796 |
| 712 | 293 |
| 713 | 227 |
| 714 | 50 |
| 715 | 1244 |
| 716 | 1878 |
| 717 | 1039 |
| 718 | 913 |
| 719 | 366 |
| 720 | 1708 |
| 721 | 854 |
| 722 | 740 |
| 723 | 259 |
| 724 | 585 |
| 725 | 197 |
| 726 | 145 |
| 727 | 52 |
| 728 | 1390 |
| 729 | 634 |
| 730 | 538 |
| 731 | 170 |
| 732 | 448 |
| 733 | 122 |
| 734 | 101 |
| 735 | 54 |
| 736 | 329 |
| 737 | 82 |
| 738 | 65 |
| 739 | 56 |
| 740 | 58 |
| 741 | 60 |
| 742 | 62 |
| 743 | 64 |
| 744 | 1794 |
| 745 | 1628 |
| 746 | 1468 |
| 747 | 1227 |
| 748 | 1547 |
| 749 | 1318 |
| 750 | 1229 |

TABLE 3-continued

Sequence with the length of 2048

| Index | Sequence number |
|---|---|
| 751 | 1231 |
| 752 | 1968 |
| 753 | 1233 |
| 754 | 1235 |
| 755 | 1237 |
| 756 | 1239 |
| 757 | 1241 |
| 758 | 1243 |
| 759 | 1245 |
| 760 | 1246 |
| 761 | 1880 |
| 762 | 1248 |
| 763 | 1250 |
| 764 | 1252 |
| 765 | 1710 |
| 766 | 1254 |
| 767 | 1256 |
| 768 | 1258 |
| 769 | 1260 |
| 770 | 1262 |
| 771 | 1264 |
| 772 | 1266 |
| 773 | 1392 |
| 774 | 1268 |
| 775 | 1270 |
| 776 | 1272 |
| 777 | 1274 |
| 778 | 1276 |
| 779 | 1278 |
| 780 | 1280 |
| 781 | 1282 |
| 782 | 1284 |
| 783 | 1286 |
| 784 | 1288 |
| 785 | 1290 |
| 786 | 1292 |
| 787 | 1294 |
| 788 | 1296 |
| 789 | 1851 |
| 790 | 1853 |
| 791 | 1855 |
| 792 | 1857 |
| 793 | 1859 |
| 794 | 1861 |
| 795 | 1863 |
| 796 | 1865 |
| 797 | 1970 |
| 798 | 1867 |
| 799 | 1869 |
| 800 | 1871 |
| 801 | 1873 |
| 802 | 1875 |
| 803 | 1877 |
| 804 | 1879 |
| 805 | 1881 |
| 806 | 1882 |
| 807 | 1884 |
| 808 | 1886 |
| 809 | 1888 |
| 810 | 1890 |
| 811 | 1892 |
| 812 | 1894 |
| 813 | 1896 |
| 814 | 1898 |
| 815 | 1900 |
| 816 | 1902 |
| 817 | 1904 |
| 818 | 1906 |
| 819 | 1908 |
| 820 | 1910 |
| 821 | 1912 |
| 822 | 1914 |
| 823 | 1916 |
| 824 | 1918 |
| 825 | 1920 |

TABLE 3-continued

Sequence with the length of 2048

| Index | Sequence number |
|---|---|
| 826 | 1922 |
| 827 | 1924 |
| 828 | 1926 |
| 829 | 1928 |
| 830 | 1930 |
| 831 | 1932 |
| 832 | 1934 |
| 833 | 1936 |
| 834 | 1796 |
| 835 | 1630 |
| 836 | 1470 |
| 837 | 1026 |
| 838 | 1549 |
| 839 | 1320 |
| 840 | 1176 |
| 841 | 1028 |
| 842 | 1972 |
| 843 | 1107 |
| 844 | 1030 |
| 845 | 1032 |
| 846 | 1034 |
| 847 | 1036 |
| 848 | 1038 |
| 849 | 1040 |
| 850 | 1247 |
| 851 | 1883 |
| 852 | 1041 |
| 853 | 1043 |
| 854 | 1045 |
| 855 | 1712 |
| 856 | 1047 |
| 857 | 1049 |
| 858 | 1051 |
| 859 | 1053 |
| 860 | 1055 |
| 861 | 1057 |
| 862 | 1059 |
| 863 | 1394 |
| 864 | 1061 |
| 865 | 1063 |
| 866 | 1065 |
| 867 | 1067 |
| 868 | 1069 |
| 869 | 1071 |
| 870 | 1073 |
| 871 | 1075 |
| 872 | 1077 |
| 873 | 1079 |
| 874 | 1081 |
| 875 | 1083 |
| 876 | 1085 |
| 877 | 1087 |
| 878 | 1089 |
| 879 | 1798 |
| 880 | 1632 |
| 881 | 1472 |
| 882 | 902 |
| 883 | 1551 |
| 884 | 1322 |
| 885 | 1178 |
| 886 | 904 |
| 887 | 1974 |
| 888 | 1109 |
| 889 | 977 |
| 890 | 906 |
| 891 | 908 |
| 892 | 910 |
| 893 | 912 |
| 894 | 914 |
| 895 | 1249 |
| 896 | 1885 |
| 897 | 1042 |
| 898 | 915 |
| 899 | 917 |
| 900 | 1714 |
| 901 | 919 |
| 902 | 921 |
| 903 | 923 |
| 904 | 925 |
| 905 | 927 |
| 906 | 929 |
| 907 | 931 |
| 908 | 1396 |
| 909 | 933 |
| 910 | 935 |
| 911 | 937 |
| 912 | 939 |
| 913 | 941 |
| 914 | 943 |
| 915 | 945 |
| 916 | 947 |
| 917 | 949 |
| 918 | 951 |
| 919 | 953 |
| 920 | 955 |
| 921 | 957 |
| 922 | 959 |
| 923 | 961 |
| 924 | 1800 |
| 925 | 1634 |
| 926 | 1474 |
| 927 | 688 |
| 928 | 1553 |
| 929 | 1324 |
| 930 | 1180 |
| 931 | 494 |
| 932 | 1976 |
| 933 | 1111 |
| 934 | 979 |
| 935 | 408 |
| 936 | 798 |
| 937 | 363 |
| 938 | 365 |
| 939 | 367 |
| 940 | 1251 |
| 941 | 1887 |
| 942 | 1044 |
| 943 | 916 |
| 944 | 368 |
| 945 | 1716 |
| 946 | 856 |
| 947 | 742 |
| 948 | 370 |
| 949 | 587 |
| 950 | 372 |
| 951 | 374 |
| 952 | 376 |
| 953 | 1398 |
| 954 | 636 |
| 955 | 540 |
| 956 | 378 |
| 957 | 450 |
| 958 | 380 |
| 959 | 382 |
| 960 | 384 |
| 961 | 386 |
| 962 | 388 |
| 963 | 390 |
| 964 | 392 |
| 965 | 394 |
| 966 | 396 |
| 967 | 398 |
| 968 | 400 |
| 969 | 1802 |
| 970 | 1683 |
| 971 | 1685 |
| 972 | 1687 |
| 973 | 1689 |
| 974 | 1691 |
| 975 | 1693 |

TABLE 3-continued

Sequence with the length of 2048

| Index | Sequence number |
|---|---|
| 976 | 1695 |
| 977 | 1978 |
| 978 | 1697 |
| 979 | 1699 |
| 980 | 1701 |
| 981 | 1703 |
| 982 | 1705 |
| 983 | 1707 |
| 984 | 1709 |
| 985 | 1711 |
| 986 | 1889 |
| 987 | 1713 |
| 988 | 1715 |
| 989 | 1717 |
| 990 | 1718 |
| 991 | 1720 |
| 992 | 1722 |
| 993 | 1724 |
| 994 | 1726 |
| 995 | 1728 |
| 996 | 1730 |
| 997 | 1732 |
| 998 | 1734 |
| 999 | 1736 |
| 1000 | 1738 |
| 1001 | 1740 |
| 1002 | 1742 |
| 1003 | 1744 |
| 1004 | 1746 |
| 1005 | 1748 |
| 1006 | 1750 |
| 1007 | 1752 |
| 1008 | 1754 |
| 1009 | 1756 |
| 1010 | 1758 |
| 1011 | 1760 |
| 1012 | 1762 |
| 1013 | 1764 |
| 1014 | 1804 |
| 1015 | 1636 |
| 1016 | 1476 |
| 1017 | 843 |
| 1018 | 1555 |
| 1019 | 1326 |
| 1020 | 1182 |
| 1021 | 845 |
| 1022 | 1980 |
| 1023 | 1113 |
| 1024 | 981 |
| 1025 | 847 |
| 1026 | 849 |
| 1027 | 851 |
| 1028 | 853 |
| 1029 | 855 |
| 1030 | 1253 |
| 1031 | 1891 |
| 1032 | 1046 |
| 1033 | 918 |
| 1034 | 857 |
| 1035 | 1719 |
| 1036 | 858 |
| 1037 | 860 |
| 1038 | 862 |
| 1039 | 864 |
| 1040 | 866 |
| 1041 | 868 |
| 1042 | 870 |
| 1043 | 1400 |
| 1044 | 872 |
| 1045 | 874 |
| 1046 | 876 |
| 1047 | 878 |
| 1048 | 880 |
| 1049 | 882 |
| 1050 | 884 |
| 1051 | 886 |
| 1052 | 888 |
| 1053 | 890 |
| 1054 | 892 |
| 1055 | 894 |
| 1056 | 896 |
| 1057 | 898 |
| 1058 | 900 |
| 1059 | 1806 |
| 1060 | 1638 |
| 1061 | 1478 |
| 1062 | 731 |
| 1063 | 1557 |
| 1064 | 1328 |
| 1065 | 1184 |
| 1066 | 733 |
| 1067 | 1982 |
| 1068 | 1115 |
| 1069 | 983 |
| 1070 | 735 |
| 1071 | 800 |
| 1072 | 737 |
| 1073 | 739 |
| 1074 | 741 |
| 1075 | 1255 |
| 1076 | 1893 |
| 1077 | 1048 |
| 1078 | 920 |
| 1079 | 743 |
| 1080 | 1721 |
| 1081 | 859 |
| 1082 | 744 |
| 1083 | 746 |
| 1084 | 748 |
| 1085 | 750 |
| 1086 | 752 |
| 1087 | 754 |
| 1088 | 1402 |
| 1089 | 756 |
| 1090 | 758 |
| 1091 | 760 |
| 1092 | 762 |
| 1093 | 764 |
| 1094 | 766 |
| 1095 | 768 |
| 1096 | 770 |
| 1097 | 772 |
| 1098 | 774 |
| 1099 | 776 |
| 1100 | 778 |
| 1101 | 780 |
| 1102 | 782 |
| 1103 | 784 |
| 1104 | 1808 |
| 1105 | 1640 |
| 1106 | 1480 |
| 1107 | 690 |
| 1108 | 1559 |
| 1109 | 1330 |
| 1110 | 1186 |
| 1111 | 496 |
| 1112 | 1984 |
| 1113 | 1117 |
| 1114 | 985 |
| 1115 | 410 |
| 1116 | 802 |
| 1117 | 295 |
| 1118 | 258 |
| 1119 | 260 |
| 1120 | 1257 |
| 1121 | 1895 |
| 1122 | 1050 |
| 1123 | 922 |
| 1124 | 369 |
| 1125 | 1723 |

TABLE 3-continued

Sequence with the length of 2048

| Index | Sequence number |
|---|---|
| 1126 | 861 |
| 1127 | 745 |
| 1128 | 261 |
| 1129 | 589 |
| 1130 | 263 |
| 1131 | 265 |
| 1132 | 267 |
| 1133 | 1404 |
| 1134 | 638 |
| 1135 | 542 |
| 1136 | 269 |
| 1137 | 452 |
| 1138 | 271 |
| 1139 | 273 |
| 1140 | 275 |
| 1141 | 331 |
| 1142 | 277 |
| 1143 | 279 |
| 1144 | 281 |
| 1145 | 283 |
| 1146 | 285 |
| 1147 | 287 |
| 1148 | 289 |
| 1149 | 1810 |
| 1150 | 1642 |
| 1151 | 1482 |
| 1152 | 692 |
| 1153 | 1561 |
| 1154 | 1332 |
| 1155 | 1188 |
| 1156 | 578 |
| 1157 | 1986 |
| 1158 | 1119 |
| 1159 | 987 |
| 1160 | 580 |
| 1161 | 804 |
| 1162 | 582 |
| 1163 | 584 |
| 1164 | 586 |
| 1165 | 1259 |
| 1166 | 1897 |
| 1167 | 1052 |
| 1168 | 924 |
| 1169 | 588 |
| 1170 | 1725 |
| 1171 | 863 |
| 1172 | 747 |
| 1173 | 590 |
| 1174 | 591 |
| 1175 | 593 |
| 1176 | 595 |
| 1177 | 597 |
| 1178 | 1406 |
| 1179 | 640 |
| 1180 | 599 |
| 1181 | 601 |
| 1182 | 603 |
| 1183 | 605 |
| 1184 | 607 |
| 1185 | 609 |
| 1186 | 611 |
| 1187 | 613 |
| 1188 | 615 |
| 1189 | 617 |
| 1190 | 619 |
| 1191 | 621 |
| 1192 | 623 |
| 1193 | 625 |
| 1194 | 1812 |
| 1195 | 1644 |
| 1196 | 1484 |
| 1197 | 694 |
| 1198 | 1563 |
| 1199 | 1334 |
| 1200 | 1190 |

TABLE 3-continued

Sequence with the length of 2048

| Index | Sequence number |
|---|---|
| 1201 | 498 |
| 1202 | 1988 |
| 1203 | 1121 |
| 1204 | 989 |
| 1205 | 412 |
| 1206 | 806 |
| 1207 | 297 |
| 1208 | 229 |
| 1209 | 198 |
| 1210 | 1261 |
| 1211 | 1899 |
| 1212 | 1054 |
| 1213 | 926 |
| 1214 | 371 |
| 1215 | 1727 |
| 1216 | 865 |
| 1217 | 749 |
| 1218 | 262 |
| 1219 | 592 |
| 1220 | 199 |
| 1221 | 201 |
| 1222 | 203 |
| 1223 | 1408 |
| 1224 | 642 |
| 1225 | 544 |
| 1226 | 205 |
| 1227 | 454 |
| 1228 | 207 |
| 1229 | 209 |
| 1230 | 211 |
| 1231 | 333 |
| 1232 | 213 |
| 1233 | 215 |
| 1234 | 217 |
| 1235 | 219 |
| 1236 | 221 |
| 1237 | 223 |
| 1238 | 225 |
| 1239 | 1814 |
| 1240 | 1646 |
| 1241 | 1486 |
| 1242 | 696 |
| 1243 | 1565 |
| 1244 | 1336 |
| 1245 | 1192 |
| 1246 | 500 |
| 1247 | 1990 |
| 1248 | 1123 |
| 1249 | 991 |
| 1250 | 414 |
| 1251 | 808 |
| 1252 | 299 |
| 1253 | 231 |
| 1254 | 146 |
| 1255 | 1263 |
| 1256 | 1901 |
| 1257 | 1056 |
| 1258 | 928 |
| 1259 | 373 |
| 1260 | 1729 |
| 1261 | 867 |
| 1262 | 751 |
| 1263 | 264 |
| 1264 | 594 |
| 1265 | 200 |
| 1266 | 147 |
| 1267 | 149 |
| 1268 | 1410 |
| 1269 | 644 |
| 1270 | 546 |
| 1271 | 172 |
| 1272 | 456 |
| 1273 | 151 |
| 1274 | 153 |
| 1275 | 155 |

TABLE 3-continued

Sequence with the length of 2048

| Index | Sequence number |
|---|---|
| 1276 | 335 |
| 1277 | 157 |
| 1278 | 159 |
| 1279 | 161 |
| 1280 | 163 |
| 1281 | 165 |
| 1282 | 167 |
| 1283 | 169 |
| 1284 | 1816 |
| 1285 | 1648 |
| 1286 | 1488 |
| 1287 | 698 |
| 1288 | 1567 |
| 1289 | 1338 |
| 1290 | 1194 |
| 1291 | 502 |
| 1292 | 1992 |
| 1293 | 1125 |
| 1294 | 993 |
| 1295 | 416 |
| 1296 | 810 |
| 1297 | 301 |
| 1298 | 233 |
| 1299 | 51 |
| 1300 | 1265 |
| 1301 | 1903 |
| 1302 | 1058 |
| 1303 | 930 |
| 1304 | 375 |
| 1305 | 1731 |
| 1306 | 869 |
| 1307 | 753 |
| 1308 | 266 |
| 1309 | 596 |
| 1310 | 202 |
| 1311 | 148 |
| 1312 | 26 |
| 1313 | 1412 |
| 1314 | 646 |
| 1315 | 548 |
| 1316 | 174 |
| 1317 | 458 |
| 1318 | 124 |
| 1319 | 103 |
| 1320 | 28 |
| 1321 | 337 |
| 1322 | 84 |
| 1323 | 67 |
| 1324 | 30 |
| 1325 | 37 |
| 1326 | 32 |
| 1327 | 34 |
| 1328 | 36 |
| 1329 | 1818 |
| 1330 | 1650 |
| 1331 | 1490 |
| 1332 | 1371 |
| 1333 | 1569 |
| 1334 | 1373 |
| 1335 | 1375 |
| 1336 | 1377 |
| 1337 | 1994 |
| 1338 | 1379 |
| 1339 | 1381 |
| 1340 | 1383 |
| 1341 | 1385 |
| 1342 | 1387 |
| 1343 | 1389 |
| 1344 | 1391 |
| 1345 | 1393 |
| 1346 | 1905 |
| 1347 | 1395 |
| 1348 | 1397 |
| 1349 | 1399 |
| 1350 | 1733 |
| 1351 | 1401 |
| 1352 | 1403 |
| 1353 | 1405 |
| 1354 | 1407 |
| 1355 | 1409 |
| 1356 | 1411 |
| 1357 | 1413 |
| 1358 | 1414 |
| 1359 | 1416 |
| 1360 | 1418 |
| 1361 | 1420 |
| 1362 | 1422 |
| 1363 | 1424 |
| 1364 | 1426 |
| 1365 | 1428 |
| 1366 | 1430 |
| 1367 | 1432 |
| 1368 | 1434 |
| 1369 | 1436 |
| 1370 | 1438 |
| 1371 | 1440 |
| 1372 | 1442 |
| 1373 | 1444 |
| 1374 | 1820 |
| 1375 | 1652 |
| 1376 | 1492 |
| 1377 | 700 |
| 1378 | 1571 |
| 1379 | 1340 |
| 1380 | 1196 |
| 1381 | 627 |
| 1382 | 1996 |
| 1383 | 1127 |
| 1384 | 995 |
| 1385 | 629 |
| 1386 | 812 |
| 1387 | 631 |
| 1388 | 633 |
| 1389 | 635 |
| 1390 | 1267 |
| 1391 | 1907 |
| 1392 | 1060 |
| 1393 | 932 |
| 1394 | 637 |
| 1395 | 1735 |
| 1396 | 871 |
| 1397 | 755 |
| 1398 | 639 |
| 1399 | 641 |
| 1400 | 643 |
| 1401 | 645 |
| 1402 | 647 |
| 1403 | 1415 |
| 1404 | 648 |
| 1405 | 650 |
| 1406 | 652 |
| 1407 | 654 |
| 1408 | 656 |
| 1409 | 658 |
| 1410 | 660 |
| 1411 | 662 |
| 1412 | 664 |
| 1413 | 666 |
| 1414 | 668 |
| 1415 | 670 |
| 1416 | 672 |
| 1417 | 674 |
| 1418 | 676 |
| 1419 | 1822 |
| 1420 | 1654 |
| 1421 | 1494 |
| 1422 | 702 |
| 1423 | 1573 |
| 1424 | 1342 |
| 1425 | 1198 |

TABLE 3-continued

Sequence with the length of 2048

| Index | Sequence number |
|---|---|
| 1426 | 531 |
| 1427 | 1998 |
| 1428 | 1129 |
| 1429 | 997 |
| 1430 | 533 |
| 1431 | 814 |
| 1432 | 535 |
| 1433 | 537 |
| 1434 | 539 |
| 1435 | 1269 |
| 1436 | 1909 |
| 1437 | 1062 |
| 1438 | 934 |
| 1439 | 541 |
| 1440 | 1737 |
| 1441 | 873 |
| 1442 | 757 |
| 1443 | 543 |
| 1444 | 598 |
| 1445 | 545 |
| 1446 | 547 |
| 1447 | 549 |
| 1448 | 1417 |
| 1449 | 649 |
| 1450 | 550 |
| 1451 | 552 |
| 1452 | 554 |
| 1453 | 556 |
| 1454 | 558 |
| 1455 | 560 |
| 1456 | 562 |
| 1457 | 564 |
| 1458 | 566 |
| 1459 | 568 |
| 1460 | 570 |
| 1461 | 572 |
| 1462 | 574 |
| 1463 | 576 |
| 1464 | 1824 |
| 1465 | 1656 |
| 1466 | 1496 |
| 1467 | 704 |
| 1468 | 1575 |
| 1469 | 1344 |
| 1470 | 1200 |
| 1471 | 504 |
| 1472 | 2000 |
| 1473 | 1131 |
| 1474 | 999 |
| 1475 | 418 |
| 1476 | 816 |
| 1477 | 303 |
| 1478 | 235 |
| 1479 | 171 |
| 1480 | 1271 |
| 1481 | 1911 |
| 1482 | 1064 |
| 1483 | 936 |
| 1484 | 377 |
| 1485 | 1739 |
| 1486 | 875 |
| 1487 | 759 |
| 1488 | 268 |
| 1489 | 600 |
| 1490 | 204 |
| 1491 | 173 |
| 1492 | 175 |
| 1493 | 1419 |
| 1494 | 651 |
| 1495 | 551 |
| 1496 | 176 |
| 1497 | 460 |
| 1498 | 178 |
| 1499 | 180 |
| 1500 | 182 |
| 1501 | 339 |
| 1502 | 184 |
| 1503 | 186 |
| 1504 | 188 |
| 1505 | 190 |
| 1506 | 192 |
| 1507 | 194 |
| 1508 | 196 |
| 1509 | 1826 |
| 1510 | 1658 |
| 1511 | 1498 |
| 1512 | 706 |
| 1513 | 1577 |
| 1514 | 1346 |
| 1515 | 1202 |
| 1516 | 506 |
| 1517 | 2002 |
| 1518 | 1133 |
| 1519 | 1001 |
| 1520 | 443 |
| 1521 | 818 |
| 1522 | 445 |
| 1523 | 447 |
| 1524 | 449 |
| 1525 | 1273 |
| 1526 | 1913 |
| 1527 | 1066 |
| 1528 | 938 |
| 1529 | 451 |
| 1530 | 1741 |
| 1531 | 877 |
| 1532 | 761 |
| 1533 | 453 |
| 1534 | 602 |
| 1535 | 455 |
| 1536 | 457 |
| 1537 | 459 |
| 1538 | 1421 |
| 1539 | 653 |
| 1540 | 553 |
| 1541 | 461 |
| 1542 | 462 |
| 1543 | 464 |
| 1544 | 466 |
| 1545 | 468 |
| 1546 | 470 |
| 1547 | 472 |
| 1548 | 474 |
| 1549 | 476 |
| 1550 | 478 |
| 1551 | 480 |
| 1552 | 482 |
| 1553 | 484 |
| 1554 | 1828 |
| 1555 | 1660 |
| 1556 | 1500 |
| 1557 | 708 |
| 1558 | 1579 |
| 1559 | 1348 |
| 1560 | 1204 |
| 1561 | 508 |
| 1562 | 2004 |
| 1563 | 1135 |
| 1564 | 1003 |
| 1565 | 420 |
| 1566 | 820 |
| 1567 | 305 |
| 1568 | 237 |
| 1569 | 123 |
| 1570 | 1275 |
| 1571 | 1915 |
| 1572 | 1068 |
| 1573 | 940 |
| 1574 | 379 |
| 1575 | 1743 |

TABLE 3-continued

Sequence with the length of 2048

| Index | Sequence number |
|---|---|
| 1576 | 879 |
| 1577 | 763 |
| 1578 | 270 |
| 1579 | 604 |
| 1580 | 206 |
| 1581 | 150 |
| 1582 | 125 |
| 1583 | 1423 |
| 1584 | 655 |
| 1585 | 555 |
| 1586 | 177 |
| 1587 | 463 |
| 1588 | 126 |
| 1589 | 128 |
| 1590 | 130 |
| 1591 | 341 |
| 1592 | 132 |
| 1593 | 134 |
| 1594 | 136 |
| 1595 | 138 |
| 1596 | 140 |
| 1597 | 142 |
| 1598 | 144 |
| 1599 | 1830 |
| 1600 | 1662 |
| 1601 | 1502 |
| 1602 | 710 |
| 1603 | 1581 |
| 1604 | 1350 |
| 1605 | 1206 |
| 1606 | 510 |
| 1607 | 2006 |
| 1608 | 1137 |
| 1609 | 1005 |
| 1610 | 422 |
| 1611 | 822 |
| 1612 | 307 |
| 1613 | 239 |
| 1614 | 102 |
| 1615 | 1277 |
| 1616 | 1917 |
| 1617 | 1070 |
| 1618 | 942 |
| 1619 | 381 |
| 1620 | 1745 |
| 1621 | 881 |
| 1622 | 765 |
| 1623 | 272 |
| 1624 | 606 |
| 1625 | 208 |
| 1626 | 152 |
| 1627 | 104 |
| 1628 | 1425 |
| 1629 | 657 |
| 1630 | 557 |
| 1631 | 179 |
| 1632 | 465 |
| 1633 | 127 |
| 1634 | 105 |
| 1635 | 107 |
| 1636 | 343 |
| 1637 | 109 |
| 1638 | 111 |
| 1639 | 113 |
| 1640 | 115 |
| 1641 | 117 |
| 1642 | 119 |
| 1643 | 121 |
| 1644 | 1832 |
| 1645 | 1664 |
| 1646 | 1504 |
| 1647 | 712 |
| 1648 | 1583 |
| 1649 | 1352 |
| 1650 | 1208 |
| 1651 | 512 |
| 1652 | 2008 |
| 1653 | 1139 |
| 1654 | 1007 |
| 1655 | 424 |
| 1656 | 824 |
| 1657 | 309 |
| 1658 | 241 |
| 1659 | 53 |
| 1660 | 1279 |
| 1661 | 1919 |
| 1662 | 1072 |
| 1663 | 944 |
| 1664 | 383 |
| 1665 | 1747 |
| 1666 | 883 |
| 1667 | 767 |
| 1668 | 274 |
| 1669 | 608 |
| 1670 | 210 |
| 1671 | 154 |
| 1672 | 27 |
| 1673 | 1427 |
| 1674 | 659 |
| 1675 | 559 |
| 1676 | 181 |
| 1677 | 467 |
| 1678 | 129 |
| 1679 | 106 |
| 1680 | 17 |
| 1681 | 345 |
| 1682 | 86 |
| 1683 | 69 |
| 1684 | 19 |
| 1685 | 39 |
| 1686 | 21 |
| 1687 | 23 |
| 1688 | 25 |
| 1689 | 1834 |
| 1690 | 1666 |
| 1691 | 1506 |
| 1692 | 714 |
| 1693 | 1585 |
| 1694 | 1354 |
| 1695 | 1210 |
| 1696 | 514 |
| 1697 | 2010 |
| 1698 | 1141 |
| 1699 | 1009 |
| 1700 | 426 |
| 1701 | 826 |
| 1702 | 326 |
| 1703 | 328 |
| 1704 | 330 |
| 1705 | 1281 |
| 1706 | 1921 |
| 1707 | 1074 |
| 1708 | 946 |
| 1709 | 385 |
| 1710 | 1749 |
| 1711 | 885 |
| 1712 | 769 |
| 1713 | 332 |
| 1714 | 610 |
| 1715 | 334 |
| 1716 | 336 |
| 1717 | 338 |
| 1718 | 1429 |
| 1719 | 661 |
| 1720 | 561 |
| 1721 | 340 |
| 1722 | 469 |
| 1723 | 342 |
| 1724 | 344 |
| 1725 | 346 |

TABLE 3-continued

Sequence with the length of 2048

| Index | Sequence number |
|---|---|
| 1726 | 347 |
| 1727 | 349 |
| 1728 | 351 |
| 1729 | 353 |
| 1730 | 355 |
| 1731 | 357 |
| 1732 | 359 |
| 1733 | 361 |
| 1734 | 1836 |
| 1735 | 1668 |
| 1736 | 1508 |
| 1737 | 716 |
| 1738 | 1587 |
| 1739 | 1356 |
| 1740 | 1212 |
| 1741 | 516 |
| 1742 | 2012 |
| 1743 | 1143 |
| 1744 | 1011 |
| 1745 | 428 |
| 1746 | 828 |
| 1747 | 311 |
| 1748 | 243 |
| 1749 | 83 |
| 1750 | 1283 |
| 1751 | 1923 |
| 1752 | 1076 |
| 1753 | 948 |
| 1754 | 387 |
| 1755 | 1751 |
| 1756 | 887 |
| 1757 | 771 |
| 1758 | 276 |
| 1759 | 612 |
| 1760 | 212 |
| 1761 | 156 |
| 1762 | 85 |
| 1763 | 1431 |
| 1764 | 663 |
| 1765 | 563 |
| 1766 | 183 |
| 1767 | 471 |
| 1768 | 131 |
| 1769 | 108 |
| 1770 | 87 |
| 1771 | 348 |
| 1772 | 88 |
| 1773 | 90 |
| 1774 | 92 |
| 1775 | 94 |
| 1776 | 96 |
| 1777 | 98 |
| 1778 | 100 |
| 1779 | 1838 |
| 1780 | 1670 |
| 1781 | 1510 |
| 1782 | 718 |
| 1783 | 1589 |
| 1784 | 1358 |
| 1785 | 1214 |
| 1786 | 518 |
| 1787 | 2014 |
| 1788 | 1145 |
| 1789 | 1013 |
| 1790 | 430 |
| 1791 | 830 |
| 1792 | 313 |
| 1793 | 245 |
| 1794 | 66 |
| 1795 | 1285 |
| 1796 | 1925 |
| 1797 | 1078 |
| 1798 | 950 |
| 1799 | 389 |
| 1800 | 1753 |
| 1801 | 889 |
| 1802 | 773 |
| 1803 | 278 |
| 1804 | 614 |
| 1805 | 214 |
| 1806 | 158 |
| 1807 | 68 |
| 1808 | 1433 |
| 1809 | 665 |
| 1810 | 565 |
| 1811 | 185 |
| 1812 | 473 |
| 1813 | 133 |
| 1814 | 110 |
| 1815 | 70 |
| 1816 | 350 |
| 1817 | 89 |
| 1818 | 71 |
| 1819 | 73 |
| 1820 | 75 |
| 1821 | 77 |
| 1822 | 79 |
| 1823 | 81 |
| 1824 | 1840 |
| 1825 | 1672 |
| 1826 | 1512 |
| 1827 | 720 |
| 1828 | 1591 |
| 1829 | 1360 |
| 1830 | 1216 |
| 1831 | 520 |
| 1832 | 2016 |
| 1833 | 1147 |
| 1834 | 1015 |
| 1835 | 432 |
| 1836 | 832 |
| 1837 | 315 |
| 1838 | 247 |
| 1839 | 55 |
| 1840 | 1287 |
| 1841 | 1927 |
| 1842 | 1080 |
| 1843 | 952 |
| 1844 | 391 |
| 1845 | 1755 |
| 1846 | 891 |
| 1847 | 775 |
| 1848 | 280 |
| 1849 | 616 |
| 1850 | 216 |
| 1851 | 160 |
| 1852 | 29 |
| 1853 | 1435 |
| 1854 | 667 |
| 1855 | 567 |
| 1856 | 187 |
| 1857 | 475 |
| 1858 | 135 |
| 1859 | 112 |
| 1860 | 18 |
| 1861 | 352 |
| 1862 | 91 |
| 1863 | 72 |
| 1864 | 10 |
| 1865 | 41 |
| 1866 | 12 |
| 1867 | 14 |
| 1868 | 16 |
| 1869 | 1842 |
| 1870 | 1674 |
| 1871 | 1514 |
| 1872 | 722 |
| 1873 | 1593 |
| 1874 | 1362 |
| 1875 | 1218 |

TABLE 3-continued

Sequence with the length of 2048

| Index | Sequence number |
|---|---|
| 1876 | 522 |
| 1877 | 2018 |
| 1878 | 1149 |
| 1879 | 1017 |
| 1880 | 434 |
| 1881 | 834 |
| 1882 | 317 |
| 1883 | 249 |
| 1884 | 57 |
| 1885 | 1289 |
| 1886 | 1929 |
| 1887 | 1082 |
| 1888 | 954 |
| 1889 | 393 |
| 1890 | 1757 |
| 1891 | 893 |
| 1892 | 777 |
| 1893 | 282 |
| 1894 | 618 |
| 1895 | 218 |
| 1896 | 162 |
| 1897 | 38 |
| 1898 | 1437 |
| 1899 | 669 |
| 1900 | 569 |
| 1901 | 189 |
| 1902 | 477 |
| 1903 | 137 |
| 1904 | 114 |
| 1905 | 40 |
| 1906 | 354 |
| 1907 | 93 |
| 1908 | 74 |
| 1909 | 42 |
| 1910 | 43 |
| 1911 | 45 |
| 1912 | 47 |
| 1913 | 49 |
| 1914 | 1844 |
| 1915 | 1676 |
| 1916 | 1516 |
| 1917 | 724 |
| 1918 | 1595 |
| 1919 | 1364 |
| 1920 | 1220 |
| 1921 | 524 |
| 1922 | 2020 |
| 1923 | 1151 |
| 1924 | 1019 |
| 1925 | 436 |
| 1926 | 836 |
| 1927 | 319 |
| 1928 | 251 |
| 1929 | 59 |
| 1930 | 1291 |
| 1931 | 1931 |
| 1932 | 1084 |
| 1933 | 956 |
| 1934 | 395 |
| 1935 | 1759 |
| 1936 | 895 |
| 1937 | 779 |
| 1938 | 284 |
| 1939 | 620 |
| 1940 | 220 |
| 1941 | 164 |
| 1942 | 31 |
| 1943 | 1439 |
| 1944 | 671 |
| 1945 | 571 |
| 1946 | 191 |
| 1947 | 479 |
| 1948 | 139 |
| 1949 | 116 |
| 1950 | 20 |
| 1951 | 356 |
| 1952 | 95 |
| 1953 | 76 |
| 1954 | 11 |
| 1955 | 44 |
| 1956 | 5 |
| 1957 | 7 |
| 1958 | 9 |
| 1959 | 1846 |
| 1960 | 1678 |
| 1961 | 1518 |
| 1962 | 726 |
| 1963 | 1597 |
| 1964 | 1366 |
| 1965 | 1222 |
| 1966 | 526 |
| 1967 | 2022 |
| 1968 | 1153 |
| 1969 | 1021 |
| 1970 | 438 |
| 1971 | 838 |
| 1972 | 321 |
| 1973 | 253 |
| 1974 | 61 |
| 1975 | 1293 |
| 1976 | 1933 |
| 1977 | 1086 |
| 1978 | 958 |
| 1979 | 397 |
| 1980 | 1761 |
| 1981 | 897 |
| 1982 | 781 |
| 1983 | 286 |
| 1984 | 622 |
| 1985 | 222 |
| 1986 | 166 |
| 1987 | 33 |
| 1988 | 1441 |
| 1989 | 673 |
| 1990 | 573 |
| 1991 | 193 |
| 1992 | 481 |
| 1993 | 141 |
| 1994 | 118 |
| 1995 | 22 |
| 1996 | 358 |
| 1997 | 97 |
| 1998 | 78 |
| 1999 | 13 |
| 2000 | 46 |
| 2001 | 6 |
| 2002 | 2 |
| 2003 | 4 |
| 2004 | 1848 |
| 2005 | 1680 |
| 2006 | 1520 |
| 2007 | 728 |
| 2008 | 1599 |
| 2009 | 1368 |
| 2010 | 1224 |
| 2011 | 528 |
| 2012 | 2024 |
| 2013 | 1155 |
| 2014 | 1023 |
| 2015 | 440 |
| 2016 | 840 |
| 2017 | 323 |
| 2018 | 255 |
| 2019 | 63 |
| 2020 | 1295 |
| 2021 | 1935 |
| 2022 | 1088 |
| 2023 | 960 |
| 2024 | 399 |
| 2025 | 1763 |

TABLE 3-continued

Sequence with the length of 2048

| Index | Sequence number |
|---|---|
| 2026 | 899 |
| 2027 | 783 |
| 2028 | 288 |
| 2029 | 624 |
| 2030 | 224 |
| 2031 | 168 |
| 2032 | 35 |
| 2033 | 1443 |
| 2034 | 675 |
| 2035 | 575 |
| 2036 | 195 |
| 2037 | 483 |
| 2038 | 143 |
| 2039 | 120 |
| 2040 | 24 |
| 2041 | 360 |
| 2042 | 99 |
| 2043 | 80 |
| 2044 | 15 |
| 2045 | 48 |
| 2046 | 8 |
| 2047 | 3 |
| 2048 | 1 |

In the embodiments, the device may be divided into functional modules based on the foregoing method examples. For example, each functional module may be obtained through division based on each corresponding function, or two or more functions may be integrated into one module. The integrated module may be implemented in a form of hardware, or may be implemented in a form of a software functional module. It should be noted that, in the embodiments, division into the modules is an example and merely logical function division, and may be other division in an actual implementation.

Figure 6:
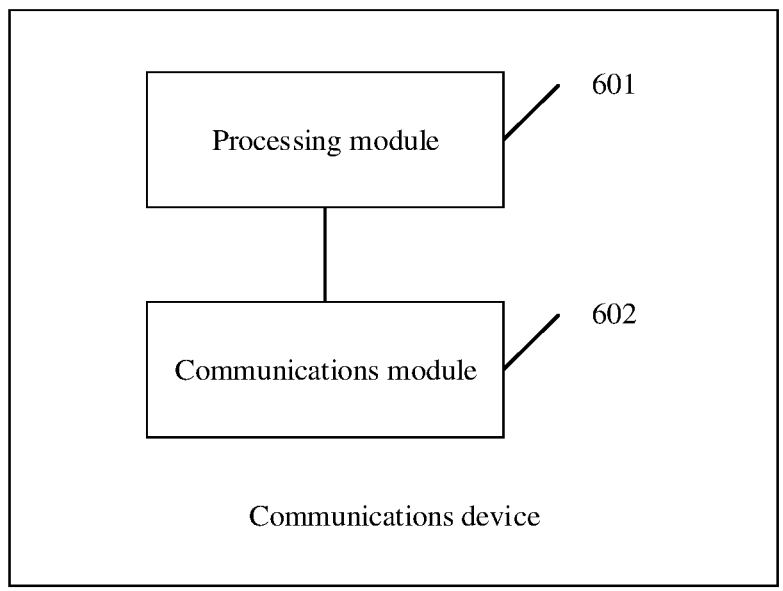
FIG. 6 is a schematic structural diagram of a communications device according to an embodiment.

FIG. 6 is a schematic structural diagram of a communications device according to an embodiment. The communications device shown in FIG. 6 may be configured to perform some or all functions of the communications device in the method embodiment described in FIG. 3. The communications device shown in FIG. 6 may include a processing module 601 and a communications module 602.

The communications module 602 is configured to obtain a to-be-encoded information bit sequence. The processing module 601 is configured to encode the to-be-encoded information bit sequence based on a binary vector $P_1$ of a first code, to obtain an encoded bit sequence, where $P_1$ is determined based on a binary vector $P_2$ of a second code and a binary vector $P_3$ of a third code, $P_1$ indicates an information bit and a frozen bit of the first code, $P_2$ indicates an information bit and a frozen bit of the second code, $P_3$ indicates an information bit and a frozen bit of the third code, a code length of the first code is $n_3$, a quantity of information bits of the first code is $k_1$, a code length of the second code is $n_2$, a quantity of information bits of the second code is $k_2$, a code length of the third code is $n_3$, a quantity of information bits of the third code is $k_3$, $n_1 = n_2 * n_3$, and $k_1 = k_2 * k_3$. The processing module 601 is further configured to output the encoded bit sequence.

Optionally, $P_1 = P_2 \otimes P_3$.

Optionally, $n_2 = n_3$ and $k_2 = k_3$.

Optionally, $P_2$ is equal to $P_3$.

Optionally, $k_1 = k_4$, and $k_4$ is a length of the to-be-encoded information bit sequence.

Optionally, $k_4 < k_1$, $k_1 = \lceil \sqrt{k_4} \rceil^2$, and $k_4$ is a length of the to-be-encoded information bit sequence.

Optionally, that the processing module 601 encodes the to-be-encoded information bit sequence based on a binary vector $P_1$ of a first code is implemented in the following manner: determining, based on $P_1$, a binary vector $P_4$ corresponding to a fourth code, where $P_4$ indicates an information bit and a frozen bit of the fourth code, a code length of the fourth code is $n_4$, a quantity of information bits of the fourth code is $k_4$, and $n_4 = n_1$; and encoding the to-be-encoded information bit sequence based on $P_4$.

Optionally, a set $S_2$ is a subset of a set $S_1$, the set $S_1$ is an information bit set including the information bit indicated by $P_1$, and $S_2$ is an information bit set including the information bit indicated by $P_4$.

Optionally, that the processing module 601 determines, based on $P_1$, a binary vector $P_4$ corresponding to a fourth code is implemented in the following manner: determining a set $S_3$ from the set $S_1$, where when an information bit included in the set $S_3$ is changed to a frozen bit, at least one information bit of a first inner code can be changed to a frozen bit in a first encoding process; determining a first information bit from the set $S_3$; changing the first information bit in $P_1$ to a frozen bit, to obtain a binary vector $P_5$; and obtaining the binary vector $P_4$ corresponding to the fourth code based on the binary vector $P_5$.

Optionally, the set $S_3$ includes a plurality of information bits; and compared with another information bit in the set $S_3$, when the first information bit in the set $S_3$ is changed to a frozen bit, an information bit that is of the first inner code and that is changed to a frozen bit has a lowest reliability rank.

Optionally, that the processing module 601 obtains the binary vector $P_4$ corresponding to the fourth based on the binary vector $P_5$ is implemented in the following manner: determining a set $S_4$ from an information bit indicated by $P_5$, where when an information bit included in the set $S_4$ is changed to a frozen bit, at least one information bit of a second inner code can be changed to a frozen bit in a second encoding process, the first inner code is an outer code for the second encoding process, and the second inner code is an outer code for the first encoding process; determining a second information bit from the set $S_4$; changing the second information bit in $P_5$ to a frozen bit, to obtain a binary vector $P_6$; and obtaining the binary vector $P_4$ corresponding to the fourth code based on the binary vector $P_6$.

Optionally, the set $S_4$ includes a plurality of information bits; and compared with another information bit in the set $S_4$, when the second information bit in the set $S_4$ is changed to a frozen bit, an information bit that is of the second inner code and that is changed to a frozen bit has a lowest reliability rank.

Optionally, $n_1$, $n_2$, and $n_3$ each are an integral power of 2.

FIG. 6 is a schematic structural diagram of a communications device according to an embodiment. The communications device shown in FIG. 6 may be configured to perform some or all functions of the communications device in the method embodiments. The communications device shown in FIG. 6 may include a processing module 601 and a communications module 602.

The communications module 602 is configured to obtain a to-be-encoded information bit sequence. The processing module 601 is configured to encode the to-be-encoded information bit sequence based on a binary vector $P_1$ of a first code, to obtain an encoded bit sequence, where $P_1$ indicates an information bit and a frozen bit of the first code, $P_1$ is determined based on a target sequence and a quantity $k_1$ of information bits of the first code, the quantity $k_1$ of information bits of the first code is equal to a length of the to-be-encoded information bit sequence, a code length of the first code is m, the target sequence is a sequence that is extracted from a stored sequence with a length of M and that includes a sequence number less than or equal to $n_1$, the sequence with the length of M includes a sequence number corresponding to each of M bits, and M is greater than or equal to $n_1$. The processing module 601 is further configured to output the encoded bit sequence.

Optionally, the processing module 601 is further configured to determine a set $S_1$ from an information bit indicated by a binary vector $P_2$ of a second code, where when an information bit included in the set $S_1$ is changed to a frozen bit, at least one information bit of a first inner code can be changed to a frozen bit in a first encoding process. The processing module 601 is further configured to determine a first information bit from the set $S_1$. The processing module 601 is further configured to change the first information bit in $P_2$ to a frozen bit, to obtain a binary vector $P_3$ of a third code, where a code length of the second code is M, a quantity of information bits of the second code is K, a code length of the third code is M, and a quantity of information bits of the third code is K−1. The processing module 601 is further configured to: determine that a sequence number corresponding to the first information bits is K, and traverse K from M to 1, to determine a sequence number corresponding to each bit in the sequence with the length of M.

Optionally, the set $S_1$ includes a plurality of information bits; and compared with another information bit in the set $S_1$, when the first information bit in the set $S_1$ is changed to a frozen bit, an information bit that is of the first inner code and that is changed to a frozen bit has a lowest reliability rank.

Figure 7:
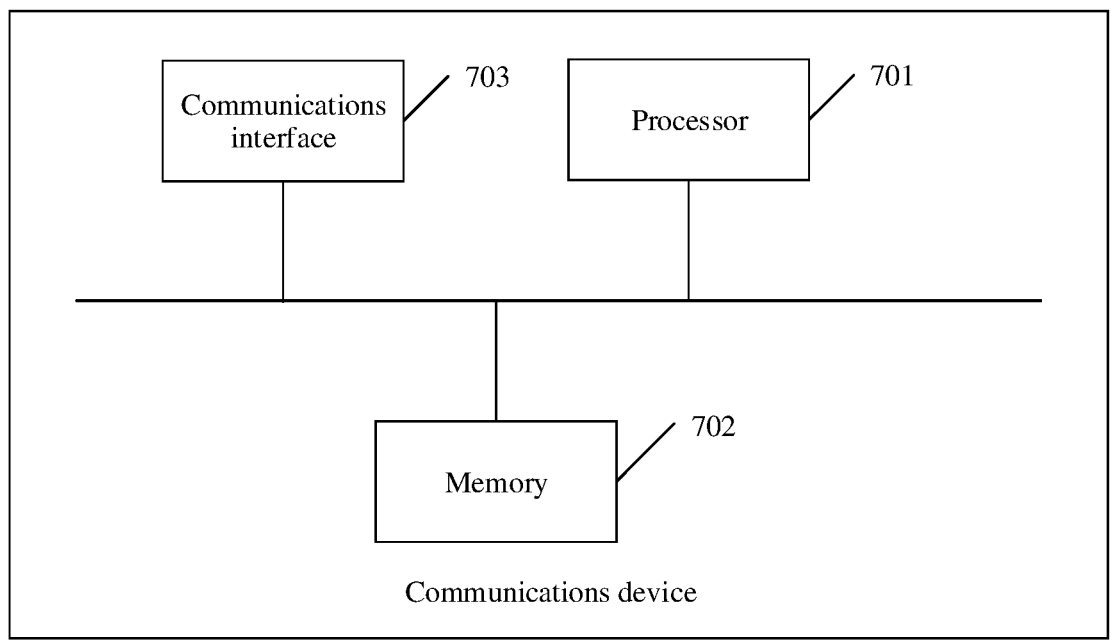
FIG. 7 is a schematic structural diagram of a communications device according to an embodiment.

FIG. 7 is a schematic structural diagram of a communications device disclosed in an embodiment. As shown in FIG. 7, the communications device includes a processor 701, a memory 702, and a communications interface 703. The processor 701, the memory 702, and the communications interface 703 are connected.

The processor 701 may be a central processing unit (CPU), a general-purpose processor, a coprocessor, a digital signal processor (DSP), an application-specific integrated circuit (ASIC), a field programmable gate array (FPGA) or another programmable logic device, a transistor logic device, a hardware component, or any combination thereof. Alternatively, the processor 701 may be a combination of processors implementing a computing function, for example, a combination of one or more microprocessors, or a combination of a DSP and a microprocessor.

The communications interface 703 is configured to implement communication between the communications device and another communications device or communication between other communications component in the same communications device.

The processor 701 invokes program code stored in the memory 702, to perform the steps performed by the communications device in the foregoing method embodiments. The memory 702 is further configured to store data cached in a process of performing the foregoing methods. Optionally, the memory 702 is further configured to store the sequence in Table 1 or a similar sequence. The memory 702 and the processor 701 are coupled to each other. Optionally, the memory 702 and the processor 701 may be integrated.

An embodiment further provides a computer-readable storage medium. The computer-readable storage medium stores instructions. When the instructions are run on a processor, the method procedures in the foregoing method embodiments are implemented.

An embodiment further provides a computer program product. When the computer program product runs on a processor, the method procedures in the foregoing method embodiments are implemented.

An embodiment further provides a chip system. The chip system includes a processor, configured to support a communications device in implementing functions in the foregoing embodiments, for example, generating or processing data and/or information used in the foregoing methods. In a possible implementation, the chip system may further include a memory. The memory is configured to store necessary program instructions and data. The chip system may include a chip, or may include a chip and another discrete component.

Based on a same inventive concept, a problem-resolving principle of the communications device provided in the embodiments is similar to a problem-resolving principle of the access network device or the first node in the method embodiments. Therefore, for implementations of each device, refer to the implementations of the method. For brevity, details are not described herein again.

In the foregoing embodiments, the descriptions of each embodiment have respective focuses. For a part that is not described in detail in an embodiment, refer to related descriptions in other embodiments.

Finally, it should be noted that the foregoing embodiments are merely intended for describing the solutions and are intended to be non-limiting. Although foregoing embodiments are described in detail, persons of ordinary skill in the art should understand that they may still make modifications to the solutions described in the foregoing embodiments or make equivalent replacements to some or all features thereof, without departing from the scope of the solutions of the embodiments.

What is claimed is:

1. An encoding method, wherein the method comprises:
obtaining a to-be-encoded information bit sequence;
encoding the to-be-encoded information bit sequence based on a binary vector $P_1$ of a first code, to obtain an encoded bit sequence, wherein $P_1$ is determined based on a binary vector $P_2$ of a second code and a binary vector $P_3$ of a third code, $P_1$ indicates an information bit and a frozen bit of the first code, $P_2$ indicates an information bit and a frozen bit of the second code, $P_3$ indicates an information bit and a frozen bit of the third code, a code length of the first code is $n_1$, a quantity of information bits of the first code is $k_1$, a code length of the second code is $n_2$, a quantity of information bits of the second code is $k_2$, a code length of the third code is $n_3$, a quantity of information bits of the third code is $k_3$, $n_1=n_2*n_3$, $k_1=k_2*k_3$, and $P_1=P_2 \otimes P_3$; and
outputting the encoded bit sequence.

2. The method according to claim 1, wherein $n_2=n_3$ and $k_2=k_3$.

3. The method according to claim 2, wherein $P_2$ is equal to $P_3$.

4. The method according to claim 1, wherein $k_1=k_4$, and $k_4$ is a length of the to-be-encoded information bit sequence.

5. The method according to claim 1, wherein $k_4<k_1$, $k_1=\lceil \sqrt{k_4} \rceil^2$, and $k_4$ is a length of the to-be-encoded information bit sequence.

6. The method according to claim 5, wherein the encoding the to-be-encoded information bit sequence based on a binary vector $P_1$ of a first code comprises:

determining, based on $P_1$, a binary vector $P_4$ corresponding to a fourth code, wherein $P_4$ indicates an information bit and a frozen bit of the fourth code, a code length of the fourth code is $n_4$, a quantity of information bits of the fourth code is $k_4$, and $n_4=n_1$; and encoding the to-be-encoded information bit sequence based on $P_4$.

7. The method according to claim 6, wherein a set $S_2$ is a subset of a set $S_1$, the set $S_1$ is an information bit set comprising the information bit indicated by $P_1$, and $S_2$ is an information bit set comprising the information bit indicated by $P_4$.

8. The method according to claim 7, wherein the determining, based on $P_1$, a binary vector $P_4$ corresponding to a fourth code comprises:

determining a set $S_3$ from the set $S_1$, wherein when an information bit comprised in the set $S_3$ is changed to a frozen bit, at least one information bit of a first inner code can be changed to a frozen bit in a first encoding process;

determining a first information bit from the set $S_3$;

changing the first information bit in $P_1$ to a frozen bit, to obtain a binary vector $P_5$; and obtaining the binary vector $P_4$ corresponding to the fourth code based on the binary vector $P_5$.

9. The method according to claim 8, wherein the set $S_3$ comprises a plurality of information bits; and compared with another information bit in the set $S_3$, when the first information bit in the set $S_3$ is changed to a frozen bit, an information bit that is of the first inner code and that is changed to a frozen bit has a lowest reliability rank.

10. The method according to claim 8, wherein the obtaining the corresponding to the fourth code based on the binary vector $P_5$ comprises:

determining a set $S_4$ from an information bit indicated by $P_5$, wherein when an information bit comprised in the set $S_4$ is changed to a frozen bit, at least one information bit of a second inner code can be changed to a frozen bit in a second encoding process, the first inner code is an outer code for the second encoding process, and the second inner code is an outer code for the first encoding process;

determining a second information bit from the set $S_4$;

changing the second information bit in $P_5$ to a frozen bit, to obtain a binary vector $P_6$; and obtaining the binary vector $P_4$ corresponding to the fourth code based on the binary vector $P_6$.

11. The method according to claim 10, wherein the set $S_4$ comprises a plurality of information bits; and compared with another information bit in the set $S_4$, when the second information bit in the set $S_4$ is changed to a frozen bit, an information bit that is of the second inner code and that is changed to a frozen bit has a lowest reliability rank.

12. The method according to claim 1, wherein $n_1$, $n_2$, and $n_3$ each are an integral power of 2.

13. The method according to claim 1, wherein the encoding the to-be-encoded information bit sequence based on a binary vector $P_1$ of a first code, to obtain an encoded bit sequence comprises:

determining a binary vector $P_7$ of a seventh code based on the binary vector $P_1$ of the first code, wherein the binary vector $P_7$ indicates an information bit, a frozen bit, and a non-transmitted bit of the seventh code, a code length of the seventh code is $n_7$, a quantity of information bits of the seventh code is $k_7$, a quantity of non-transmitted bits of the seventh code is $n_1-n_7$, $k_7$ is equal to the length of the to-be-encoded information bit sequence, $n_7$ is an integer greater than $k_7$, $$n_1 = 4^{\left\lceil \frac{\log_2(n_7)}{2} \right\rceil},$$

and $k_1$ is greater than or equal to $k_7$;

encoding the to-be-encoded information bit sequence based on the binary vector $P_7$ of the seventh code, to obtain an encoded first bit sequence with a length of $n_1$; and removing the non-transmitted bit from the first bit sequence, to obtain a second bit sequence with a length of $n_7$; and the outputting the encoded bit sequence comprises:

outputting the second bit sequence.

14. The method according to claim 13, wherein $k_7=k_1+n_1-n_7$, and the determining a binary vector $P_7$ of a seventh code based on the binary vector $P_1$ of the first code comprises:

sequentially changing, according to a first preset rule, elements indicating information bits in $P_1$ to elements indicating non-transmitted bits, until a quantity of the elements indicating the non-transmitted bits in $P_1$ is equal to $n_1-n_7$, to obtain the binary vector $P_7$, wherein a value of the non-transmitted bit is independent of a value of the information bit of the seventh code.

15. An encoding method, wherein the method comprises:

obtaining a to-be-encoded information bit sequence;

encoding the to-be-encoded information bit sequence based on a binary vector $P_1$ of a first code, to obtain an encoded bit sequence, wherein $P_1$ indicates an information bit and a frozen bit of the first code, $P_1$ is determined based on a target sequence and a quantity $k_1$ of information bits of the first code, the quantity $k_1$ of information bits of the first code is equal to a length of the to-be-encoded information bit sequence, a code length of the first code is $n_1$, the target sequence is a sequence that is extracted from a stored sequence with a length of M and that comprises a sequence number less than or equal to $n_1$, the sequence with the length of M comprises a sequence number corresponding to each of the M bits in the stored sequence, and M is greater than or equal to $n_1$; and outputting the encoded bit sequence.

16. The method according to claim 15, wherein the method further comprises:

determining a set $S_1$ from an information bit indicated by a binary vector $P_2$ of a second code, wherein when an information bit comprised in the set $S_1$ is changed to a frozen bit, at least one information bit of a first inner code can be changed to a frozen bit in a first encoding process; and determining a first information bit from the set $S_1$;

changing the first information bit in $P_2$ to a frozen bit, to obtain a binary vector $P_3$ of a third code, wherein a code length of the second code is M, a quantity of information bits of the second code is K, a code length of the third code is M, and a quantity of information bits of the third code is K−1;

determining that a sequence number corresponding to the first information bit is K; and traversing K from M to 1, to determine a sequence number corresponding to each bit in the sequence with the length of M.

17. The method according to claim 16, wherein the set $S_1$ comprises a plurality of information bits; and compared with another information bit in the set $S_1$, when the first information bit in the set $S_1$ is changed to a frozen bit, an information bit that is of the first inner code and that is changed to a frozen bit has a lowest reliability rank.

18. A communications device, wherein the communications device comprises:
- at least one non-transitory memory, wherein the at least one non-transitory memory comprises computer-readable instructions; and
- at least one processor, wherein when executing the computer-readable instructions, the at least one processor is enabled to:
  - obtain a to-be-encoded information bit sequence; and
  - encode the to-be-encoded information bit sequence based on a binary vector $P_1$ of a first code, to obtain an encoded bit sequence, wherein $P_1$ is determined based on a binary vector $P_2$ of a second code and a binary vector $P_3$ of a third code, $P_1$ indicates an information bit and a frozen bit of the first code, $P_2$ indicates an information bit and a frozen bit of the second code, $P_3$ indicates an information bit and a frozen bit of the third code, a code length of the first code is $n_1$, a quantity of information bits of the first code is $k_1$, a code length of the second code is $n_2$, a quantity of information bits of the second code is $k_2$, a code length of the third code is $n_3$, a quantity of information bits of the third code is $k_3$, $n_1=n_2*n_3$, $k_1=k_2*k_3$, and $P_1=P_2 \otimes P_3$; and
  - to output the encoded bit sequence.

* * * * *